US008786793B2

(12) United States Patent
Yamazaki

(10) Patent No.: US 8,786,793 B2
(45) Date of Patent: Jul. 22, 2014

(54) DISPLAY DEVICE AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 240 days.

(21) Appl. No.: 12/219,016

(22) Filed: Jul. 15, 2008

(65) Prior Publication Data

US 2009/0026453 A1    Jan. 29, 2009

(30) Foreign Application Priority Data

Jul. 27, 2007  (JP) ................................. 2007-196407

(51) Int. Cl.
| G02F 1/136 | (2006.01) |
| H01L 29/04 | (2006.01) |
| H01L 21/00 | (2006.01) |
| G02F 1/1368 | (2006.01) |
| G02F 1/1362 | (2006.01) |
| H01L 27/12 | (2006.01) |
| H01L 27/32 | (2006.01) |
| H01L 29/49 | (2006.01) |
| H01L 29/66 | (2006.01) |
| H01L 33/12 | (2010.01) |
| H01L 33/00 | (2010.01) |
| H01L 51/56 | (2006.01) |

(52) U.S. Cl.
CPC ........ *G02F 1/1368* (2013.01); *G02F 1/136227* (2013.01); *G02F 1/136286* (2013.01); *H01L 27/12* (2013.01); *H01L 27/1214* (2013.01); *H01L 27/3244* (2013.01); *H01L 29/4908* (2013.01); *H01L 29/66765* (2013.01); *H01L 33/12* (2013.01); *H01L 33/0079* (2013.01); *H01L 51/56* (2013.01)

USPC ................................. 349/43; 257/59; 438/29

(58) Field of Classification Search
CPC .............. G02F 1/136; G02F 1/136227; G02F 1/136286; H01L 27/12; H01L 27/1214; H01L 27/3244; H01L 29/4908; H01L 29/66765; H01L 33/12; H01L 33/0079; H01L 51/56
USPC ............... 349/43; 257/59, E21.001, E33.001; 438/29

See application file for complete search history.

(56) References Cited

U.S. PATENT DOCUMENTS

| 4,409,134 A | 10/1983 | Yamazaki |
| 5,311,040 A | 5/1994 | Hiramatsu et al. |

(Continued)

FOREIGN PATENT DOCUMENTS

| CN | 1790741 | 6/2006 |
| EP | 0449539 A | 10/1991 |

(Continued)

OTHER PUBLICATIONS

Arai et al., "Micro Silicon Technology for Active Matrix OLED Display," SID 07 Digest, 2007, pp. 1370-1373.

(Continued)

*Primary Examiner* — Jerry Blevins
(74) *Attorney, Agent, or Firm* — Eric J. Robinson; Robinson Intellectual Property Law Office, P.C.

(57) ABSTRACT

A gate insulating film is formed over a gate electrode; a microcrystalline semiconductor is formed over the gate insulating film; an impurity element for controlling the threshold value is added into the microcrystalline semiconductor film by an ion implantation method; the microcrystalline semiconductor film is irradiated with a laser beam so that the crystallinity of the microcrystalline semiconductor film is improved; and then, a buffer layer is formed over the microcrystalline semiconductor film, whereby a channel-etched thin film transistor is formed. Further, a display device including the thin film transistor is manufactured.

16 Claims, 37 Drawing Sheets

(56) References Cited

U.S. PATENT DOCUMENTS

| | | | |
|---|---|---|---|
| 5,591,987 A | 1/1997 | Yamazaki et al. | |
| 5,701,167 A | 12/1997 | Yamazaki | |
| 5,766,989 A | 6/1998 | Maegawa et al. | |
| 6,160,268 A | 12/2000 | Yamazaki | |
| 6,197,624 B1 | 3/2001 | Yamazaki | |
| 6,197,625 B1 | 3/2001 | Choi | |
| 6,444,506 B1 | 9/2002 | Kusumoto et al. | |
| 6,462,723 B1 | 10/2002 | Yamazaki et al. | |
| 6,570,552 B2 | 5/2003 | Yamazaki | |
| 6,624,441 B2 * | 9/2003 | Cantwell et al. | 257/43 |
| 7,394,098 B2 * | 7/2008 | Hirano et al. | 257/59 |
| 2002/0094613 A1 * | 7/2002 | Yamazaki et al. | 438/151 |
| 2003/0082893 A1 * | 5/2003 | Matsumoto et al. | 438/522 |
| 2003/0186489 A1 * | 10/2003 | Ishikawa | 438/155 |
| 2004/0137146 A1 | 7/2004 | Tsujimura et al. | |
| 2005/0012097 A1 | 1/2005 | Yamazaki | |
| 2005/0026400 A1 * | 2/2005 | Todd et al. | 438/486 |
| 2005/0196710 A1 | 9/2005 | Shiroguchi | |
| 2006/0091394 A1 * | 5/2006 | Honda | 257/66 |
| 2006/0102933 A1 * | 5/2006 | Yamamoto | 257/200 |
| 2006/0138570 A1 * | 6/2006 | Kim | 257/411 |
| 2007/0012921 A1 * | 1/2007 | Yamazaki | 257/59 |
| 2008/0284709 A1 | 11/2008 | Yamazaki | |

FOREIGN PATENT DOCUMENTS

| | | |
|---|---|---|
| EP | 0473988 A | 3/1992 |
| JP | 02-275672 A | 11/1990 |
| JP | 03-278466 A | 12/1991 |
| JP | 04-242724 | 8/1992 |
| JP | 04-242724 A | 8/1992 |
| JP | 06-275524 | 9/1994 |
| JP | 06-291316 | 10/1994 |
| JP | 06-342909 A | 12/1994 |
| JP | 08-195492 | 7/1996 |
| JP | 08-340117 A | 12/1996 |
| JP | 09-186342 | 7/1997 |
| JP | 11-074535 A | 3/1999 |
| JP | 11-121761 | 4/1999 |
| JP | 2001-007024 | 1/2001 |
| JP | 2001-051292 | 2/2001 |
| JP | 2005-049832 | 2/2005 |
| JP | 2005-049832 A | 2/2005 |
| JP | 2005-286320 A | 10/2005 |

OTHER PUBLICATIONS

Lee et al., "Leakage Current Mechanisms in Top-Gate Nanocrystalline Silicon Thin Film Transistors," Applied Physics Letters, 2008, vol. 92, 083509-1~083509-3.

Esmaeili-Rad et al., "Absence of Defect State Creation in Nanocrystalline Silicon Thin Film Transistors Deduced from Constant Current Stress Measurements,", Applied Physics Letters, 2007, vol. 91, 113511-1~113511-3.

Lee et al., "Stability of nc-Si:H TFTs With Silicon Nitride Gate Dielectric," IEEE Transactions on Electron Devices, vol. 54, No. 1, Jan. 2007, pp. 45-51.

Sazonov et al., "Low-Temperature Materials and Thin Film Transistors for Flexible Electronics," Proceedings of the IEEE, Aug. 2005, vol. 93, No. 8 pp. 1420-1428.

Esmaeili-Rad et al., "Stability of Nanocrystalline Silicon Bottom-Gate Thin Film Transistors with Silicon Nitride Gate Dielectric," Journal of Applied Physics 102, 064512 (2007), 064512-1~064512-7.

Lee et al., "Top-Gate TFTS Using 13.56 MHz PECVD Microcrystalline Silicon," IEEE Electron Device Letters, vol. 26, No. 9, Sep. 2005, pp. 637-639.

Lee et al., "Postdeposition Thermal Annealing and Material Stability of 75° C. Hydrogenated Nanocrystalline Silicon Plasma-Enhanced Chemical Vapor Deposition Films," Journal of Applied Physics 98, 034305 (2005), 034305-1~034305-7.

Lee et al., "Directly Deposited Nanocrystalline Silicon Thin-Film Transistors with Ultra High Mobilities," Applied Physics Letters, vol. 89, 2006, p. 252101-1-252101-3.

Lee et al., "How to Achieve High Mobility Thin film Transistors by Direct Deposition of Silicon Using 13.56 MHz RF PECVD?" IEDM Technical Digest International Electron Devices Meeting, 2006, pp. 295-298.

Chinese Office Action (Application No. 200810144368.X) Dated Apr. 6, 2011.

* cited by examiner light transmittance light transmittance

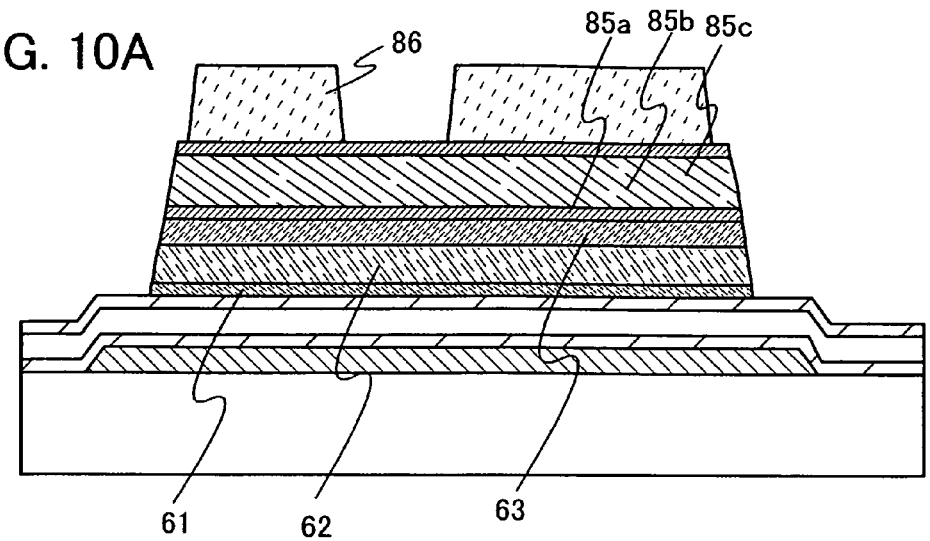
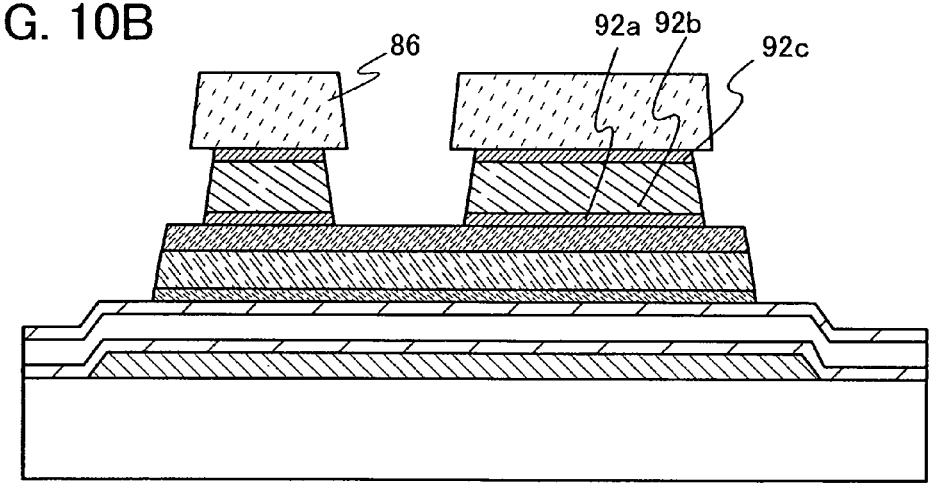
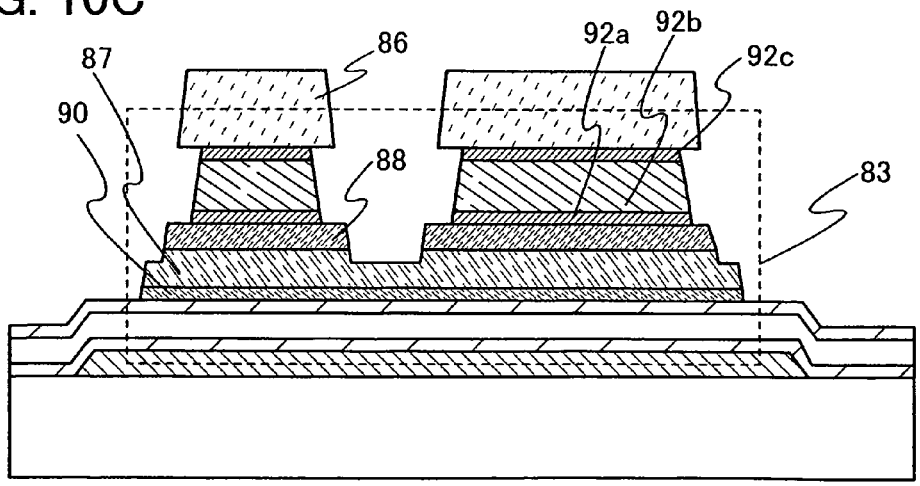

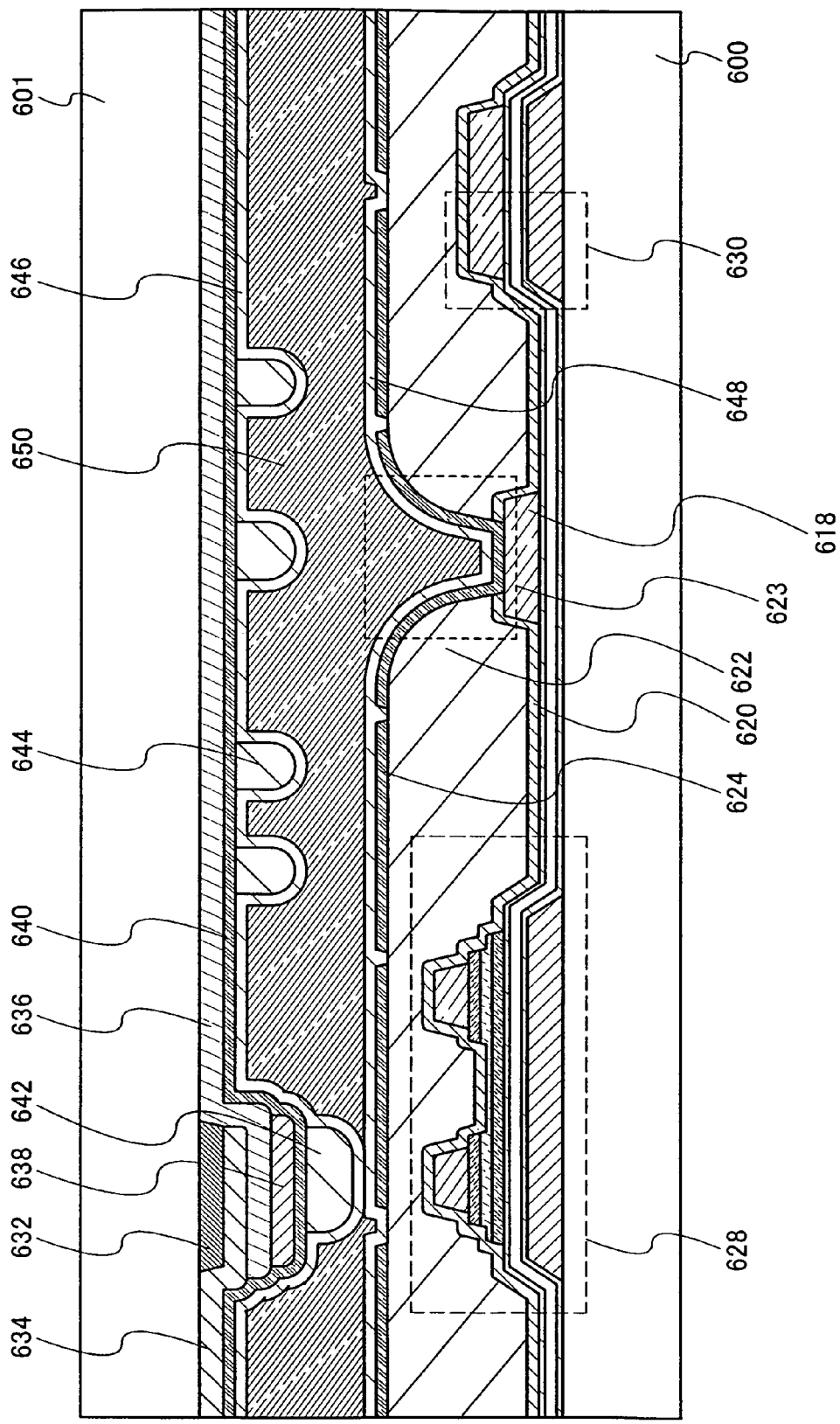

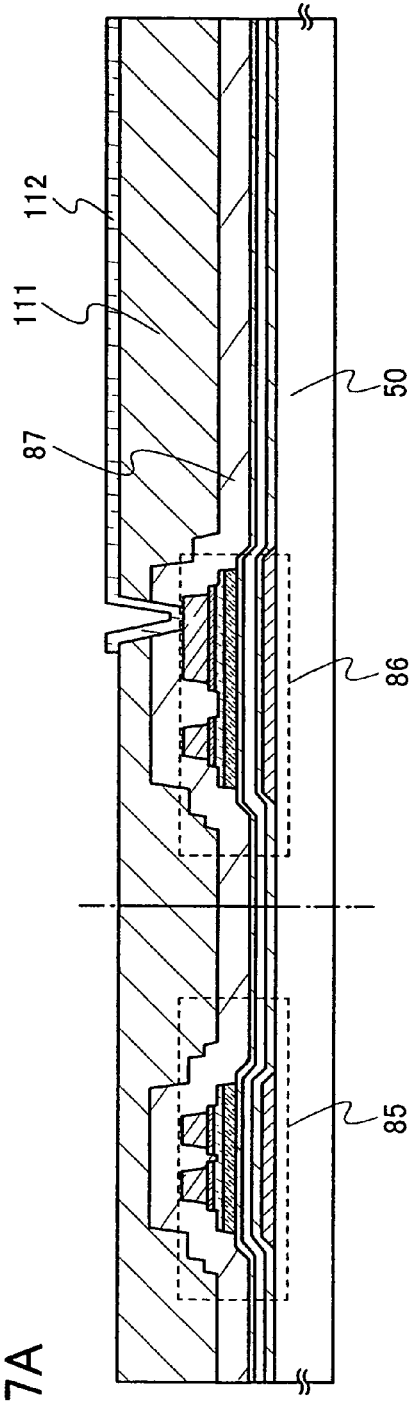
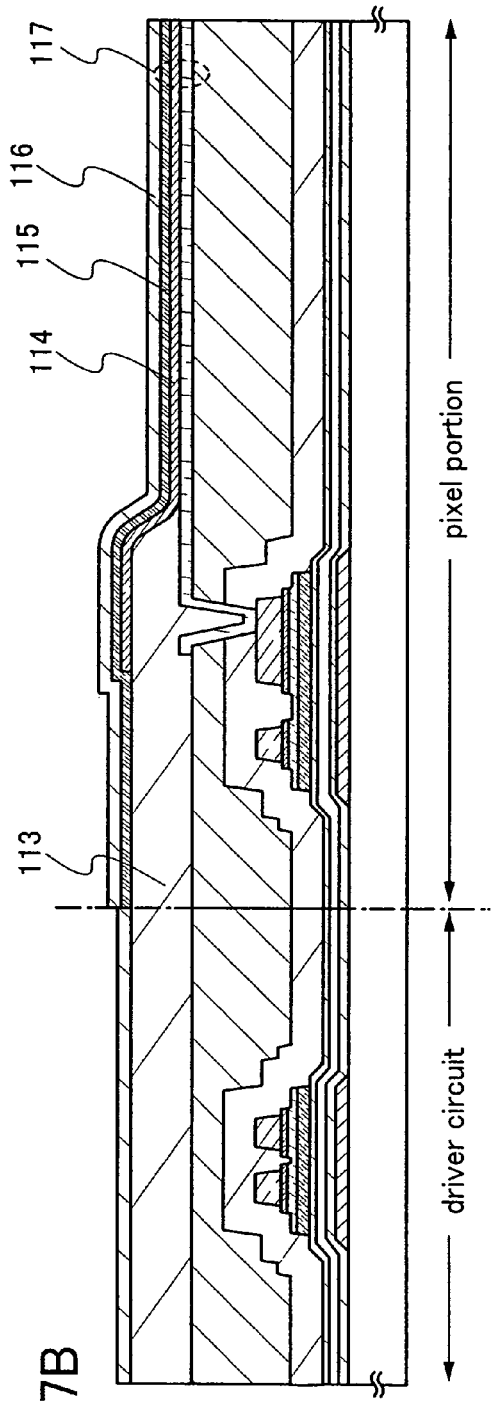
FIG. 27A
FIG. 27B

DISPLAY DEVICE AND MANUFACTURING METHOD THEREOF

BACKGROUND OF THE INVENTION

1. Field of the Invention

The present invention relates to a semiconductor device having a circuit including a thin film transistor (hereinafter referred to as a TFT) and a manufacturing method thereof. For example, the present invention relates to an electronic device provided with, as a component, an electro-optical device typified by a liquid crystal display panel or a light-emitting display device including an organic light-emitting element.

Note that, in this specification, a semiconductor device refers to any device which can function by using semiconductor characteristics. An electro-optical device, a semiconductor circuit, and an electronic device are all included in the category of the semiconductor device.

2. Description of the Related Art

In recent years, a technique for forming a thin film transistor (TFT) using a semiconductor thin film (with a thickness of about several nm to several hundreds nm) formed over a substrate having an insulating surface has been attracted. Thin film transistors have been widely applied to electronic devices such as ICs and electro-optical devices, and their development especially as switching elements for an image display device has been accelerated.

A thin film transistor using an amorphous semiconductor film, a thin film transistor using a polycrystalline semiconductor film, or the like is used as switching elements in image display devices.

In the case of the thin film transistor using an amorphous semiconductor film, an amorphous semiconductor film such as a hydrogenated amorphous silicon film is used; therefore, there is limitation on the process temperature, and heating at a temperature of 400° C. or more at which hydrogen is detached from the film, intense laser light irradiation by which surface roughness occurs due to hydrogen in the film, and the like are not performed.

Further, as a method for forming a polycrystalline semiconductor film, the following technique is known: dehydrogenation treatment of reducing the hydrogen concentration in an amorphous silicon film is preformed in advance in order to prevent occurrence of surface roughness; a pulsed excimer laser beam is shaped into a linear shape with an optical system; and the dehydrogenated amorphous silicon film is scanned and irradiated with the linear beam for crystallization.

A thin film transistor using a polycrystalline semiconductor film has an advantage in that mobility is higher than that of a thin film transistor using an amorphous semiconductor film by two or more digits, and a pixel portion and a peripheral driver circuit of a display device can be formed over the same substrate. However, the thin film transistor using a polycrystalline semiconductor film requires a more complicated process than the thin film transistor using an amorphous semiconductor film because of crystallization of the semiconductor film; thus, there are problems such as reduction in yield and increase in cost.

The present applicant has disclosed an FET (field effect transistor) in which a channel formation region is formed of a semiconductor having a mixture of a crystalline structure and a noncrystalline structure in Patent Document 1 (U.S. Pat. No. 5,591,987).

In addition, as switching elements in image display devices, a thin film transistor using a microcrystalline semiconductor film has been used (Patent Document 2: Japanese Published Patent Application No. H4-242724 and Patent Document 3: Japanese Published Patent Application No. 2005-49832).

As a conventional method for manufacturing a thin film transistor, a technique is known in which an amorphous silicon film is formed over a gate insulating film, a metal film is formed over the amorphous silicon film, and the metal film is irradiated with a diode laser so that the amorphous silicon film is changed into a microcrystalline silicon film (Non-Patent Document 1: SID'07 Digest, pp. 1370-1373, 2007, Toshiaki Arai, et al.). According to this method, the metal film formed over the amorphous silicon film is to convert light energy of the diode laser into thermal energy, and the metal film needs to be removed later for completion of a thin film transistor. That is, this is the method in which the amorphous silicon film is heated only by conduction heating from the metal film to form the microcrystalline silicon film.

SUMMARY OF THE INVENTION

A thin film transistor is a switching element that is turned on when a certain amount of voltage (referred to as a threshold voltage ($V_{th}$)) is applied to a gate electrode and is turned off when a voltage less than the certain amount is applied. This threshold voltage ($V_{th}$) corresponds to the amount of voltage at a starting point of rising of a curve obtained by measuring a current-voltage characteristic graph of the thin film transistor. As the threshold voltage ($V_{th}$) is closer to 0 V, the thin film transistor is better; it can be said that a thin film transistor with a threshold voltage ($V_{th}$) of 0 V is an ideal switching element.

The threshold voltage is shifted in a negative or positive direction in some cases depending on an indefinite factor in a manufacturing process of the thin film transistor. If the amount of shift from 0 V is large, driving voltage is increased, which results in increase of power consumption of a semiconductor device.

Also in the thin film transistor using a microcrystalline semiconductor film, the threshold voltage is shifted in a negative or positive direction in some cases depending on an indefinite factor.

In view of the foregoing problem, it is an object of the present invention to provide a method for manufacturing a display device including a thin film transistor using a microcrystalline semiconductor film, in which the threshold voltage is controlled to a desired amount.

A gate electrode is formed, a gate insulating film is formed, and a microcrystalline semiconductor film with a thickness of 10 to 50 nm is formed over the gate insulating film. Then, an impurity element which imparts one conductivity type (a p-type impurity element or an n-type impurity element) is added into the microcrystalline semiconductor film in order to control the threshold voltage. After a slight amount of boron is purposely added into the microcrystalline semiconductor film by an ion implantation method or the like, laser process is performed thereon so that activation of the added boron and improvement of crystallinity of the microcrystalline semiconductor film at an interface between the gate insulating film and the microcrystalline semiconductor film are performed by the same step. This laser process (hereinafter also referred to as 'LP') causes solid-phase crystal growth, which is performed by radiation heating without melting the microcrystalline semiconductor film. That is, this laser process utilizes a critical region in which the stacked microcrystalline semiconductor film does not become a liquid phase, and, in that sense, it can also be referred to as 'critical growth'.

In this manner, a microcrystalline semiconductor film which functions as a channel formation region is formed over the gate insulating film. The microcrystalline semiconductor film obtained by performing LP treatment on the formed microcrystalline semiconductor film is called an LPSAS (laser process semi-amorphous semiconductor) film. After the laser light irradiation, a buffer layer made of an amorphous semiconductor film is formed over the microcrystalline semiconductor film. Then, a pair of source and drain regions are formed over the buffer layer, and a pair of source and drain electrodes are formed in contact with the source and drain regions so as to expose respective parts of the source and drain regions.

In a thin film transistor having the above-described structure, the channel formation region is made of the microcrystalline semiconductor film; therefore, the field-effect mobility is higher than that of a conventional thin film transistor using an amorphous semiconductor film.

Since the slight amount of boron is added into the microcrystalline semiconductor film which functions as a channel formation region, the threshold value of the thin film transistor is controlled and oxidation of the microcrystalline semiconductor film is prevented. Further, since the buffer layer which functions as a high-resistance region is included, the amount of leakage current of the thin film transistor is small and the withstand voltage is high.

In addition, a thin film transistor (TFT) is manufactured using a microcrystalline semiconductor film, and a display device is manufactured using the thin film transistor for a pixel portion, and further, for a driver circuit. The thin film transistor in which a microcrystalline semiconductor film is used for a channel formation region has a mobility of 1 $cm^2/V \cdot sec$ to 20 $cm^2/V \cdot sec$, which is 2 to 20 times as high as that of a thin film transistor in which an amorphous semiconductor film is used for a channel formation region Therefore, part of the driver circuit or the entire driver circuit can be formed over the same substrate as the pixel portion, so that a system-on-panel can be manufactured.

A structure of the present invention which relates to a manufacturing method of a semiconductor device disclosed in this specification is a manufacturing method of a display device including the following steps: a gate electrode is formed over a substrate; an insulating film is formed over the gate electrode; a first semiconductor film which overlaps the gate electrode is formed over the insulating film; an n-type or p-type impurity element is added into the first semiconductor film to form a second semiconductor film; the second semiconductor film is irradiated with laser light to form a third semiconductor film; a buffer layer is formed over the third semiconductor film; a fourth semiconductor film including an n-type impurity element is formed over the buffer layer; and a source electrode and a drain electrode are formed over the fourth semiconductor film.

In the above-described manufacturing method, the first semiconductor film is a microcrystalline semiconductor film, and the third semiconductor film is a microcrystalline semiconductor film having higher crystallinity than the first semiconductor film. In this specification, 'having higher crystallinity' means that the peak intensity ratio of crystal to amorphous (hereinafter referred to as Ic/Ia) is higher.

The present invention solves at least one of the foregoing problems.

The microcrystalline semiconductor film can be formed by a high-frequency plasma CVD apparatus with a frequency of several tens of Megahertz to several hundreds of Megahertz or a microwave plasma CVD apparatus with a frequency of at least 1 GHz. Typically, the microcrystalline semiconductor film can be formed using silicon hydride such as $SiH_4$ or $Si_2H_6$ diluted with hydrogen. Further, the microcrystalline semiconductor film can also be formed using silicon hydride, hydrogen, and one or plural kinds of rare gas elements selected from helium, argon, krypton, and neon. In such a case, a flow rate of hydrogen is 12 to 1000 times inclusive, preferably, 50 to 200 times inclusive, and more preferably, 100 times as high as that of silicon hydride. Note that $SiH_2Cl_2$, $SiHCl_3$, $SiCl_4$, $SiF_4$, or the like can be used instead of silicon hydride.

Further, in the microcrystalline semiconductor film obtained through the above-described film-formation method, the amount of hydrogen in the film just after the film formation is smaller than that of a conventional hydrogenated amorphous silicon film; therefore, LP treatment can be performed without performing a heat treatment for dehydrogenation.

In the case where a microcrystalline semiconductor film with a thickness of 10 to 50 nm is formed over a gate insulating film, it is difficult to obtain a film having high crystallinity just after the film formation because of the small thickness of the microcrystalline semiconductor film. However, in the present invention, the film just after the film formation is acceptable as long as it contains at least a plurality of microcrystals each of which functions as a growth nucleus even if it is, for example, half amorphous. Therefore, a margin for film-formation condition of a microcrystalline semiconductor film can be increased.

Further, an impurity element which imparts one conductivity type is added into the microcrystalline semiconductor film which is to be a channel formation region of a thin film transistor, by an ion implantation method in which mass separation is performed, so that the threshold voltage is purposely shifted and controlled. As examples of the impurity element which imparts one conductivity type, phosphorus, arsenic, boron, and the like can be given. As examples of a dopant gas used in the ion implantation method in which mass separation is performed, phosphine, diborane, and the like can be given. Even if the crystallinity is decreased by addition of the impurity element which imparts one conductivity type by an ion implantation method compared with that just after the film formation, the crystallinity can be improved finally by performing LP treatment.

Further, the present invention is not limited to the ion implantation apparatus; and, for example, an ion doping apparatus in which mass separation is not performed can be used alternatively as long as the threshold value can be controlled by adding an impurity element which imparts one conductivity type into the microcrystalline semiconductor film with a thickness of 10 to 50 nm.

In order to add the impurity element which imparts one conductivity type, at a desired amount into the microcrystalline semiconductor film with a thickness of 10 to 50 nm by an ion implantation method, for example, ion implantation may be performed after a silicon nitride film with a desired thickness is formed and LP treatment may be performed after the silicon nitride film is removed. Note that the thickness of the silicon nitride film used for controlling the depth for ion implantation may be calculated from a dopant concentration profile of a sample obtained by ion implantation. Further, if ion implantation is performed using $B_{10}H_{14}$ and $B_{18}H_{22}$ as dopant gases used in the ion implantation method in which mass separation is performed, the amount of boron added into the gate insulating film can be reduced and boron can be added at a desired amount into the 10 to 50 nm-thick microcrystalline semiconductor film.

Although the microcrystalline semiconductor film is damaged by the doping for controlling the threshold value with an ion implantation apparatus or an ion doping apparatus, the damage can be recovered by performing LP treatment after the doping, and further, the crystallinity can also be improved compared with the microcrystalline semiconductor film before the doping, depending on the condition of the LP treatment.

Further, at the same time as the laser beam irradiation of the microcrystalline semiconductor film, the microcrystalline semiconductor film may also be heated. Typically, laser beam irradiation is performed while heating the substrate at a temperature of 300 to 400° C. inclusive, so that the crystallinity of the microcrystalline semiconductor film can be improved. Alternatively, at the same time as the laser beam irradiation of the microcrystalline semiconductor film, intense light irradiation may be performed to increase the temperature of the microcrystalline semiconductor film in a moment. As a typical example of the intense light, an infrared ray with a peak at 1 to 2 μm (preferably, halogen light (1.3 μm)) can be used in particular.

Further, if a thin oxide film is formed by the LP treatment, the oxide film is preferably removed by wet etching. By removing the oxide film, inhibition of carrier move, due to the oxide film formed at an interface between the LPSAS film and the buffer layer can be reduced. Furthermore, the LPSAS film may be etched to have a smaller thickness. If the LPSAS film has a thickness of 1 to 50 nm inclusive, a complete-depletion-type thin film transistor can be manufactured.

Further, it is preferable that a surface of the microcrystalline semiconductor film be cleaned before the LP treatment. Cleaning before the LP treatment can prevent an impurity attached to the surface of the microcrystalline semiconductor film from mixing into the microcrystalline semiconductor film by laser beam irradiation.

Alternatively, ion implantation may be performed after first LP treatment is performed, and then, second LP treatment or heat treatment may be performed thereon. A structure of the present invention is a manufacturing method of a display device including the following steps: a gate electrode is formed over a substrate; an insulating film is formed over the gate electrode; a first semiconductor film which overlaps the gate electrode is formed over the insulating film; the first semiconductor film is irradiated with first laser light to form a second semiconductor film; a p-type or n-type impurity element is added into the second semiconductor film to form a third semiconductor film; the third semiconductor film is irradiated with second laser light to form a fourth semiconductor film; a buffer layer is formed over the fourth semiconductor film; a fifth semiconductor film including an n-type impurity element is formed over the buffer layer; and a source electrode and a drain electrode are formed over the fifth semiconductor film.

In the above-described manufacturing method, the first semiconductor film is a microcrystalline semiconductor film, and the fourth semiconductor film is a microcrystalline semiconductor film having higher crystallinity than the first semiconductor film.

The present invention solves at least one of the foregoing problems.

By improving the crystallinity of the microcrystalline semiconductor film in advance by performing LP treatment, totally changing the microcrystalline semiconductor film to an amorphous semiconductor film by ion implantation can be prevented. Further, it is not necessary that respective conditions of the first LP treatment and the second LP treatment be the same. It is preferable that an oxide film formed at the time of the second LP treatment be removed before the buffer layer is formed. Further, an oxide film is formed on the surface also in the case where heat treatment is performed after the ion implantation; therefore, it is preferable to remove the oxide film before the buffer layer is formed.

Alternatively, the present invention is not limited to the ion implantation after the film formation; and, in order to control the threshold value of a thin film transistor, a microcrystalline semiconductor film may be formed while containing a slight amount of boron or phosphorus, and LP treatment may be performed after the film formation. A structure of the present invention is a manufacturing method of a display device including the following steps: a gate electrode is formed over a substrate; an insulating film is formed over the gate electrode; a first semiconductor film including a p-type or n-type impurity element is formed over the insulating film; the first semiconductor film is irradiated with laser light to form a second semiconductor film; a buffer layer is formed over the second semiconductor film; a third semiconductor film including an n-type impurity element is formed over the buffer layer; and a source electrode and a drain electrode are formed over the third semiconductor film.

In the above-described manufacturing method, the first semiconductor film is a microcrystalline semiconductor film, and the second semiconductor film is a microcrystalline semiconductor film having higher crystallinity than the first semiconductor film.

The present invention solves at least one of the foregoing problems.

In the case where the microcrystalline semiconductor film is formed while containing a slight amount of boron and LP treatment is performed after the film formation, a step of activating boron is not needed, unlike the case where ion implantation is performed after film formation; therefore, by the LP treatment in this case, improvement of the crystallinity is performed. The case where the microcrystalline semiconductor film is formed while containing a slight amount of boron and LP treatment is performed after the film formation can be considered as a process suitable for mass production because steps such as an ion implantation step and a cleaning step before ion implantation are cut. As a method for including a slight amount of boron at the time of the film formation, there is a method, for example, in which a diborane gas is introduced as one film-formation gas into a film-formation chamber at the time of the film formation. Further, as a method for forming a microcrystalline semiconductor film while containing a slight amount of phosphorus at the time of the film formation, there is a method, for example, in which a slight amount of phosphine gas is introduced as one film-formation gas into a film-formation chamber at the time of the film formation.

Further, a display device obtained using any of the above-described manufacturing methods is also a structure of the present invention. The structure of the present invention is a display device including a gate electrode formed over a substrate, an insulating film formed over the gate electrode, a first semiconductor film including a p-type or n-type impurity element, formed to overlap the gate electrode over the insulating film, a buffer layer formed over the first semiconductor film, a second semiconductor film including an n-type impurity element, formed over the buffer layer, and a source electrode and a drain electrode formed over the second semiconductor film.

Further, examples of the display device include a light-emitting device and a liquid crystal display device. The light-emitting device includes a light-emitting element, and the liquid crystal display device includes a liquid crystal element.

The light-emitting element includes an element of which luminance is controlled by current or voltage in its category, and specifically includes an inorganic EL (electroluminescence) element, an organic EL element, and the like.

Further, the display device includes a panel where a display element is sealed and a module where an IC including a controller or the like is mounted on the panel. The present invention further relates to an element substrate that is one mode before a display element is completed in a manufacturing process of the display device. The element substrate is provided with a means to supply current to the display element in each of a plurality of pixels. Specifically, the element substrate may be in a state provided with only a pixel electrode of the display element, a state after a conductive film to be a pixel electrode is formed and before the conductive film is etched to form the pixel electrode, or other states.

Note that the display device in this specification means an image display device, a light-emitting device, or a light source (including a lighting device). Further, the display device includes any of the following modules in its category: a module in which a connector such as a flexible printed circuit (FPC), tape automated bonding (TAB) tape, or a tape carrier package (TCP) is attached; a module having a TAB tape or a TCP provided with a printed wiring board at the end thereof; and a module having an integrated circuit (IC) directly mounted on a display device by a COG (chip on glass) method.

A thin film transistor in which a microcrystalline semiconductor film including a p-type or n-type impurity element is used as a channel formation region and the threshold voltage is controlled to a desired amount by the p-type or n-type impurity element included purposely in the microcrystalline semiconductor film can be achieved.

BRIEF DESCRIPTION OF THE DRAWINGS

FIGS. 10A to 10C are cross-sectional views illustrating a manufacturing process of the present invention.

FIG. 13 is a view describing a liquid crystal display device of the present invention.

FIGS. 27A and 27B are cross-sectional views describing a method for manufacturing a light-emitting device of the present invention.

DETAILED DESCRIPTION OF THE INVENTION

Embodiment Modes of the present invention will be hereinafter described. However, the present invention is not limited to the description below. As can be easily understood by those skilled in the art, the modes and details of the present invention can be changed in various ways without departing from the spirit and scope of the present invention. Thus, the present invention should not be taken as being limited to the following description of the embodiment modes. Therefore, unless otherwise such changes and modifications depart from the spirit and scope of the present invention, they should be construed as being included therein.

Embodiment Mode 1

In this embodiment mode, a manufacturing process of a thin film transistor of a liquid crystal display device will be described using FIGS. 1A to 1D, FIGS. 2A to 2D, FIGS. 3A to 3C, and FIG. 4. FIGS. 1A to 1D, FIGS. 2A to 2D, and FIGS. 3A to 3C are cross-sectional views illustrating a manufacturing process of a thin film transistor, and FIG. 4 is a top view in a connection region between a thin film transistor and a pixel electrode in one pixel.

As a thin film transistor having a microcrystalline semiconductor film, an n-channel one is more suitable for a driver circuit than a p-channel one because of higher mobility. It is preferable that all the thin film transistors formed over one substrate have the same conductivity type so that the number of manufacturing steps is suppressed. In this embodiment mode, description will be made using an n-channel thin film transistor.

Figure 1A:
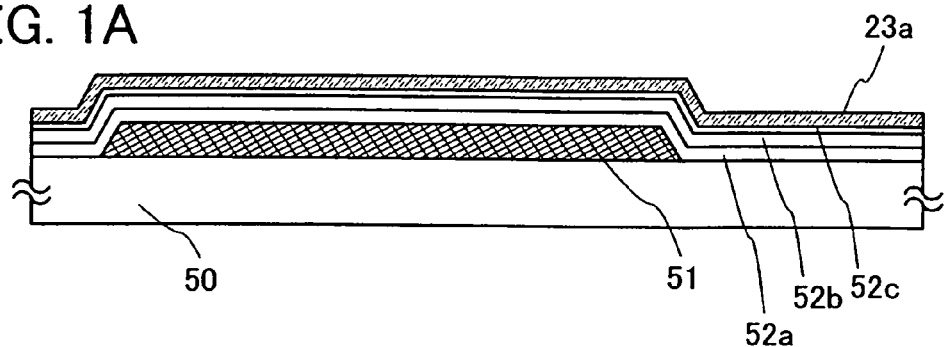
FIGS. 1A to 1D are cross-sectional views illustrating a manufacturing process of the present invention.

As shown in FIG. 1A, a gate electrode 51 is formed over a substrate 50. As the substrate 50, a non-alkaline glass substrate manufactured by a fusion method or a float method, such as a substrate of barium borosilicate glass, aluminoborosilicate glass, or aluminosilicate glass, a ceramic substrate, a plastic substrate having heat resistance that can withstand a process temperature of the manufacturing process, or the like can be used. Alternatively, a metal substrate such as a substrate of a stainless steel alloy, provided with an insulating film on its surface, may be used. In the case where the substrate 50 is a mother glass, a substrate having the following size can be used: $1^{st}$ Generation (320 mm×400 mm); $2^{nd}$ Generation (400 mm×500 mm); $3^{rd}$ Generation (550 mm×650 mm); $4^{th}$ Generation (680 mm×880 mm or 730 mm×920 mm); $5^{th}$ Generation (1000 mm×1200 mm or 1100 mm×1250 mm); $6^{th}$ Generation (1500 mm×1800 mm); $7^{th}$ Generation (1900 mm×2200 mm); $8^{th}$ Generation (2160 mm×2460 mm); $9^{th}$ Generation (2400 mm×2800 mm or 2450 mm×3050 mm); $10^{th}$ Generation (2950 mm×3400 mm); or the like.

The gate electrode 51 is formed of a metal material such as titanium, molybdenum, chromium, tantalum, tungsten, or aluminum, or an alloy material thereof. The gate electrode 51 can be formed as follows: a conductive film is formed over the substrate 50 by a sputtering method or a vacuum evaporation method, a mask is formed by a photolithography technique or an ink-jet method over the conductive film, and the conductive film is etched using the mask. Alternatively, the gate electrode 51 can be formed by discharging a conductive nanopaste of silver, gold, copper, or the like by an ink-jet method and baking it. Note that a nitride film formed of the above metal material may be provided between the substrate 50 and the gate electrode 51 to improve adherence of the gate electrode 51 to the substrate 50 and serve as a barrier metal for preventing diffusion of impurities to a base. In this embodiment mode, the gate electrode is formed by etching a conductive film formed over the substrate 50, with a resist mask formed using a first photomask.

As a specific example of a structure of the gate electrode, a structure in which a molybdenum film is stacked on an aluminum film so that a hillock and electromigration specific to aluminum are prevented may be employed. Further, a three-layer structure in which an aluminum film is sandwiched by molybdenum films may be employed as well. Further, as other examples of the structure of the gate electrode, a stacked-layer structure in which a molybdenum film is stacked on a copper film, a stacked-layer structure in which a titanium nitride film is stacked on a copper film, and a stacked-layer structure in which a tantalum nitride film is stacked on a copper film can be given.

Note that, since a semiconductor film and a wiring are formed over the gate electrode 51, the gate electrode is preferably processed to have tapered end portions in order to prevent disconnection of the semiconductor film and the wiring thereover due to a step. Further, although not shown, a wiring that is connected to the gate electrode can also be formed at the same time when the gate electrode is formed.

Next, gate insulating films 52a, 52b, and 52c, and a microcrystalline semiconductor film 23a are formed in this order over the gate electrode 51. A cross-sectional view of a thin film transistor after the steps up to the above is FIG. 1A. Note that it is preferable that the gate insulating films 52a, 52b, and 52c, and the microcrystalline semiconductor film 23a be formed successively without being exposed to the air. By successively forming them, each interface between the films can be formed without being contaminated with air components or contamination impurity elements contained in the air; thus, variations in characteristics of a thin film transistor can be reduced.

Each of the gate insulating films 52a, 52b, and 52c can be formed of a silicon oxide film, a silicon nitride film, a silicon oxynitride film, or a silicon nitride oxide film by a CVD method, a sputtering method, or the like. It is preferable that a plurality of different insulating layers be used for a gate insulating film 52 in order to prevent interlayer short-circuiting caused by a pinhole or the like formed therein. In this embedment mode, a silicon nitride film, a silicon oxynitride film, and a silicon nitride film are stacked in this order as the gate insulating films 52a, 52b, and 52c respectively.

Note that, in this embedment mode, the silicon oxynitride film means a film that contains more oxygen than nitrogen and, when being measured using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the silicon nitride oxide film means a film that contains more nitrogen than oxygen and, when being measured using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

The first layer and the second layer of the gate insulating film 52 are each formed to be thicker than 50 nm. It is preferable that the first layer of the gate insulating film 52 be a silicon nitride film or a silicon nitride oxide film in order to prevent diffusion of an impurity (e.g., alkali metal) from the substrate. Further, the first layer of the gate insulating film 52 can have a function of preventing generation of a hillock when the gate electrode is made of aluminum, in addition to a function of preventing oxidation of the gate electrode. Further, the third layer of the gate insulating film 52, which in contact with the microcrystalline semiconductor film is formed to have a thickness of larger than 0 nm and 10 nm or less. The third layer of the gate insulating film 52 is to improve the adherence to the microcrystalline semiconductor film. Further, when the third layer of the gate insulating film 52 is formed of a silicon nitride film, oxidation of the microcrystalline semiconductor film by heat treatment or laser irradiation performed later can be prevented. For example, if heat treatment is performed in the state in which an insulating film including a large amount of oxygen is in contact with the microcrystalline semiconductor film, there is a possibility that the microcrystalline semiconductor film may be oxidized.

Furthermore, it is preferable to form the gate insulating film 52 with a microwave plasma CVD apparatus with a frequency of 1 GHz. A silicon oxynitride film or a silicon nitride oxide film formed with a microwave plasma CVD apparatus has high resistance to voltage, so that reliability of a thin film transistor can be improved.

Further, the microcrystalline semiconductor film 23a is a film including a semiconductor having an intermediate structure between amorphous and crystalline (including single-crystalline and polycrystalline) structures. This semiconductor has a third state which is stable in free energy, and is crystalline semiconductor in which a short-range order and lattice distortion are provided and in which columnar or needle crystals each having a grain size of 0.5 to 20 nm are grown in a normal direction with respect to a substrate surface. Further, a microcrystalline semiconductor and an amorphous semiconductor are mixed. In microcrystalline silicon which is a typical example of the microcrystalline semiconductor, a Raman spectrum thereof is shifted to the lower wavenumber side than 520.5 $cm^{-1}$ which shows single-crystalline silicon. That is, the Raman spectrum of microcrystalline silicon peaks between 520.5 $cm^{-1}$ which shows single-crystalline silicon and 480 $cm^{-1}$ which shows amorphous silicon. Further, hydrogen or halogen is contained at least at 1 at. % to terminate a dangling bond. Moreover, a rare gas element such as helium, argon, krypton, or neon may be contained to further promote lattice distortion, so that stability is enhanced and a favorable microcrystalline semiconductor film can be obtained. Description of such a microcrystalline semiconductor film is disclosed in, for example, U.S. Pat. No. 4,409,134.

The microcrystalline semiconductor film 23a can be formed with a high-frequency plasma CVD apparatus with a frequency of several tens of Megahertz to several hundreds of Megahertz, or a microwave plasma CVD apparatus with a frequency of 1 GHz or more. Typically, the microcrystalline semiconductor film 23a can be formed using silicon hydride such as $SiH_4$ or $Si_2H_6$ diluted with hydrogen. Further, the microcrystalline semiconductor film 23a can also be formed using silicon hydride, hydrogen, and one or plural kinds of rare gas elements selected from helium, argon, krypton, and neon. In such a case, a flow rate of hydrogen is 12 to 1000 times inclusive, preferably, 50 to 200 times inclusive, and more preferably, 100 times as high as that of silicon hydride. Note that $SiH_2Cl_2$, $SiHCl_3$, $SiCl_4$, $SiF_4$, or the like can be used instead of silicon hydride.

Further, it is preferable that the microcrystalline semiconductor film 23a contain oxygen at a concentration of $5\times10^{19}$ atoms/$cm^3$ or less, preferably, $1\times10^{19}$ atoms/$cm^3$ or less, and contain nitrogen and carbon each at a concentration of $3\times10^{18}$ atoms/$cm^3$ or less. By reducing the concentrations of oxygen, nitrogen, and carbon in the microcrystalline semiconductor film, the microcrystalline semiconductor film can be prevented from having n-type conductivity.

The microcrystalline semiconductor film 23a is formed to have a thickness of 1 nm to 20 nm inclusive, preferably, a thickness of 2 nm or more and less than 10 nm. It is preferable that the thickness of the microcrystalline semiconductor film 23a be equal to or larger than 2 nm and less than 10 nm because the absorptance of a laser beam in LP treatment performed later can be increased when the thickness of the microcrystalline semiconductor film 23a is in the range of 4 nm to 8 nm. By forming the microcrystalline semiconductor film 23a to have the thickness in the above-described range, a complete-depletion-type thin film transistor can be formed. Further, the deposition rate of the microcrystalline semiconductor film 23a is 1/10 to 1/100 of, that is, smaller than that of an amorphous semiconductor film; therefore, the throughput can be improved by reducing the thickness of the microcrystalline semiconductor film 23a.

Further, before the microcrystalline semiconductor film 23a is formed, hydrogen plasma treatment may be performed on the surface of the gate insulating film 52c. By performing the hydrogen plasma treatment, lattice distortion at an interface between the gate insulating film and the microcrystalline semiconductor film can be reduced, so that interface characteristics of the gate insulating film and the microcrystalline semiconductor film can be improved. Consequently, electrical characteristics of a thin film transistor can be improved.

Figure 1B:
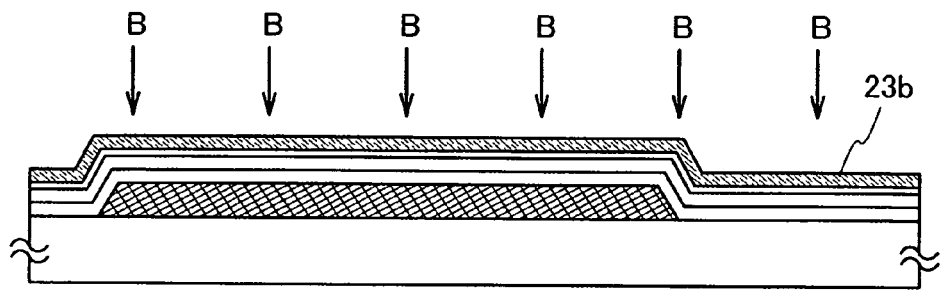

Next, in order to control the threshold value, an impurity element which imparts one conductivity type is purposely added by an ion implantation method. The microcrystalline semiconductor film 23a just after being formed has weak n-type electrical conductivity; therefore, a channel doping in which a slight amount of boron is added to control the threshold value is performed here. In this manner, a microcrystalline semiconductor film 23b including boron can be obtained as shown in FIG. 1B. The crystallinity of the microcrystalline semiconductor film 23b including boron is lower than that of the microcrystalline semiconductor film 23a just after being formed, due to the ion implantation.

Next, in order to improve the crystallinity as compared to the microcrystalline semiconductor film 23a just after being formed, the microcrystalline semiconductor film is irradiated with a laser beam from the surface side. The laser beam irradiation is performed with energy at the amount by which the microcrystalline semiconductor film is not melted. The energy range may be determined considering that heat of the laser beam is dispersed due to the existence of the gate electrode 51 below the microcrystalline semiconductor film. Therefore, depending on the energy of the laser beam, the microcrystalline semiconductor film in a region which does not overlap the gate electrode 51 is melted while the microcrystalline semiconductor film in a region which overlaps the gate electrode 51 is not melted in some cases. The microcrystalline semiconductor film has different film qualities between the region which overlaps the gate electrode 51 and the region which does not overlap the gate electrode 51; therefore, in this embodiment mode, a semiconductor layer used in a thin film transistor uses only the region which overlaps the gate electrode, preferably, the region which overlaps the gate electrode except the tapered portion of the gate electrode. By using microcrystalline semiconductor films having the same film quality for channel formation regions, characteristic variations in a plurality of thin film transistors can be suppressed.

The laser beam can also act on an interface between the microcrystalline semiconductor film and the gate insulating film 52c. Accordingly, a microcrystalline semiconductor film in which solid-phase crystal growth is performed at the interface of the gate insulating film with a crystal on the surface side of the microcrystalline semiconductor film as a seed and the crystallinity is improved, a so-called LPSAS film 53, can be formed (see FIG. 1C). Solid-phase crystal growth by LP treatment does not increase the crystal grain size but improves the crystallinity in the thickness direction of the film. That is, the LP treatment improves the crystallinity of the microcrystalline semiconductor film near the gate insulating film and gives a good effect of improving the electrical characteristics of a thin film transistor having a bottom-gate structure.

Furthermore, the LP treatment here can also activate boron added into the microcrystalline semiconductor film. With the boron contained in the microcrystalline semiconductor film, a thin film transistor in which the threshold voltage is controlled to a desired amount can be obtained. For example, if the threshold voltage can be controlled to be equal to or lower than 0 V by boron contained in the microcrystalline semiconductor film, a normally-off switching element in which a thin film transistor is off when a gate voltage applied to the thin film transistor is 0 V can be obtained.

For the laser beam, in the case of using an excimer laser, the repetition rate is set to be greater than or equal to 1 Hz and less than 10 MHz, preferably, 100 Hz to 10 kHz, and the laser energy density is set to be 0.2 to 0.35 J/cm$^2$ (typically, 0.2 to 0.3 J/cm$^2$). In the case of using a YAG laser, it is preferable that the third harmonic be used, the repetition rate be set to be greater than or equal to 1 Hz and less than 10 MHz, and the laser energy density be set to be 0.2 to 0.35 J/cm$^2$ (typically, 0.2 to 0.3 J/cm$^2$).

As a laser oscillator for oscillating a laser beam, a laser oscillator capable of pulsed oscillation or continuous oscillation can be used. Further, the laser wavelength is set to be within the visible to ultraviolet light region (wavelength of 800 nm or less), preferably within the ultraviolet light region (wavelength of 400 nm or less), so that the laser beam is absorbed by the semiconductor film effectively. By using a laser beam in the ultraviolet light region at a wavelength of 300 to 400 nm, the laser beam can be absorbed effectively. As the laser oscillator, the following can be used: an excimer laser oscillator of KrF, ArF, XeCl, XeF, or the like; a gas laser oscillator of $N_2$, He, He—Cd, Ar, He—Ne, HF, or the like; a solid-state laser oscillator using a crystal such as YAG, $GdVO_4$, $YVO_4$, YLF, $YAlO_3$, $ScO_3$, $LU_2O_3$, or $Y_2O_3$, doped with Cr, Nd, Er, Ho, Ce, Co, Ti, Yb, or Tm; a solid-state laser such as a KGW laser, a KYW laser, an alexandrite laser, or a Ti:sapphire laser; a metal vapor laser oscillator such as a helium cadmium laser; or the like. Note that, as for the solid-state laser oscillator, any of the second to fifth harmonics is preferably employed.

Typically, a laser beam having a wavelength of less than or equal to 400 nm, such as an excimer laser beam having a wavelength of 308 nm or the third harmonic of a YAG laser (355 nm) is used.

In the LP treatment, by focusing the laser beam into a long rectangular shape to be a linear laser beam, the microcrystalline semiconductor film 23b over, for example, a glass substrate with a size of 730 mm×920 mm can be processed by one laser beam scan. In this case, the LP treatment is performed with a rate of overlapping the linear laser beam (an overlapping rate) of 0 to 95% (preferably, 0 to 67%). As a result of this, processing time per substrate is reduced, so that the productivity can be improved. The shape of the laser beam is not limited to a linear shape, and a similar processing to the above can also be performed when the laser beam has a planar shape. Further, the LP treatment can be applied not only to the glass substrate with the above-described size but also to substrates with various sizes.

Further, in the case where a continuous wave laser beam is used as the laser beam, by providing a polygon mirror or a galvanometer mirror between an oscillator and a substrate and scanning with the laser beam at high speed, the throughput of LP treatment can be improved, and the LP treatment can be performed on a microcrystalline semiconductor film formed over a glass substrate with a size of, for example, 730 mm×920 mm, or a glass substrate with a size lager than that.

Note that the microcrystalline semiconductor film 23b may be irradiated with a laser beam under an argon atmosphere, a hydrogen atmosphere, an atmosphere including argon and hydrogen, a nitrogen atmosphere, or the like. Formation of an oxide film on the LPSAS film 53 can be suppressed by irradiating the microcrystalline semiconductor film with the laser beam in an inactive atmosphere as described above.

Further, by cleaning the surface of the microcrystalline semiconductor film 23b before the microcrystalline semiconductor film 23b is irradiated with a laser beam, mixing an impurity, which is attached to the surface of the microcrystalline semiconductor film 23b at the time of channel doping or the like, into the microcrystalline semiconductor film by laser beam irradiation can be prevented.

Further, at the same time as the laser beam irradiation of the microcrystalline semiconductor film, the microcrystalline semiconductor film may also be heated. Typically, laser beam irradiation is performed while heating the substrate 50 at a temperature of 300 to 400° C. inclusive, so that the crystallinity of the microcrystalline semiconductor film 23b can be improved. Alternatively, at the same time as the laser beam irradiation of the microcrystalline semiconductor film 23b, intense light irradiation may be performed to increase the temperature of the microcrystalline semiconductor film 23b in a moment. As a typical example of the intense light, an infrared ray with a peak at 1 to 2 μm (preferably, halogen light (1.3 μm)) can be used in particular.

Figure 1C:
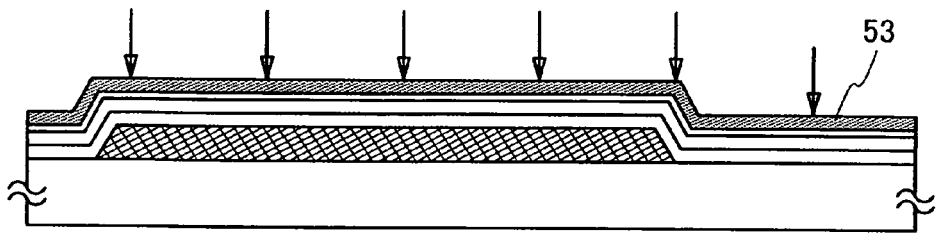
Figure 1D:
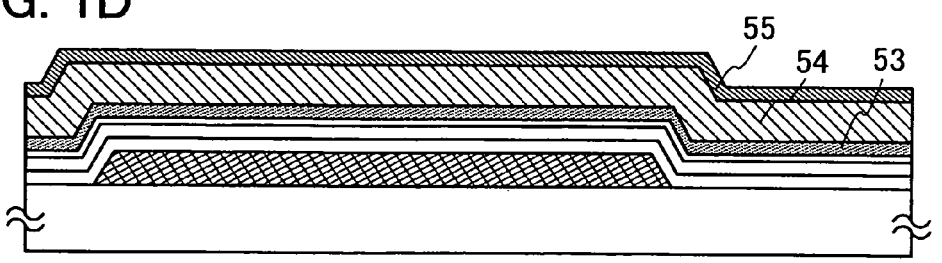

Next, as shown in FIG. 1D, a buffer layer 54 and a semiconductor film 55 in which an impurity which imparts one conductivity type is added are formed over the LPSAS film 53. If an oxide film is formed on the LPSAS film 53 by the laser beam irradiation, it is preferable that the oxide film be removed before the buffer layer 54 is formed.

The buffer layer 54 is formed of an amorphous semiconductor film including hydrogen, nitrogen, or halogen. By using hydrogen with a flow rate of one time to ten times inclusive, preferably, one time to five times inclusive as large as that of silicon hydride, an amorphous semiconductor film including hydrogen can be formed. Alternatively, by using silicon hydride and either nitrogen or ammonia, an amorphous semiconductor film including nitrogen can be formed. Further alternatively, by using silicon hydride and a gas including fluorine, chlorine, bromine, or iodine (e.g., $F_2$, $Cl_2$, $Br_2$, $I_2$, HF, HCl, HBr, or HI), an amorphous semiconductor film including fluorine, chlorine, bromine, or iodine can be formed. Note that, instead of silicon hydride, $SiH_2Cl_2$, $SiHCl_3$, $SiCl_4$, $SiF_4$, or the like can be used.

Further, as the buffer layer 54, an amorphous semiconductor film can be formed by sputtering an amorphous semiconductor, which is a target, with hydrogen or a rare gas. At this time, by including ammonia, nitrogen, or $N_2O$ in the atmosphere, an amorphous semiconductor film including nitrogen can be formed. Further, by including a gas including fluorine, chlorine, bromine, or iodine (e.g., $F_2$, $Cl_2$, $Br_2$, $I_2$, HF, HCl, HBr, or HI) in the atmosphere, an amorphous semiconductor film including fluorine, chlorine, bromine, or iodine can be formed.

Further, as the buffer layer 54, an amorphous semiconductor film may be formed on the LPSAS film 53 by a plasma CVD method or a sputtering method, and then an surface of the amorphous semiconductor film may be processed with hydrogen plasma, nitrogen plasma, or halogen plasma to be hydrogenated, nitrided, or halogenated. Alternatively, the surface of the amorphous semiconductor film may be processed with helium plasma, neon plasma, argon plasma, krypton plasma, or the like.

It is preferable that the buffer layer 54 be formed of an amorphous semiconductor film which does not include a crystal grain. Therefore, if the buffer layer 54 is formed by a high-frequency plasma CVD method with a frequency of several tens of Megahertz to several hundreds of Megahertz, or a microwave plasma CVD method, it is preferable to control the film formation condition so as to be an amorphous semiconductor film that does not include a crystal grain.

In a later process for forming a source region and a drain region, the buffer layer 54 is etched partly. It is preferable to form the buffer layer 54 with such a thickness that part of the buffer layer 54 can remain so as not to expose the LPSAS film 53 at that time. Typically, it is preferable to form the buffer layer 54 with a thickness of 100 to 400 nm inclusive, preferably, 200 to 300 nm inclusive. In a display device including a thin film transistor to which high voltage (e.g., about 15 V) is applied, typically, in a liquid crystal display device, if the buffer layer 54 is formed to have a large thickness as shown above, withstand voltage is increased, so that deterioration of the thin film transistor can be prevented even if high voltage is applied to the thin film transistor.

Note that an impurity which imparts one conductivity type such as phosphorus or boron is not added into the buffer layer 54. Since a slight amount of boron is contained in the LPSAS film 53 in order to control the threshold value, the buffer layer 54 functions as a barrier layer so that the impurity which imparts one conductivity type is not diffused from the semiconductor film 55. In the case where the buffer layer is not provided, if the LPSAS film and the semiconductor film 55 in which an impurity which imparts one conductivity type is added are in contact with each other, there is a fear of moving the impurity by a later etching process or heating treatment to make control of the threshold value difficult.

Furthermore, the formation of the buffer layer 54 on the LPSAS film 53 can prevent a surface of a crystal grain included in the LPSAS film 53b from being oxidized naturally. In particular, a region where an amorphous semiconductor and a crystal grain are in contact with each other is easily cracked due to local stress. If the crack is exposed to oxygen, the crystal grain is oxidized to form silicon oxide.

The buffer layer 54 which is an amorphous semiconductor film has a larger energy gap than the LPSAS film 53 (the energy gap of the amorphous semiconductor film is 1.1 to 1.5 eV, whereas the energy gap of the LPSAS film 53 is 1.6 to 1.8 eV), high resistance, and as low mobility as ⅕ to ¹⁄₁₀ of the LPSAS film 53. Thus, in a thin film transistor, the buffer layer formed between the source and drain regions and the LPSAS film 53 functions as a high resistant region, and the LPSAS film 53 functions as a channel formation region. As a result, off current of the thin film transistor can be reduced. When the thin film transistor is used as a switching element of a display device, contrast in the display device can be improved.

Note that it is preferable that the buffer layer 54 be formed at a temperature of 300 to 400° C. by a plasma CVD method over the LPSAS film 53. This film formation treatment supplies hydrogen to the LPSAS film 53, thereby providing the same effect as hydrogenating the LPSAS film 53. That is, by depositing the buffer layer 54 on the LPSAS film 53, hydrogen can be diffused into the LPSAS film 53, thereby terminating a dangling bond.

Further, when an n-channel thin film transistor is formed, the semiconductor film 55 may be doped with phosphorus typically, as an impurity which imparts one conductivity type; for example, an impurity gas such as $PH_3$ may be added to silicon hydride. When a p-channel thin film transistor is formed, the semiconductor film 55 may be doped with boron typically, as an impurity which imparts one conductivity type; for example, an impurity gas such as $B_2H_6$ may be added to silicon hydride. The semiconductor film 55 added with the impurity which imparts one conductivity type can be formed of a microcrystalline semiconductor or an amorphous semiconductor. The semiconductor film 55 added with the impurity which imparts one conductivity type is formed to have a thickness of 2 to 50 nm inclusive. By reducing the thickness of the semiconductor film added with the impurity which imparts one conductivity type, the throughput can be improved.

Figure 2A:
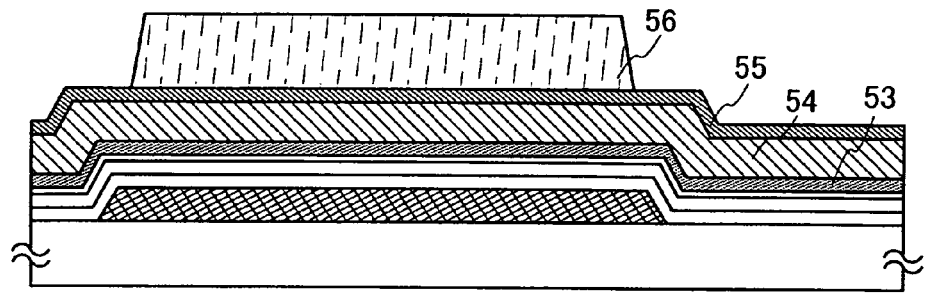
FIGS. 2A to 2D are cross-sectional views illustrating a manufacturing process of the present invention.

Next, as shown in FIG. 2A, a resist mask 56 is formed over the semiconductor film 55 added with the impurity which imparts one conductivity type. The resist mask 56 is formed by a photolithography technique or an inkjet method. In this embodiment mode, using a second photomask, a resist that is applied over the semiconductor film 55 added with the impurity which imparts one conductivity type is exposed to light to be developed, thereby the resist mask 56 is formed.

Figure 2B:
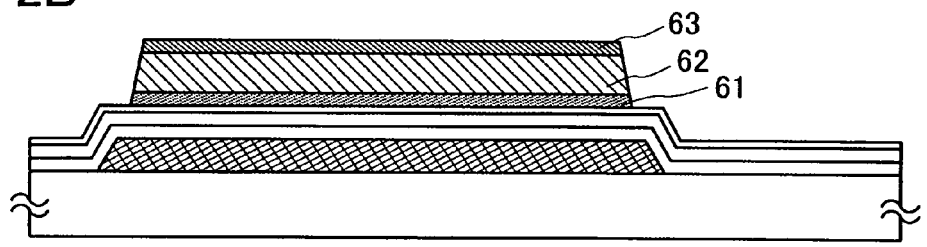

Next, the LPSAS film 53, the buffer layer 54, and the semiconductor film 55 added with the impurity which imparts one conductivity type are etched using the resist mask 56, whereby an LPSAS film 61, a buffer layer 62, and a semiconductor film 63 added with the impurity which imparts one conductivity type are formed as shown in FIG. 2B. After that, the resist mask 56 is removed.

By providing inclined end side portions for the LPSAS film 61 and the buffer layer 62, generation of leakage current between source and drain regions, which are formed over the buffer layer 62, and the LPSAS film 61 can be prevented. Further, generation of leakage current between source and drain electrodes and the LPSAS film 61 can be prevented. A preferred inclination angle of each end side portion of the LPSAS film 61 and the buffer layer 62 is 30° to 90°, preferably, 45° to 80°. The end side portion with such an angle can prevent the source electrode or the drain electrode from being disconnected due to a step.

Figure 2C:
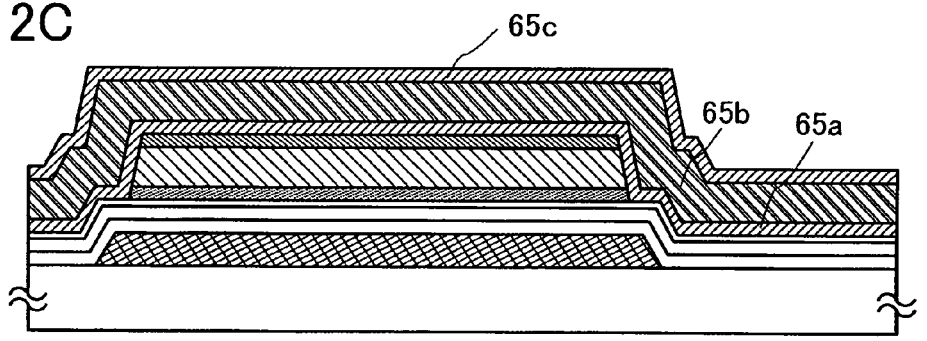

Next as shown in FIG. 2C, conductive films 65a to 65c are formed over the semiconductor film 63 added with the impurity which imparts one conductivity type and the gate insulating film 52c. The conductive films 65a to 65c are preferably formed with a single layer or stacked layers using aluminum; copper; or an aluminum alloy to which an element which prevents hillocks or an element to improve heat-resistance property, such as silicon, titanium, neodymium, scandium, or molybdenum, is added. Further, a film in contact with the semiconductor film added with the impurity which imparts one conductivity type may be formed of titanium, tantalum, molybdenum, or tungsten, or nitride of such an element, and aluminum or an aluminum alloy may be formed thereover to form a stacked-layer structure. Further alternatively, aluminum or an aluminum alloy may be sandwiched by titanium, tantalum, molybdenum, tungsten, or nitride of such an element to form a stacked-layer structure. In this embodiment mode, the conductive film having a three-layer structure of the conductive films 65a to 65c is shown; and a stacked-layer structure in which the conductive films 65a and 65c are formed of molybdenum films and the conductive film 65b is formed of an aluminum film, or a stacked-layer structure in which the conductive films 65a and 65c are formed of titanium films and the conductive film 65b is formed of an aluminum film is formed. The conductive films 65a to 65c are formed by a sputtering method or a vapor deposition method.

Figure 2D:
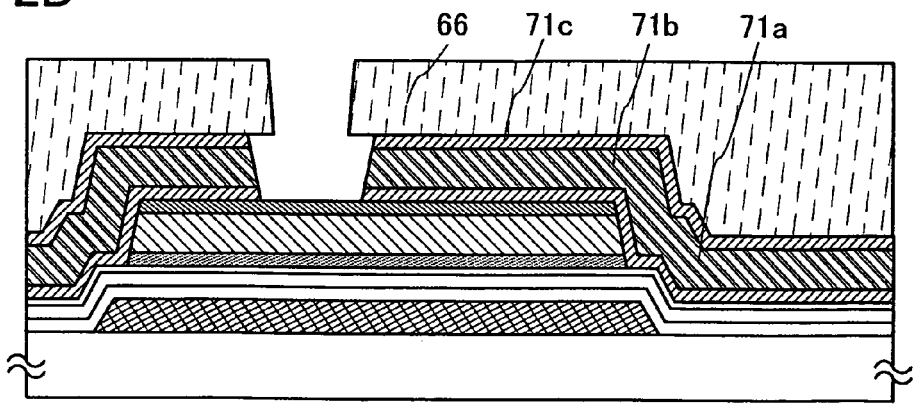

Next, as shown in FIG. 2D, a resist mask 66 is formed using a third photomask over the conductive films 65a to 65c, and part of the conductive films 65a to 65c is etched to form a pair of source and drain electrodes 71a to 71c. By performing wet-etching of the conductive films 65a to 65c, the conductive films 65a to 65c are etched selectively. Consequently, since the conductive films are isotropically-etched, the source and drain electrodes 71a to 71c with a smaller area than the resist mask 66 can be formed.

Figure 3A:
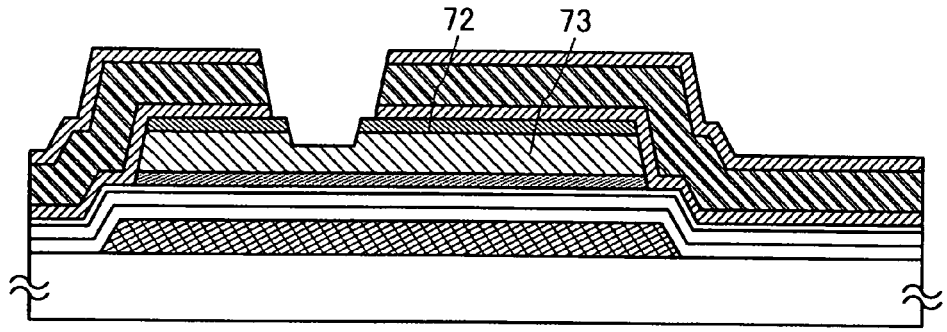
FIGS. 3A to 3C are cross-sectional views illustrating a manufacturing process of the present invention.
Figure 4:
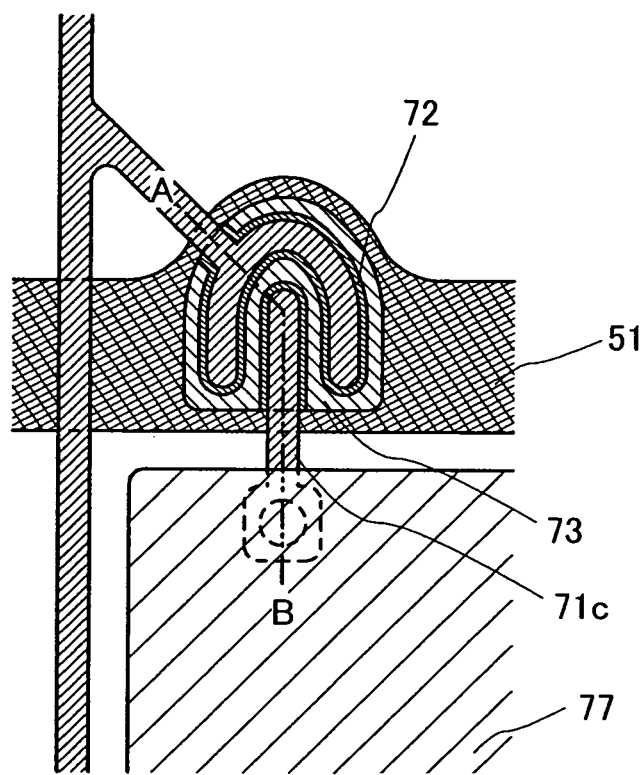
FIG. 4 is a top view illustrating a manufacturing process of the present invention.

Next, as shown in FIG. 3A, the semiconductor film 63 added with the impurity which imparts one conductivity type is etched using the resist mask 66, thereby a pair of source and drain regions 72 can be formed. In this etching process, part of the buffer layer 62 is also etched. The buffer layer which is etched partly and has a recessed portion (a groove) is referred to as a buffer later 73. The source and drain regions and the recessed portion (the groove) of the buffer layer can be formed by the same step. The recessed portion (the groove) of the buffer layer is formed to have a depth which is ½ to ⅓ of the largest thickness of the buffer layer, so that the source and drain regions can be separated from each other; thus, leakage current between the source and drain regions can be reduced. After that, the resist mask 66 is removed.

The quality of the resist mask is changed when the resist mask is exposed to plasma used for, in particular, dry-etching or the like and the resist mask is not completely removed in the resist removal step; thus, the buffer layer is etched by about 50 nm so that a residue of the resist mask is not left. The resist mask 66 is used twice for the partial etching treatment of the conductive films 65a to 65c and for the etching treatment at the time of forming the source and drain regions 72, and a residue thereof tends to remain if dry-etching is used for each treatment. Therefore, it is effective that the buffer layer that may be etched in removing the residue completely be formed to be thick. Further, the buffer layer 73 can also prevent plasma damage from being caused on the LPSAS film 61 at the time of dry etching.

Figure 3B:
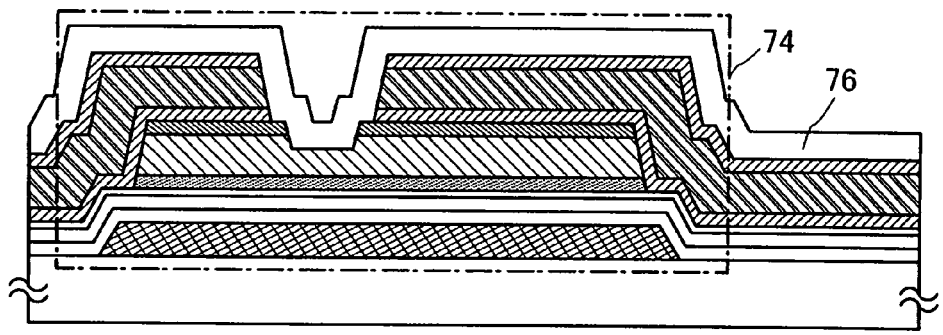
Figure 3C:
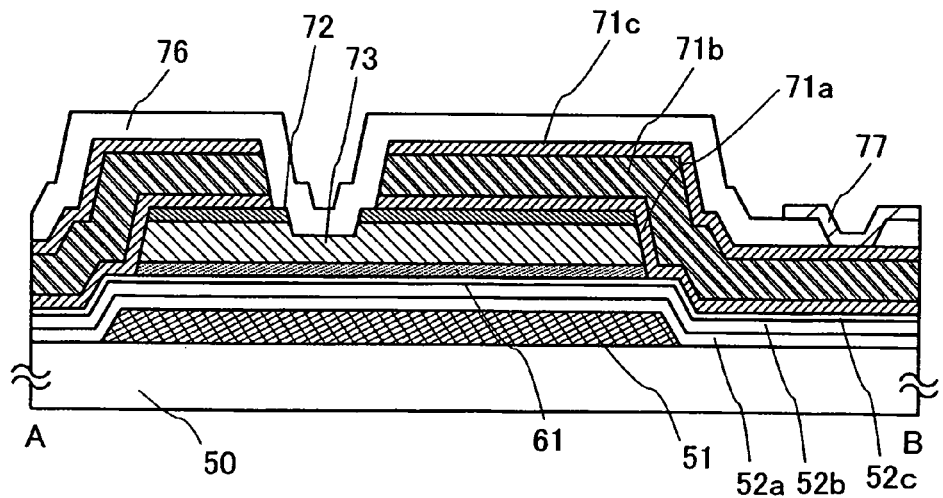

Next, as shown in FIG. 3B, an insulating film 76 is formed so as to cover the source and drain electrodes 71a to 71c, the source and drain regions 72, the buffer layer 73, the LPSAS film 61, and the gate insulating film 52c. The insulating film 76 can be formed in a similar manner to the gate insulating films 52a, 52b, and 52c. Note that the insulating film 76 is provided to prevent contamination impurities such as organic substances, metals, or moisture included in the air from entering, and is preferably a dense film. Further, by using a silicon nitride film as the insulating film 76, the oxygen concentration in the buffer layer 73 can be set to $5\times10^{19}$ atoms/cm$^3$ or less, preferably, $1\times10^{19}$ atoms/cm$^3$ or less.

As shown in FIG. 3B, the end portions of the source and drain electrodes 71a to 71c are deviated from those of the source and drain regions 72, whereby the distance between the end portions of the source and drain electrodes 71a to 71c can be large; thus, leakage current or short circuiting between the source and drain electrodes can be prevented. Furthermore, because the end portions of the source and drain electrodes 71a to 71c are deviated from those of the source and drain regions 72, an electric field is not concentrated on the end portions of the source and drain electrodes 71a to 71c and the source and drain regions 72; thus, leakage current between the gate electrode 51 and the source and drain electrodes 71a to 71c can be prevented. Accordingly, a thin film transistor with high reliability and high withstand voltage can be manufactured. Furthermore, a thin film transistor in which channel doping is performed to control the threshold value can be manufactured.

Through the above process, a channel-etched thin film transistor 74 can be formed.

In the thin film transistor described in this embodiment mode, the gate insulating film, the LPSAS film, the buffer layer, the source and drain regions, and the source and drain electrodes are stacked over the gate electrode; the buffer layer covers the surface of the LPSAS film which functions as a channel formation region. Further, the recessed portion (the groove) is formed in part of the buffer layer, and the other part of the buffer layer, except the recessed portion, is covered with the source and drain regions. That is, the source and drain regions have some distance therebetween because of the existence of the recessed portion in the buffer layer, and therefore, leakage current between the source and drain regions can be reduced. Further, since the recessed portion is formed by partially etching the buffer layer, an etching residue generated in the formation step of the source and drain regions can be removed, thereby generation of leakage current (a parasitic channel) between the source and drain regions through the residue can be prevented.

Further, the buffer layer is formed between the LPSAS film which functions as a channel formation region and the source and drain regions. Further, the surface of the LPSAS film is covered with the buffer layer. The high-resistance buffer layer extends to the region between the LPSAS film and the source and drain regions; therefore, generation of leakage current in the thin film transistor can be reduced and deterioration due to application of a high voltage can be reduced. Further, all of the buffer layer, the LPSAS film, and the source and drain regions are formed over a region which overlaps the gate electrode. Thus, the structure can be considered as a structure which is not adversely affected by the end form of the gate electrode. In the case where the gate electrode is formed with a stacked-layer structure, if aluminum is used for a lower layer thereof, aluminum may be exposed to the side surface of the gate electrode, which may cause a hillock. However, by forming the source and drain regions so as not to overlap the end portion of the gate electrode, short circuiting in the region which overlaps the side surface of the gate electrode can be prevented. Further, since the amorphous semiconductor film in which the surface is terminated by hydrogen is formed on the LPSAS film, oxidation of the LPSAS film can be prevented and mixing an etching residue generated in the formation step of the source and drain regions, into the LPSAS film can be prevented. Therefore, a thin film transistor in which electrical characteristics is good and the withstand voltage is good can be manufactured.

Further, the channel length of the thin film transistor can be reduced and the plane area of the thin film transistor can be reduced.

Next, using a resist mask formed using a fourth photomask over the insulating film 76, the insulating film 76 is partially etched to form a contact hole. A pixel electrode 77 which is in contact with the source or drain electrode 71c in the contact hole is provided. Note that FIG. 3C corresponds to a cross-sectional view taken along a dashed line A-B in FIG. 4.

As shown in FIG. 4, the end portions of the source and drain regions 72 are located outside those of the source and drain electrodes 71c. Further, the end portions of the buffer layer 73 are located outside those of the source and drain electrodes 71c and those of the source and drain regions 72. Furthermore, one of the source and drain electrodes surrounds the other of the source and drain electrodes (specifically, the former electrode has a U-shape or a C-shape). Therefore, the area of a region where carriers move can be increased; and thus the amount of current can be increased, and the area of the thin film transistor can be reduced. Further, roughness of the gate electrode has little influence because the LPSAS film and the source and drain electrodes overlap over the gate electrode, thereby suppressing reduction in coverage and generation of leakage current. Note that either one of the source electrode or the drain electrode also functions as a source wiring or a drain wiring.

The pixel electrode 77 can be formed of a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Further, the pixel electrode 77 can also be formed of a conductive composition including a conductive polymer. It is preferable that the sheet resistance be equal to or less than 10000 Ω/square and the light transmittance at a wavelength of 550 nm be equal to or more than 70% in the pixel electrode formed of the conductive composition. Further, it is preferable that the resistance of the conductive polymer included in the conductive composition be equal to or less than 0.1 Ω·cm.

As a conductive polymer, a so-called n-electron conjugated polymer can be used. As examples thereof, polyaniline or a derivative thereof, polypyrrole or a derivative thereof, polythiophene or a derivative thereof, a copolymer of two or more kinds of them, and the like can be given.

In this embodiment mode, the pixel electrode 77 is formed as follows: an indium tin oxide film is formed by a sputtering method, and then a resist is applied to the indium tin oxide film; then, the resist is exposed to light and developed using a fifth photomask, thereby forming a resist mask; and then, the indium tin oxide film is etched using the resist mask to form the pixel electrode 77.

Through the above, an element substrate which can be used for a display device can be formed.

Embodiment Mode 2

In this embodiment mode, a process which is partially different from that described in Embodiment Mode 1 will be described below. Since the process described in this embodiment mode is different from that described in Embodiment Mode 1 only partially, the same reference symbols are used for the same portions as FIGS. 1A to 1D in FIGS. 5A to 5E, and detailed description of the same steps will be omitted.

Figure 5A:
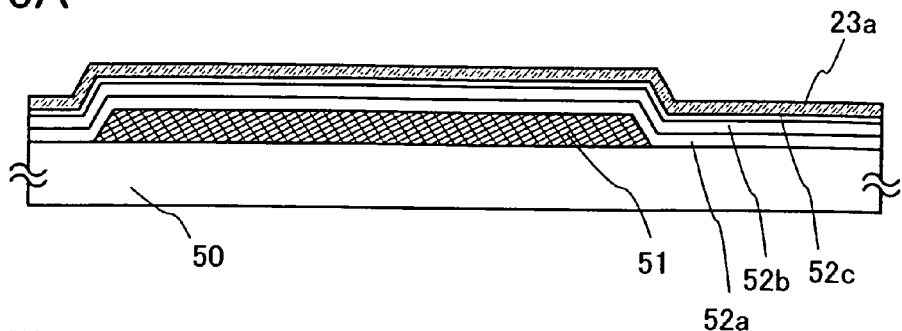
FIGS. 5A to 5E are cross-sectional views illustrating a manufacturing process of the present invention.

First, a state shown in FIG. 5A is obtained in a similar manner to Embodiment Mode 1. FIG. 5A is the same as FIG. 1A. The gate electrode 51 is formed over the substrate 50, and the gate insulating films 52a, 52b, and 52c and the microcrystalline semiconductor film 23a are formed in this order over the gate electrode 51.

Figure 5B:
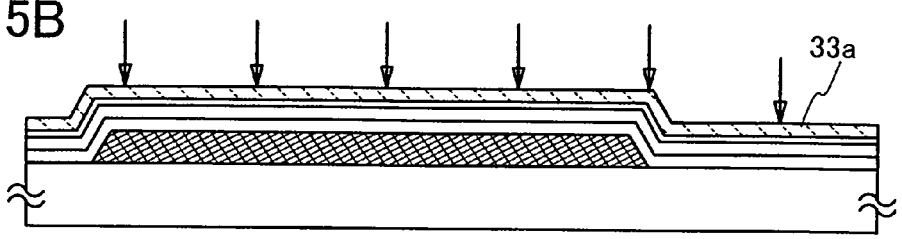

As shown in FIG. 5B, first LP treatment is performed on the microcrystalline semiconductor film to form an LPSAS film 33a. By improving the crystallinity of the microcrystalline semiconductor film in advance by performing LP treatment, totally changing the microcrystalline semiconductor film to an amorphous semiconductor film by ion implantation can be prevented.

Figure 5C:
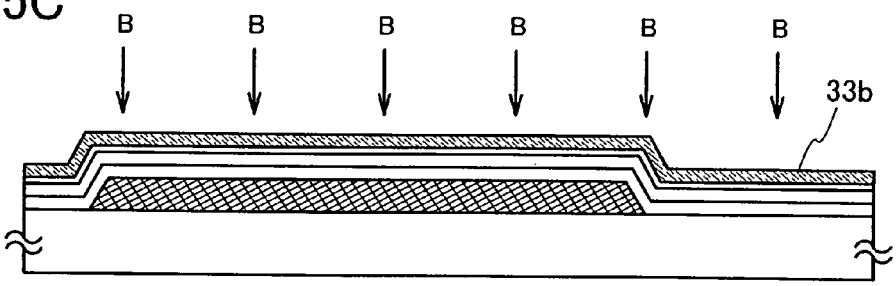

Next, as shown in FIG. 5C, a slight amount of boron is added into the LPSAS film 33a by an ion implantation method. By the ion implantation, the crystallinity of a microcrystalline semiconductor film 33b becomes lower than that of the LPSAS film 33a. Note that, if an oxide film is formed on the LPSAS film 33a by laser beam irradiation in the first LP treatment, it is preferable that the ion implantation be performed as it is and the oxide film be removed after the ion implantation. This oxide film can function as a surface protective film.

Figure 5D:
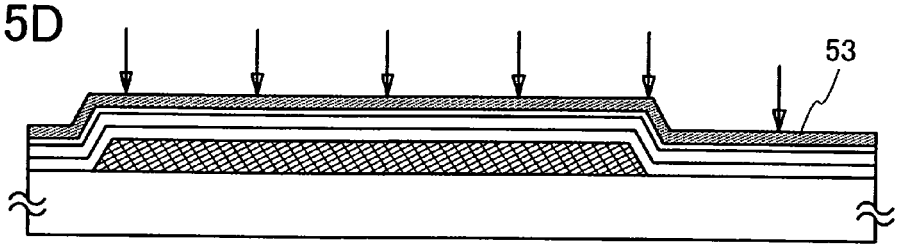

Next, as shown in FIG. 5D, second LP treatment is performed. By the second LP treatment, the crystallinity is improved and the boron in the film can be activated. Further, it is not necessary that respective conditions of the first LP treatment and the second LP treatment be the same. It is preferable that the surface of the microcrystalline semiconductor film 33b be cleaned before the second LP treatment.

Further, heat treatment may be performed instead of the second LP treatment. The temperature of this heat treatment is not particularly limited as long as it is lower than the temperature at which the microcrystalline semiconductor film is melted and is equal to or higher than the temperature at which the boron in the film is activated.

Figure 5E:
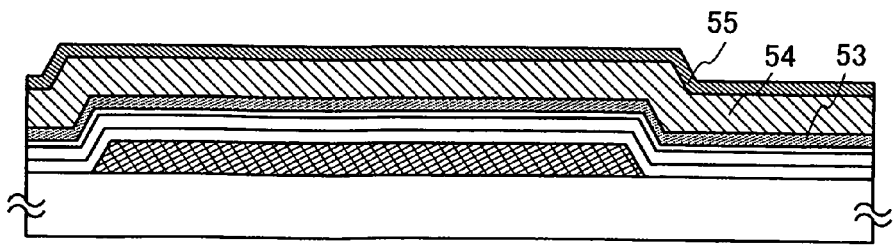

Next, as shown in FIG. 5E, the buffer layer 54 and the semiconductor film 55 added with the impurity which imparts one conductivity type are formed over the LPSAS film 53.

FIG. 5E is the same as FIG. 1D. It is preferable that an oxide film which is formed by the second LP treatment be removed before the buffer layer 54 is formed.

Although the number of steps is increased comparing with Embodiment Mode 1, an LPSAS film in which the crystallinity is further improved comparing with Embodiment Mode 1 can be obtained.

Steps that follow are the same as those in Embodiment Mode 1 and therefore omitted in this embodiment mode.

Further, this embodiment mode can be combined with Embodiment Mode 1 as appropriate.

Embodiment Mode 3

In this embodiment mode, a process which is partially different from that described in Embodiment Mode 1 will be described below. Since the process described in this embodiment mode is different from that described in Embodiment Mode 1 only partially, the same reference symbols are used for the same portions as FIGS. 1A to 1D in FIGS. 6A to 6C, and detailed description of the same steps will be omitted.

In this embodiment mode, a process in which a microcrystalline semiconductor film containing an impurity element which imparts p-type conductivity is formed by slightly adding the impurity element which imparts p-type conductivity at the same time for film formation and then LP treatment is performed will be described.

Figure 6A:
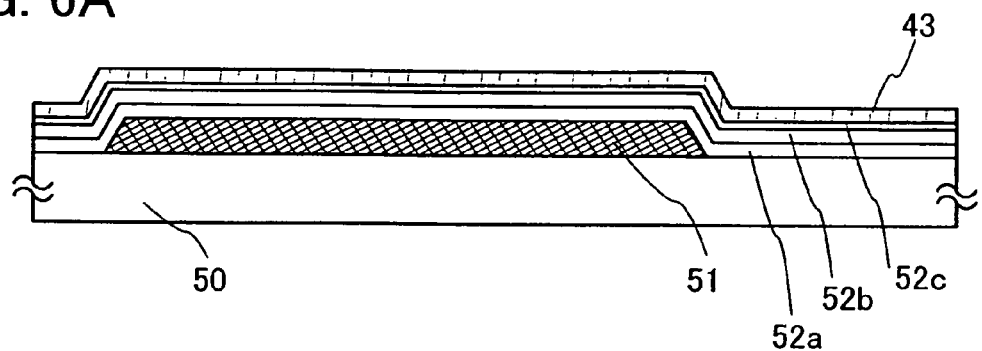
FIGS. 6A to 6C are cross-sectional views illustrating a manufacturing process of the present invention.

First, similarly to Embodiment Mode 1, the gate electrode 51 is formed over the substrate 50, and then, the gate insulating films 52a, 52b, and 52c are formed over the gate electrode 51. Then, as shown in FIG. 6A, a microcrystalline semiconductor film 43 in which an impurity element for control of the threshold value is contained purposely is formed.

The impurity element which imparts p-type conductivity is typically boron. It is preferable that an impurity gas such as $B_2H_6$ or $BF_3$ be contained at 1 to 1000 ppm, more preferably, 1 to 100 ppm, in silicon hydride. The concentration (SIMS measured concentration) of boron in the microcrystalline semiconductor film 43 is preferably, for example, $1 \times 10^{14}$ to $6 \times 10^{16}$ atoms/cm$^3$.

Figure 6B:
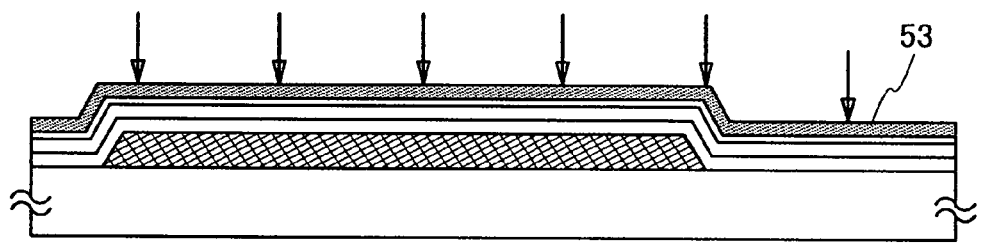

Next, in order to improve the crystallinity as compared to the microcrystalline semiconductor film 23a just after being formed, the microcrystalline semiconductor film is irradiated with a laser beam from the surface side. The laser beam irradiation is performed with energy at the amount by which the microcrystalline semiconductor film is not melted. By the laser beam irradiation, the LPSAS film 53 in which the crystallinity is improved can be formed as shown in FIG. 6B.

In the case where a microcrystalline semiconductor film is formed while containing a slight amount of boron and then LP treatment is performed after the film formation, there is no need of activating boron. Therefore, the LP treatment here may be performed in the condition by which the crystallinity is improved.

According to this embodiment mode in which a microcrystalline semiconductor film is formed while containing a slight amount of boron and then LP treatment is performed after the film formation, the number of steps is decreased. Therefore, the process described in this embodiment mode can be considered as a process suitable for mass production.

Further, if an ion implantation apparatus or an ion doping apparatus is used, there is fear of damaging a microcrystalline semiconductor film at the time of ion addition depending on the doping condition, and further, damaging a gate insulating film. In the case where a microcrystalline semiconductor film is formed while containing a slight amount of boron, a thin film transistor can be manufactured without doing such damage.

Figure 6C:
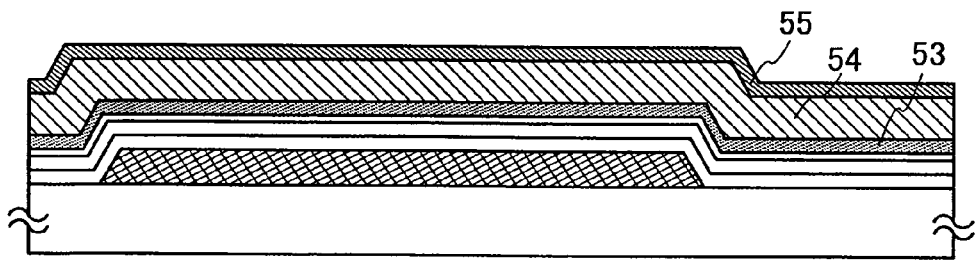

Next, as shown in FIG. 6C, the buffer layer 54 and the semiconductor film 55 added with an impurity which imparts one conductivity type are formed over the LPSAS film 53. FIG. 6C is the same as FIG. 1D. It is preferable that an oxide film which is formed by the LP treatment be removed before the buffer layer 54 is formed.

Steps that follow are the same as those in Embodiment Mode 1 and therefore omitted in this embodiment mode.

Further, this embodiment mode can be combined with Embodiment Mode 1 as appropriate.

Embodiment Mode 4

In this embodiment mode, a process which is partially different from that described in Embodiment Mode 1 will be described below. Since the process described in this embodiment mode is different from that described in Embodiment Mode 1 only partially, the same reference symbols are used for the same portions as FIGS. 1A to 1D in FIGS. 7A to 7C, and detailed description of the same steps will be omitted.

Figure 7A:
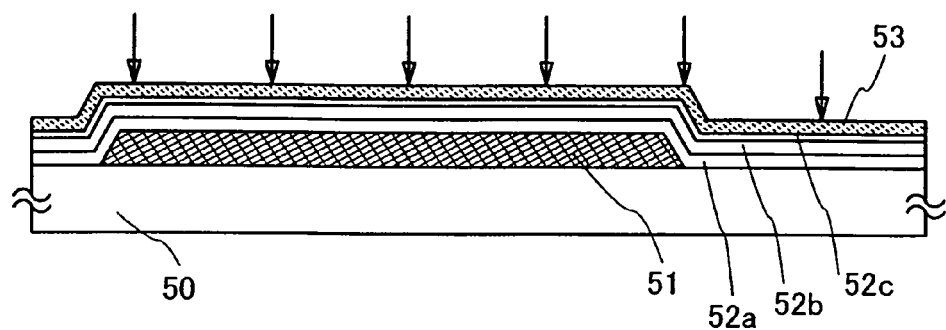
FIGS. 7A to 7C are cross-sectional views illustrating a manufacturing process of the present invention.

First, in a similar manner to Embodiment Mode 1, the state of FIG. 7A is obtained. FIG. 7A is the same as FIG. 1C. The gate electrode 51 is formed over the substrate 50, and then, the gate insulating films 52a, 52b, and 52c and the microcrystalline semiconductor film are formed in this order over the gate electrode 51. Then, in order to control the threshold value, an impurity element which imparts one conductivity type is purposely added into the microcrystalline semiconductor film by an ion implantation method. Next, in order to improve the crystallinity as compared to the microcrystalline semiconductor film just after being formed, the microcrystalline semiconductor film is irradiated with a laser beam from the surface side. By this LP treatment, the LPSAS film 53 is formed.

Figure 7B:
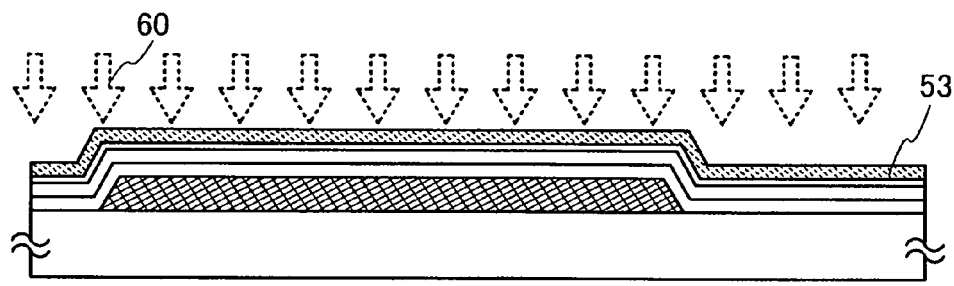

Next, as shown in FIG. 7B, the surface of the LPSAS film 53 is processed with hydrogen plasma, nitrogen plasma, or halogen plasma. If an oxide film is formed on the LPSAS film 53 by the laser beam irradiation, it is preferable that the oxide film be removed before a buffer layer is formed. In this embodiment mode, hydrogen plasma treatment is performed on the LPSAS film 53 after an oxide film on the LPSAS film 53 is removed. In order to make an interface with the buffer layer formed later clean, the hydrogen plasma, nitrogen plasma, or halogen plasma treatment is performed. Further, by performing the hydrogen plasma, nitrogen plasma, or halogen plasma treatment, the surface of the LPSAS film 53 can be made a surface on which formation of an oxide film is suppressed.

By preventing the formation of an oxide film on the LPSAS film 53, increase of a threshold voltage can be suppressed.

Figure 7C:
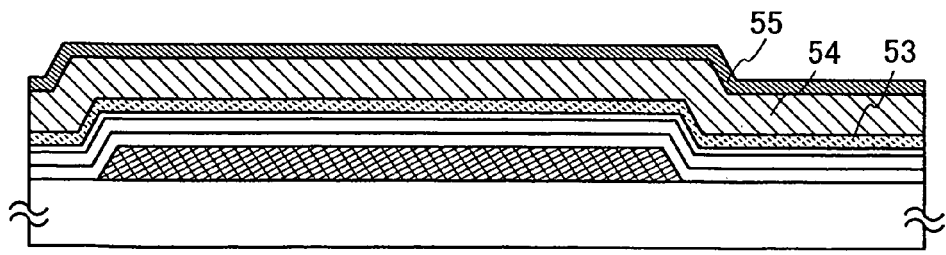

Next, as shown in FIG. 7C, the buffer layer 54 and the semiconductor film 55 added with the impurity which imparts one conductivity type are formed over the LPSAS film 53. FIG. 7C is the same as FIG. 1D.

Steps that follow are the same as those in Embodiment Mode 1 and therefore omitted in this embodiment mode.

Further, this embodiment mode can be combined with any one of Embodiment Modes 1 to 3 as appropriate.

Embodiment Mode 5

A manufacturing method of a thin film transistor, which is different from Embodiment Mode 1 will be described using FIGS. 8A to 8D, FIGS. 9A and 9B, FIGS. 10A to 10C, FIGS. 11A and 11B, and FIGS. 12A to 12C. In this embodiment mode, a process for manufacturing a thin film transistor, using a process capable of reducing the number of photomasks comparing with Embodiment Mode 1 will be described.

In a similar manner to FIG. 1A described in Embodiment Mode 1, a conductive film is formed over the substrate 50, a resist is applied over the conductive film, and the conductive film is partially etched using a resist mask formed by photolithography using a first photo mask, so that the gate electrode 51 is formed. Next, over the gate electrode 51, the gate insulating film 52a, 52b, and 52c and the microcrystalline film 23a are formed in this order.

Next, in a similar manner to FIG. 1B described in Embodiment Mode 1, a slight amount of boron is added by ion implantation in order to control the threshold value so that the microcrystalline semiconductor film 23b is formed.

Next, in a similar manner to FIG. 1C described in Embodiment Mode 1, laser beam irradiation is performed so that the LPSAS film 53 is formed. Next, in a similar manner to FIG. 1D described in Embodiment Mode 1, the buffer layer 54 and the semiconductor film 55 added with the impurity which imparts one conductivity type are formed in this order over the LPSAS film 53.

Figure 9A:
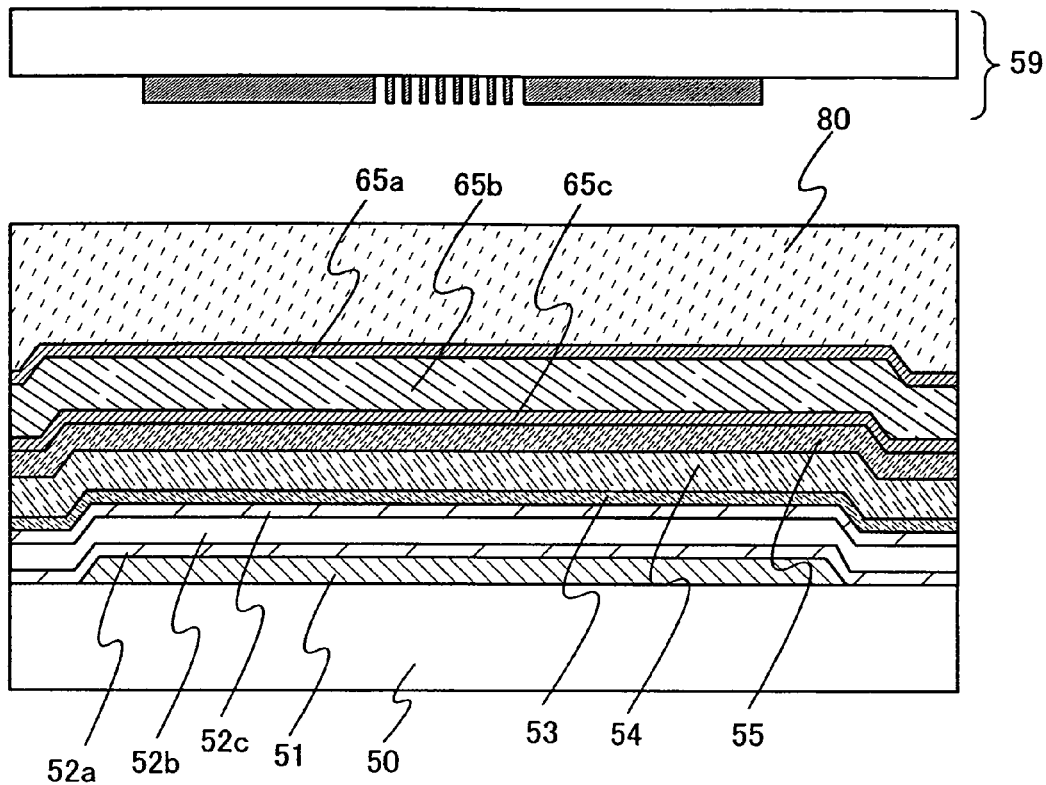
FIGS. 9A and 9B are cross-sectional views illustrating a manufacturing process of the present invention.

Next, conductive films 65a to 65c are formed over the semiconductor film 55 added with the impurity which imparts one conductivity type. Next, as shown in FIG. 9A, a resist 80 is applied over the conductive film 65a.

As the resist 80, a positive resist or a negative resist can be used. In this embodiment mode, a positive resist is used.

Next, a multi-tone mask 59 is used as a second photomask and the resist 80 is irradiated with light, thereby the resist 80 is exposed to light.

The exposure with the use of the multi-tone mask 59 will be described below using FIGS. 8A to 8D.

The multi-tone mask is a mask capable of performing exposure at three levels in an exposed portion, a halftone exposed portion, and an unexposed portion; a resist mask having regions having different thicknesses (typically, two kinds of thickness) can be formed by one exposure and development process. Therefore, the use of the multi-tone mask can reduce the number of photomasks.

Figure 8A:
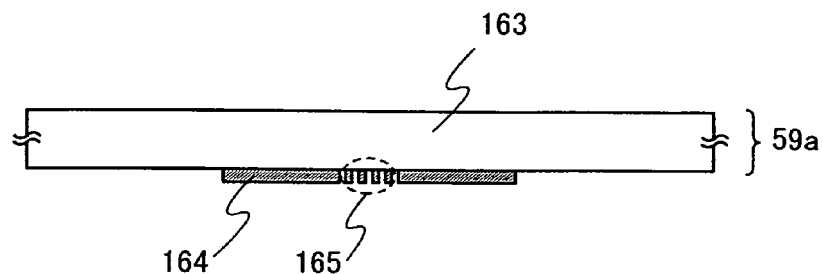
FIGS. 8A to 8D are diagrams each describing a multi-tone mask applicable to the present invention.
Figure 8B:
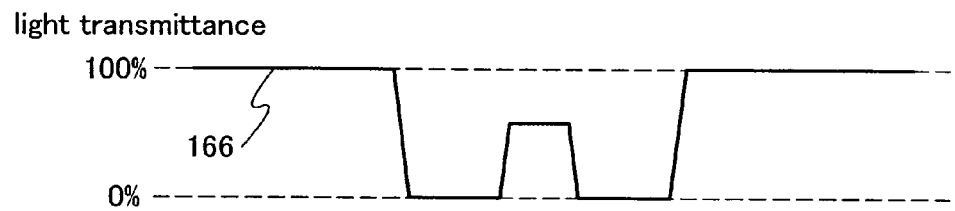
Figure 8C:
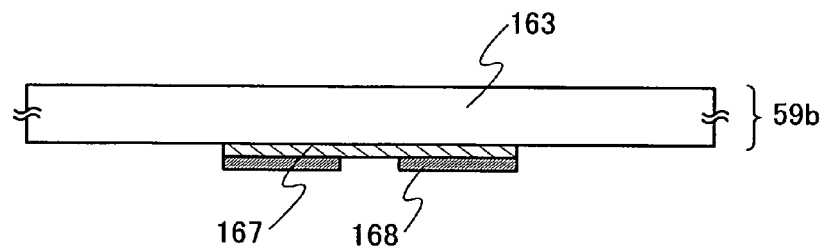

As typical examples of the multi-tone mask, a gray-tone mask 59a shown in FIG. 8A and a half-tone mask 59b shown in FIG. 8C are given.

As shown in FIG. 8A, the gray-tone mask 59a includes a light-transmitting substrate 163, and a light-shielding portion 164 and a diffraction grating 165 which are formed over the substrate 163. The light transmission in the light-shielding portion 164 is 0%. On the other hand, the light transmission of the diffraction grating 165 can be controlled by setting an interval between light-transmitting portions such as slits, dots, or meshes to an interval less than or equal to the limit of resolution of light used for the exposure. Note that a periodical slit, dot, or mesh or a nonperiodical slit, dot, or mesh can be used in the diffraction grating 165.

As the light-transmitting substrate 163, a light-transmitting substrate made of quartz or the like can be used. The light-shielding portion 164 and the diffraction grating 165 each can be formed of a light-shielding material by which light is absorbed, such as chromium or chromium oxide.

In the case where the gray-tone mask 59a is irradiated with exposure light, as shown in FIG. 8B, a light transmission 166 in the light-shielding portion 164 is 0% and the light transmission 166 in the other region where the light-shielding portion 164 and the diffraction grating 165 are not provided is 100%. Further, the light transmission in the diffraction grating 165 can be controlled within the range of 10 to 70%. The control of the light transmission in the diffraction grating 165 can be performed by adjusting the interval of a slit, dot, or mesh of the diffraction grating and the pitch thereof.

As shown in FIG. 8C, the half-tone mask 59b includes the light-transmitting substrate 163, and a half-light-transmitting portion 167 and a light-shielding portion 168 which are formed over the substrate 163. As the half-light-transmitting portion 167, MoSiN, MoSi, MoSiO, MoSiON, CrSi, or the like can be used. The light-shielding portion 168 can be formed of a light-shielding material by which light is absorbed, such as chromium or chromium oxide.

Figure 8D:
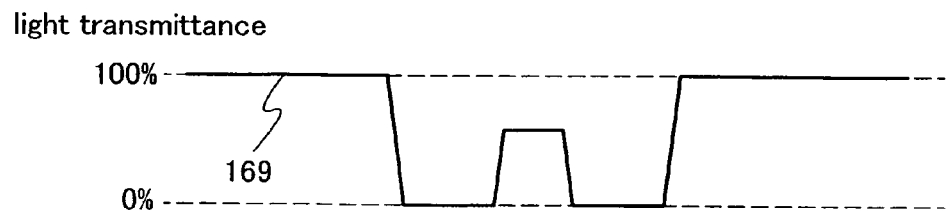

In the case where the half-tone mask 59b is irradiated with exposure light, as shown in FIG. 8D, a light transmission 169 in the light-shielding portion 168 is 0% and the light transmission 169 in the other region where the light-shielding portion 168 and the half-light-transmitting portion 167 are not provided is 100%. Further, the light transmission in the half-light-transmitting portion 167 can be controlled within the range of 10 to 70%. The control of the light transmission in the half-light-transmitting portion 167 can be performed by adjusting the material of the half-light-transmitting portion 167.

Figure 9B:
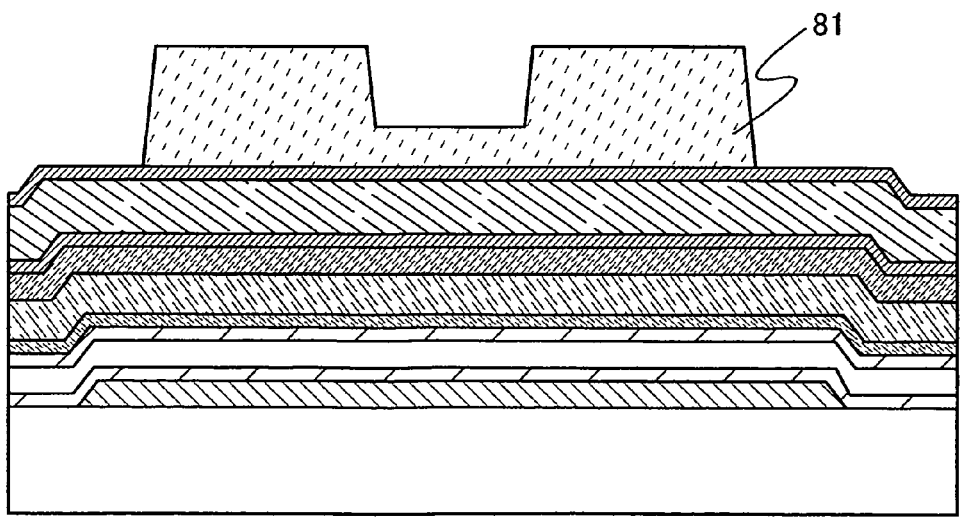

After the exposure using the multi-tone photomask, development is carried out, whereby a resist mask 81 having regions having different thicknesses can be formed as shown in FIG. 9B.

Next, with the resist mask 81, the LPSAS film 53, the buffer layer 54, the semiconductor film 55 added with the impurity which imparts one conductivity type, and the conductive films 65a to 65c are etched to be separated. As a result, an LPSAS film 61, a buffer layer 62, a semiconductor film 63 added with the impurity element which imparts one conductivity type, and conductive films 85a to 85c can be formed as shown in FIG. 10A. Note that FIG. 10A corresponds to a cross-sectional view taken along a line A-B in FIG. 12A (although a resist mask 86 is not shown).

Next, the resist mask 81 is ashed. As a result, the area and thickness of the resist mask are reduced. At this time, the resist mask in a region with a small thickness (a region overlapping with part of the gate electrode 51) is removed to form the separated resist mask 86 as shown in FIG. 10A.

Next, the conductive films 85a to 85c are etched to be separated using the resist mask 86. As a result, a pair of source and drain electrodes 92a to 92c can be formed as shown in FIG. 10B. When the conductive films 85a to 85c are wet-etched using the resist mask 86, the conductive films 85a to 85c are etched selectively. Thus, since the conductive films are isotropically-etched, source and drain electrodes 92a to 92c with a smaller area than the resist mask 86 can be formed.

Next, the semiconductor film 63 added with the impurity which imparts one conductivity type is etched using the resist mask 86 to form a pair of source and drain regions 88. In the etching step, part of the buffer layer 62 is also etched. The buffer layer after being etched partly is referred to as a buffer later 87. The buffer layer 87 has a recessed portion. The source and drain regions and the recessed portion (groove) in the buffer layer can be formed by the same step. Here, the buffer layer 87 is partly etched with use of the resist mask 86 having a smaller area than the resist mask 81, so that end portions of the buffer layer 87 are located beyond the source and drain regions 88. After that, the resist mask 86 is removed. End portions of the source and drain electrodes 92a to 92a are deviated from those of the source and drain regions 88, and the end portions of the source and drain regions 88 are located beyond those of the source and drain electrodes 92a to 92c.

Figure 12B:
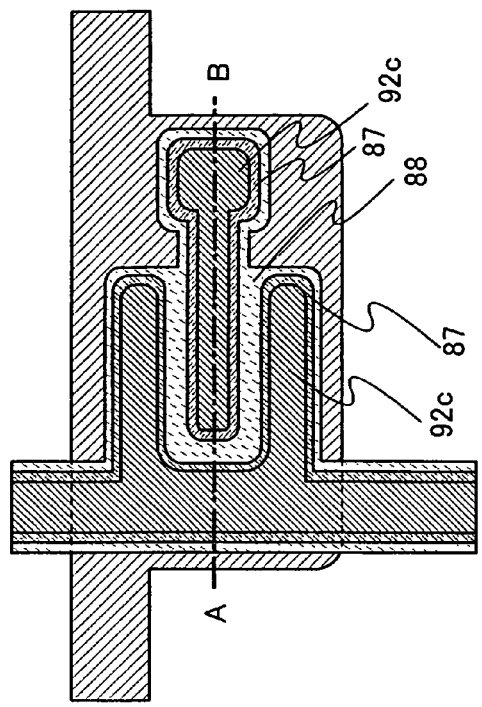
FIGS. 12A to 12C are top views illustrating a manufacturing process of the present invention.
Figure 12A:
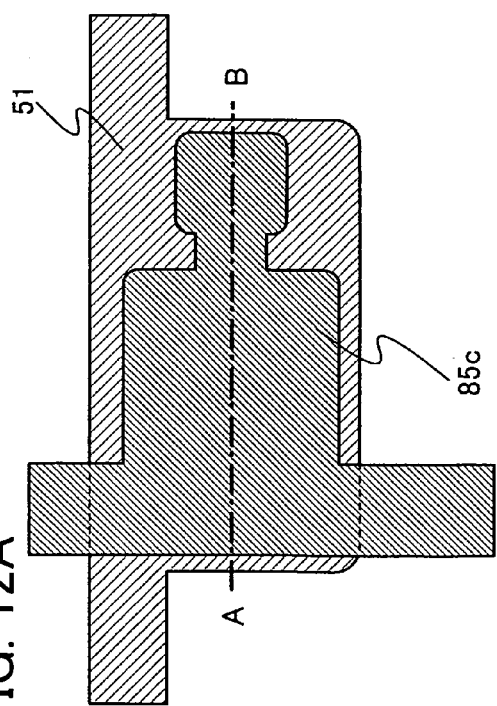
Figure 12C:
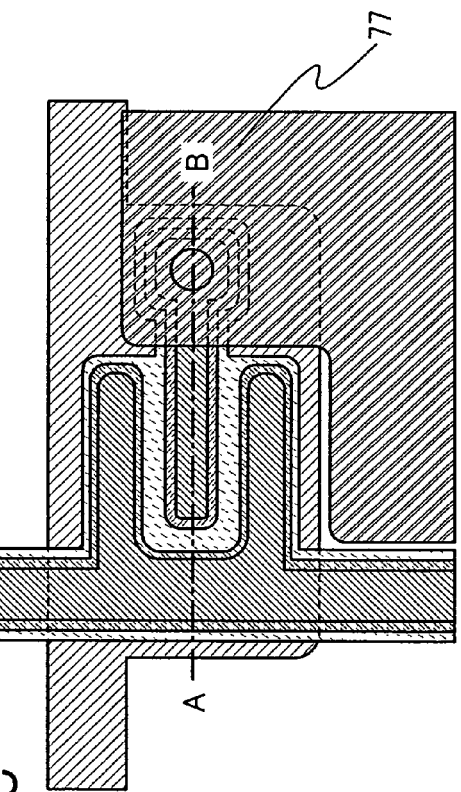

Note that FIG. 10C corresponds to a cross-sectional view taken along a line A-B in FIG. 12A. As shown in FIG. 12B, the end portions of the source and drain regions 88 are located beyond those of the source and drain electrodes 92c. Further, end portions of the buffer layer 87 are located beyond those of the source and drain electrodes 92c and those of the source and drain regions 88. Furthermore, one of the source and drain electrodes surrounds the other of the source and drain electrodes (specifically, the former electrode is in a U-shape or a C-shape). Therefore, the area of a region where carriers move can be increased; and thus the amount of current can be increased, and the area of a thin film transistor can be reduced. Further, roughness of the gate electrode has little influence because the microcrystalline semiconductor film and the source and drain electrodes overlap with each other over the gate electrode, thereby suppressing reduction in coverage and generation of leakage current. Note that either the source electrode or the drain electrode also functions as a source wiring or a drain wiring.

As shown in FIG. 10C, the end portions of the source and drain electrodes 92a to 92c are deviated from those of the source and drain regions 88, whereby the end portions of the source and drain electrodes 92a to 92c can be separated from each other; thus, leakage current or short circuiting between the source and drain electrodes can be prevented. In addition, an electric field is not concentrated on the end portions of the source and drain electrodes 92a to 92c and the source and drain regions 88; thus, leakage current between the gate electrode 51 and the source and drain electrodes 92a to 92c can be prevented. Accordingly, a thin film transistor with high reliability and high withstand voltage can be manufactured.

Through the above process, a channel-etched thin film transistor 83 can be formed. The thin film transistor can be formed using two photomasks.

Figure 11A:
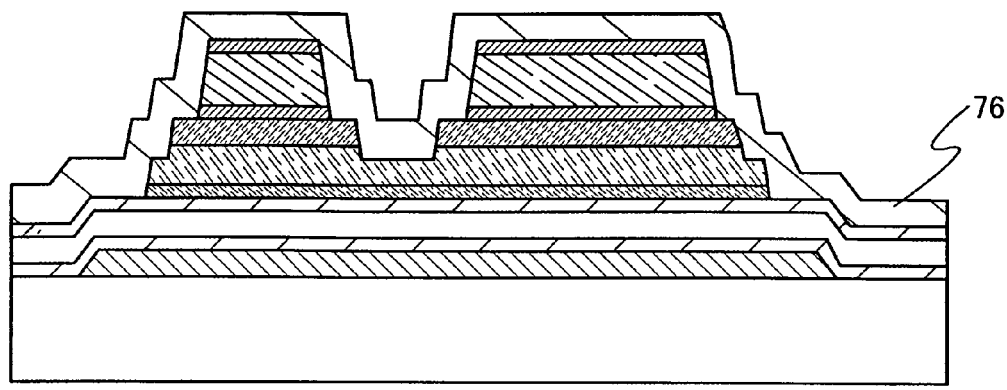
FIGS. 11A and 11B are cross-sectional views illustrating a manufacturing process of the present invention.
Figure 11B:
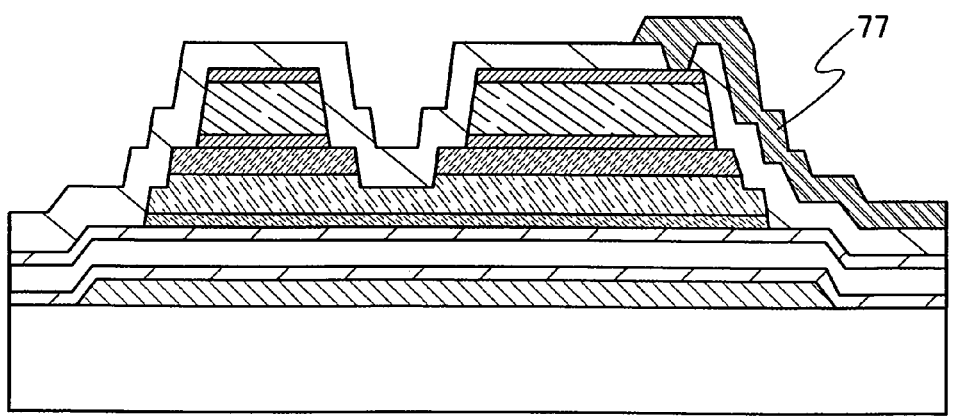

Next, as shown in FIG. 11A, the insulating film 76 is formed over the source and drain electrodes 92a to 92c, the source and drain regions 88, the buffer layer 87, the LPSAS film 61, and the gate insulating film 52c. The insulating film 76 can be formed in a similar manner to the gate insulating films 52a to 52c.

Next, a contact hole is formed in the insulating film 76 by partly etching the insulating film 76 using a resist mask formed using a third photomask. Then, a pixel electrode 77 that is in contact with the source or drain electrode 92c in the contact hole is formed. In this embodiment mode, the pixel electrode 77 is formed as follows: an indium tin oxide film is formed by a sputtering method, and then a resist is applied over the indium tin oxide film; then, the resist is exposed to light and developed using a fourth photomask, thereby forming a resist mask; and then, the indium tin oxide film is etched using the resist mask. Note that FIG. 11B corresponds to a cross-sectional view taken along a line A-B in FIG. 12C.

In this manner, an element substrate which can be used for a display device can be formed in which a multi-tone mask is used to reduce the number of masks.

Note that this embodiment mode can be combined with any one of Embodiment Modes 1 to 4 as appropriate.

Embodiment Mode 6

In this embodiment mode, a liquid crystal display device including a thin film transistor described in Embodiment Mode 1, as one mode of a display device will be described below.

First, a vertical alignment (VA) liquid crystal display device will be described. The VA liquid crystal display device employs a method for controlling alignment of liquid crystal molecules of a liquid crystal panel. In the VA liquid crystal display device, liquid crystal molecules are aligned in a vertical direction with respect to a panel surface when no voltage is applied. In this embodiment mode, in particular, a pixel is divided into some regions (subpixels), and molecules are aligned in different directions in their respective regions. This is referred to as multi-domain or multi-domain design. Hereinafter, a liquid crystal display device with multi-domain design will be described.

Figure 14:
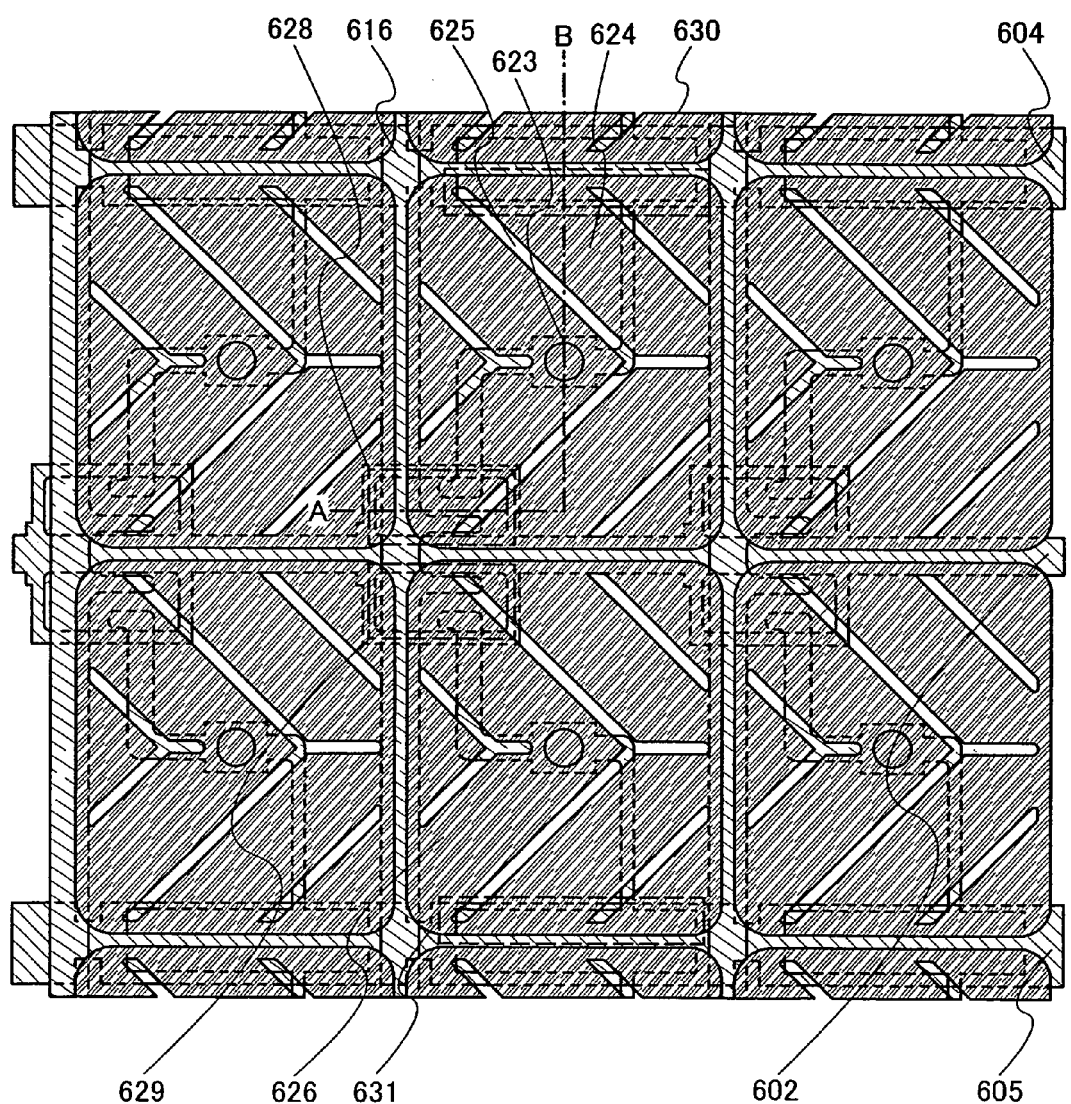
FIG. 14 is a view describing a liquid crystal display device of the present invention.
Figure 15:
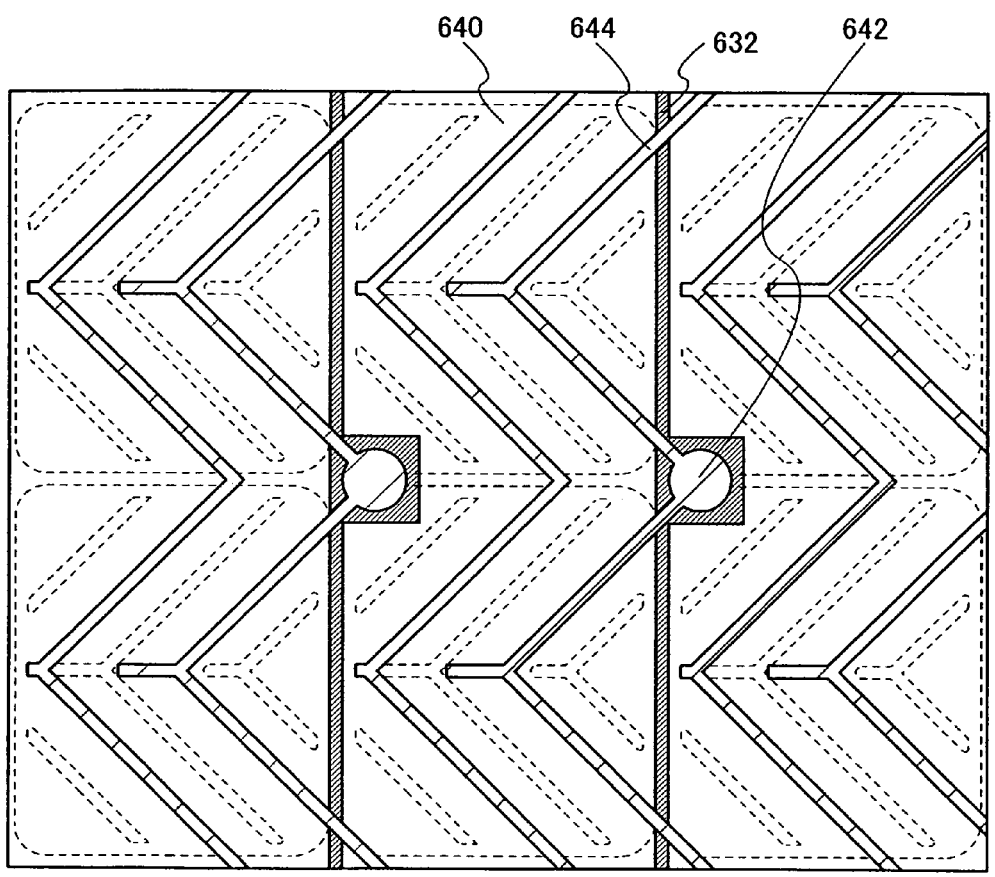
FIG. 15 is a view describing a liquid crystal display device of the present invention.

FIGS. 14 and 15 show a pixel electrode and a counter electrode, respectively. FIG. 14 is a plan view on a substrate side on which the pixel electrode is formed. FIG. 13 shows a cross-sectional structure taken along a line A-B in FIG. 14. FIG. 15 is a plan view on a substrate side on which the counter electrode is formed. Hereinafter, description will be made with reference to these drawings.

In FIG. 13, a substrate 600 provided with a TFT 628, a pixel electrode 624 connected to the TFT 628, and a holding capacitor portion 630 and a counter substrate 601 provided with a counter electrode 640 and the like are overlapped with each other, and liquid crystals are injected between both the substrates.

A light-shielding film 632, a first coloring film 634, a second coloring film 636, a third coloring film 638, and the counter electrode 640 are formed in a position where a spacer 642 is provided for the counter substrate 601. This structure makes the height of projections 644 for controlling alignment of liquid crystals different from that of the spacer 642. An alignment film 648 is formed over the pixel electrode 624, and the counter electrode 640 is similarly provided with an alignment film 646. A liquid crystal layer 650 is formed between the alignment films 646 and 648.

Although a columnar spacer is used as the spacer 642 in this embodiment mode, bead spacers may be dispersed instead. Further, the spacer 642 may be formed over the pixel electrode 624 formed over the substrate 600.

The TFT 628, the pixel electrode 624 connected to the TFT 628, and the holding capacitor portion 630 are formed over the substrate 600. The pixel electrode 624 is connected to a wiring 618 in a contact hole 623 that passes through an insulating film 620 covering the TFT 628, the wiring 618, and the holding capacitor portion 630, and a third insulating film 622 covering the insulating film 620. The thin film transistor described in Embodiment Mode 1 can be used as appropriate for the TFT 628. Further, the holding capacitor portion 630 includes a first capacitor wiring 604 that is formed in a similar manner to a gate wiring 602 of the TFT 628; a gate insulating film 606; and a second capacitor wiring 617 that is formed in a similar manner to a wiring 616 and the wiring 618.

The pixel electrode 624, the liquid crystal layer 650, and the counter electrode 640 overlap with each other to form a liquid crystal element.

FIG. 14 illustrates a structure over the substrate 600. The pixel electrode 624 is formed of a material described in Embodiment Mode 1. Slits 625 are formed in the pixel electrode 624. The slits 625 are formed to control alignment of liquid crystals.

A TFT 629, a pixel electrode 626 connected to the TFT 629, and a holding capacitor portion 631, which are shown in FIG. 14, can be formed in a similar manner to the TFT 628, the pixel electrode 624, and the holding capacitor portion 630, respectively. Both the TFTs 628 and 629 are connected to the wiring 616. A pixel of this liquid crystal panel includes the pixel electrodes 624 and 626. The pixel electrodes 624 and 626 each are subpixels.

FIG. 15 illustrates a structure on the counter substrate side. The counter electrode 640 is formed over the light-shielding film 632. It is preferable that the counter electrode 640 be formed of the same material as the pixel electrode 624. The projections 644 that control alignment of liquid crystals are formed over the counter electrode 640. Further, the spacer 642 is formed in accordance with the position of the light-shielding film 632.

Figure 16:
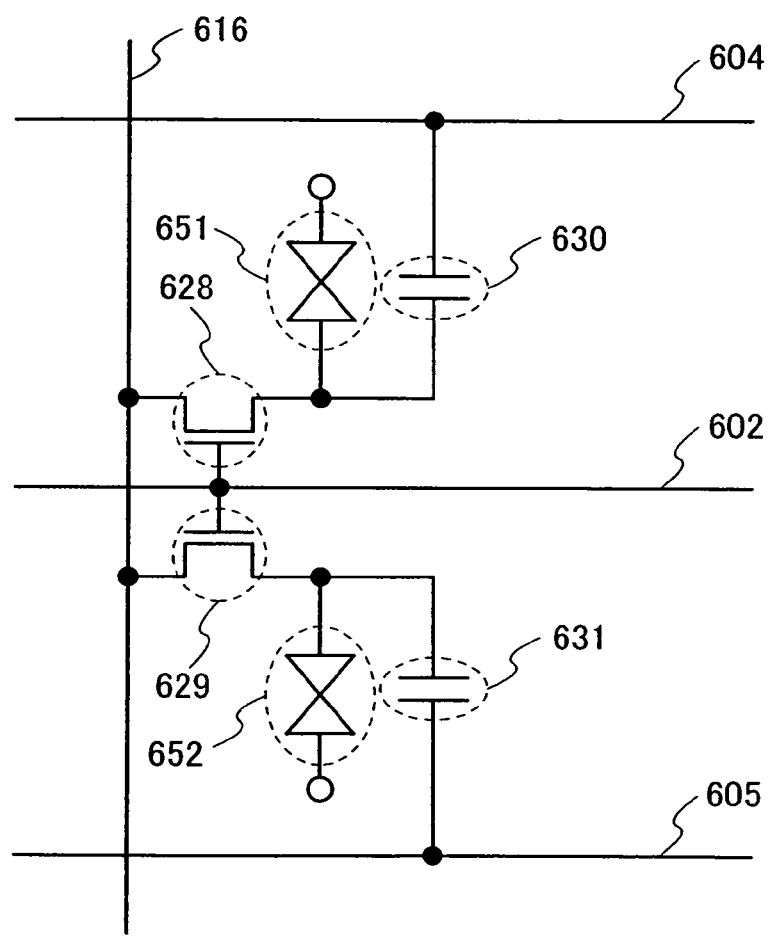
FIG. 16 is a diagram describing a liquid crystal display device of the present invention.

FIG. 16 shows an equivalent circuit of this pixel configuration. Both the TFTs 628 and 629 are connected to the gate wiring 602 and the wiring 616. In this case, when the potential of the first capacitor wiring 604 is different from that of a capacitor wiring 605, operation of a liquid crystal element 651 can be different from that of a liquid crystal element 652. That is, potentials of the first capacitor wirings 604 and 605 are controlled individually so that alignment of liquid crystals is precisely controlled to increase a viewing angle.

When a voltage is applied to the pixel electrode 624 provided with the slits 625, a distorted electric field (an oblique electric field) is generated in the vicinity of the slits 625. The slits 625 and the projections 644 on the counter substrate 601 side are disposed in a staggered form, thereby effectively generating the oblique electric field to control alignment of liquid crystals, and thus the direction in which liquid crystals are aligned is different depending on the location. That is, the viewing angle of a liquid crystal panel is increased by employing multi-domain.

Next, a different VA liquid crystal display device from the above will be described with reference to FIGS. 17 to 20.

Figure 17:
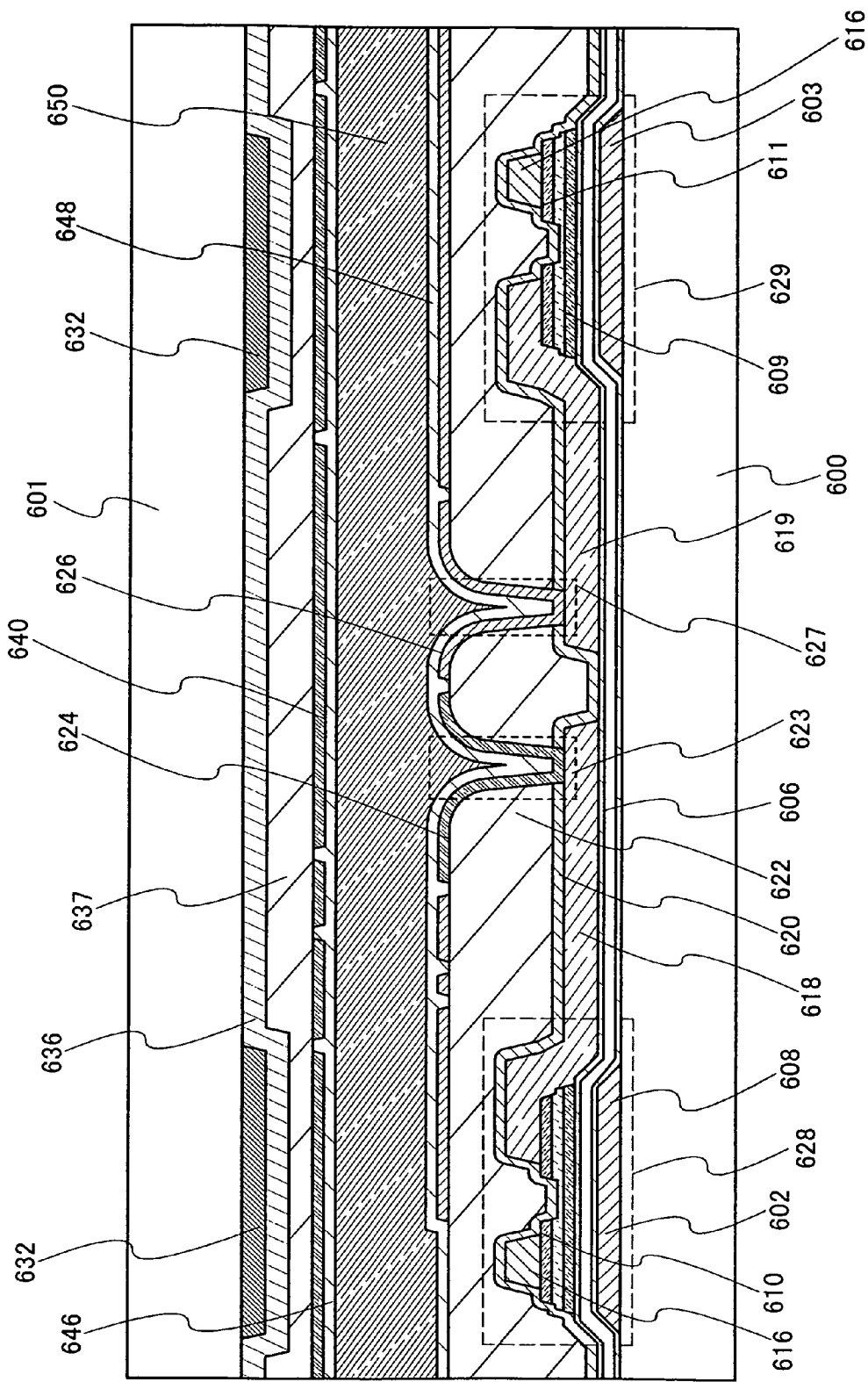
FIG. 17 is a view describing a liquid crystal display device of the present invention.
Figure 18:
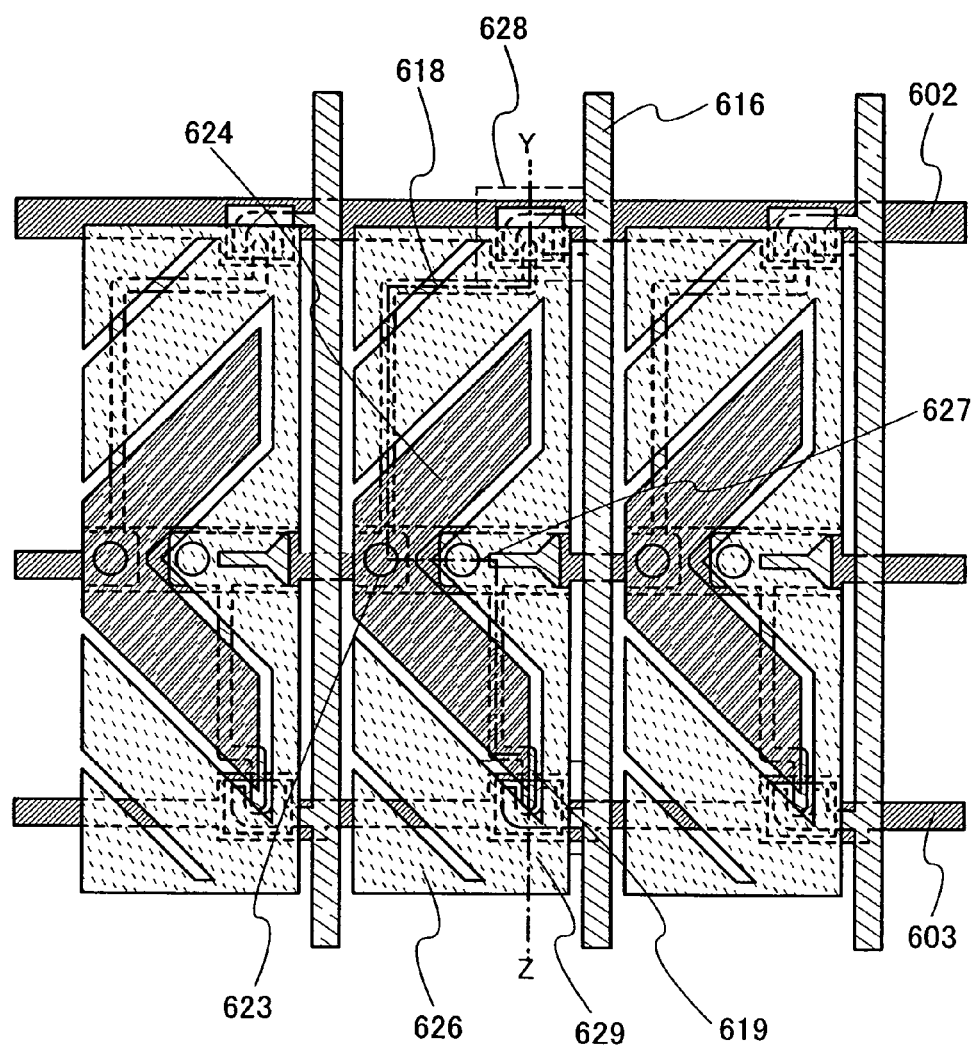
FIG. 18 is a view describing a liquid crystal display device of the present invention.

FIGS. 17 and 18 show a pixel structure of a VA liquid crystal panel. FIG. 18 is a plane view over the substrate 600. FIG. 17 shows a cross-sectional structure taken along a line Z-Y in FIG. 18. The following description will be made with reference to both the drawings.

In this pixel structure, one pixel has a plurality of pixel electrodes, and a TFT is connected to each pixel electrode. Each TFT is driven with a different gate signal from each other. That is, in the pixel with multi-domain design, a signal applied to each pixel electrode is controlled independently.

The pixel electrode 624 is connected to the TFT 628 through the wiring 618 in the contact hole 623. Further, the pixel electrode 626 is connected to the TFT 629 through the wiring 619 in the contact hole 627. The gate wiring 602 of the TFT 628 is separated from a gate wiring 603 of the TFT 629 so that different gate signals can be supplied. On the other hand, the wiring 616 that serves as a data line is shared by the TFTs 628 and 629. The thin film transistor described in Embodiment Mode 1 can be used as appropriate for each of the TFTs 628 and 629.

Figure 20:
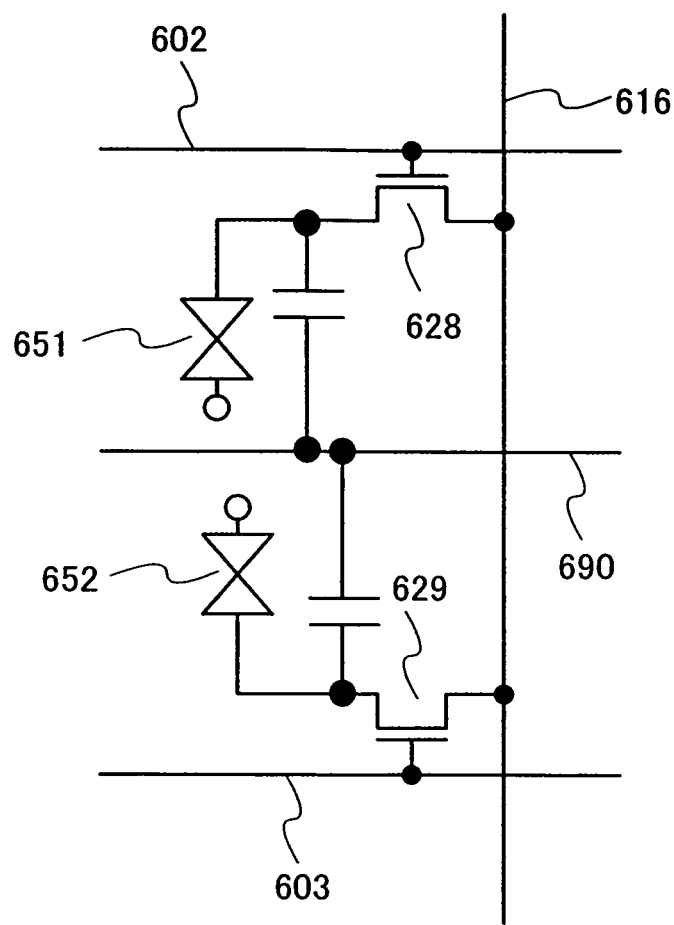
FIG. 20 is a diagram describing a liquid crystal display device of the present invention.

The shape of the pixel electrode 624 is different from that of the pixel electrode 626, and the pixel electrodes are separated by the slits 625. The pixel electrode 626 surrounds the pixel electrode 624, which has a V-shape. The TFTs 628 and 629 make the timing of applying voltages to the pixel electrodes 624 and 626 different from each other, thereby controlling alignment of liquid crystals. FIG. 20 shows an equivalent circuit of this pixel configuration. The TFT 628 is connected to the gate wiring 602, and the TFT 629 is connected to the gate wiring 603. When different gate signals are supplied to the gate wirings 602 and 603, operation timing of the TFTs 628 and 629 can be different.

Figure 19:
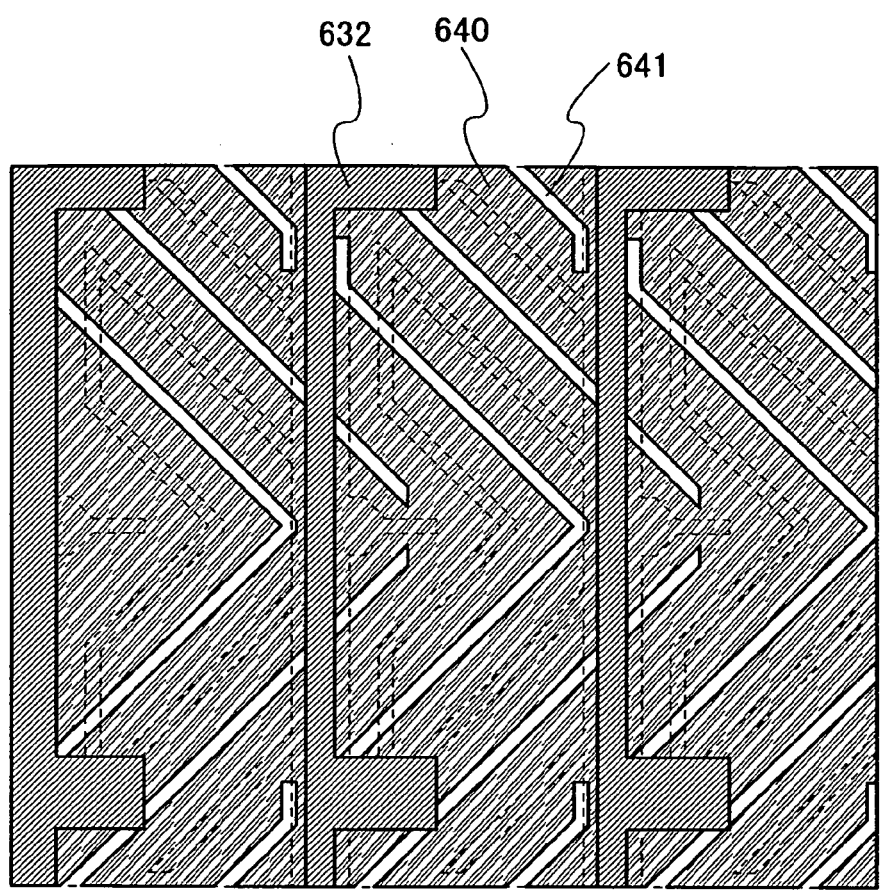
FIG. 19 is a view describing a liquid crystal display device of the present invention.

The counter substrate 601 is provided with the light-shielding film 632, the second coloring layer 636, and the counter electrode 640. In addition, a planarizing film 637 is formed between the second coloring film 636 and the counter electrode 640, thereby preventing alignment disorder of liquid crystals. FIG. 19 shows a structure of the counter substrate side. The counter electrode 640 is shared by plural pixels, and slits 641 are formed in the counter electrode 640. The slits 641 and the slits 625 on the pixel electrodes 624 and 625 side are disposed in a staggered form, thereby effectively generating an oblique electric field to control alignment of liquid crystals. Accordingly, the direction in which liquid crystals are aligned is different depending on the location, and thus a viewing angle of the liquid crystal panel is increased.

The pixel electrode 624, the liquid crystal layer 650, and the counter electrode 640 overlap with each other to form a first liquid crystal element. Further, the pixel electrode 626, the liquid crystal layer 650, and the counter electrode 640 overlap with each other to form a second liquid crystal element. Furthermore, the multi-domain structure is employed in which the first liquid crystal element and the second liquid crystal element are provided for one pixel.

Next, a liquid crystal display device in a horizontal electric field mode will be described. In the horizontal field effect mode, an electric field is applied in a horizontal direction with respect to liquid crystal molecules in a cell, whereby liquid crystals are driven to express gray scales. In accordance with this method, the viewing angle can be expanded to about 180°. Hereinafter, a liquid crystal display device in a horizontal electric field mode will be described.

Figure 21:
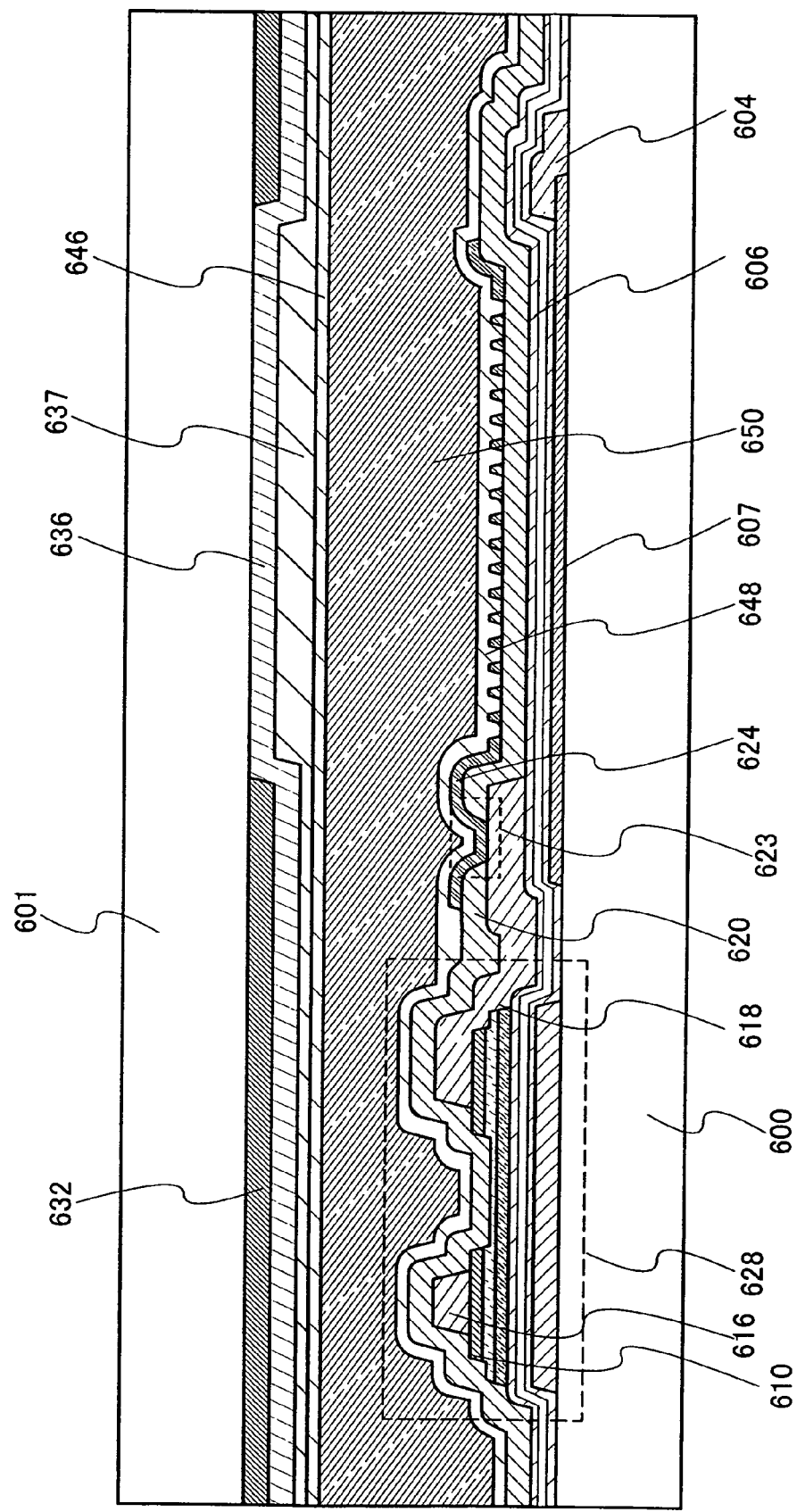
FIG. 21 is a view describing a liquid crystal display device of the present invention.

In FIG. 21, the substrate 600 over which the TFT 628 and the pixel electrode 624 connected to the TFT 628 are formed overlaps with the counter substrate 601, and liquid crystals are injected therebetween. The counter substrate 601 is provided with the light-shielding film 632, the second coloring film 636, the planarizing film 637, and the like. The pixel electrode is provided for the substrate 600, and not for the counter substrate 601. The liquid crystal layer 650 is formed between the substrate 600 and the counter substrate 601.

A first pixel electrode 607, a capacitor wiring 604 connected to the first pixel electrode 607, and the TFT 628 described in Embodiment Mode 1 are formed over the substrate 600. The first pixel electrode 607 can be formed of a similar material to the pixel electrode 77 described in Embodiment Mode 1. The first pixel electrode 607 is divided almost in a pixel form. The gate insulating film 606 is formed over the first pixel electrode 607 and the capacitor wiring 604.

The wirings 616 and 618 of the TFT 628 are formed over the gate insulating film 606. The wiring 616 is a data line through which a video signal is sent, extends in one direction in a liquid crystal panel, is connected to a source region 610, and functions as a source or drain electrode. The wiring 618 functions as the other of the source or drain electrode and is connected to the second pixel electrode 624.

The second insulating film 620 is formed over the wirings 616 and 618. Further, the second pixel electrode 624 that is connected to the wiring 618 in a contact hole formed in the insulating film 620 is formed over the insulating film 620. The pixel electrode 624 is formed of a similar material to the pixel electrode 77 described in Embodiment Mode 1.

In this manner, the TFT 628 and the first pixel electrode 624 connected to the TFT 628 are formed over the substrate 600. Note that a holding capacitor is formed between the first pixel electrode 607 and the second pixel electrode 624.

Figure 22:
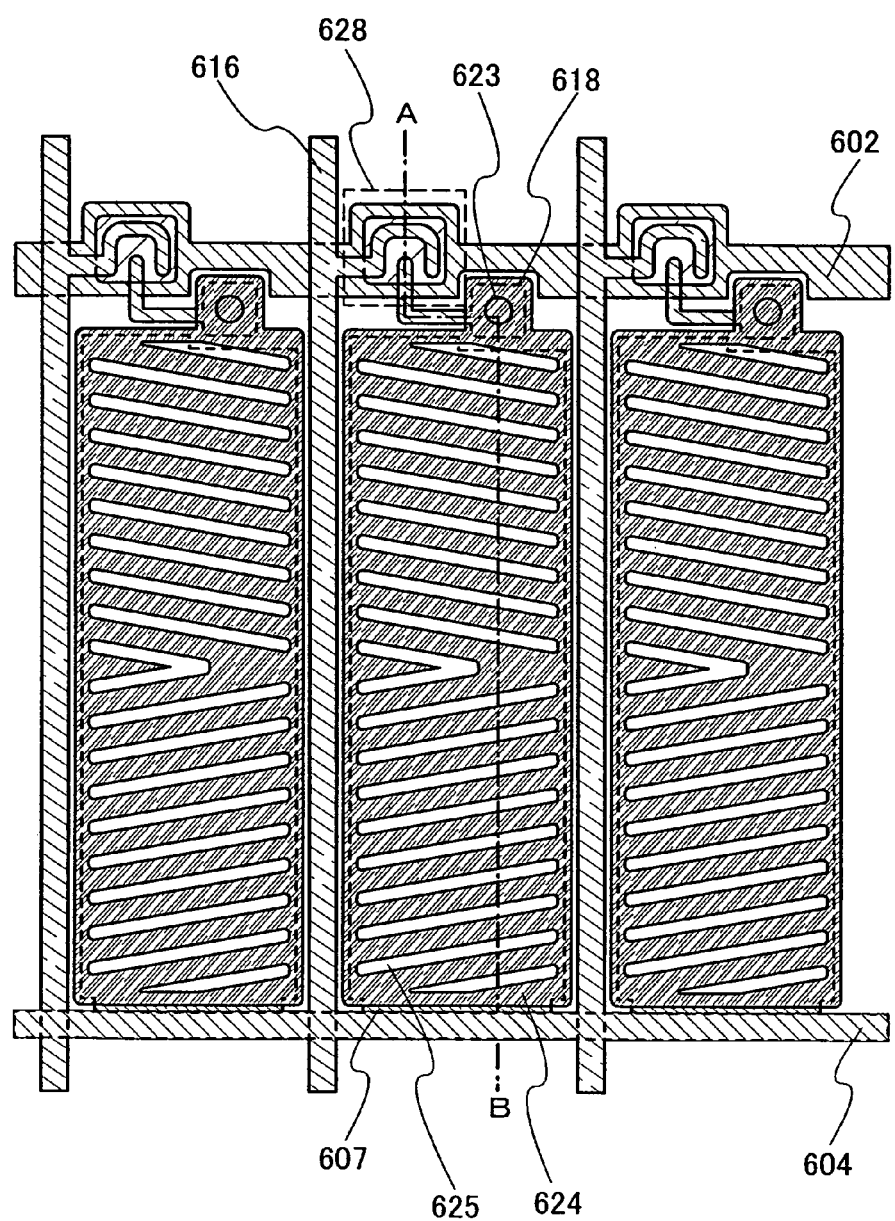
FIG. 22 is a view describing a liquid crystal display device of the present invention.

FIG. 22 is a plan view illustrating a structure of the pixel electrode. The pixel electrode 624 is provided with the slits 625. The slits 625 are provided to control alignment of liquid crystals. In this case, an electric field is generated between the first pixel electrode 607 and the second pixel electrode 624. The gate insulating film 606 is formed between the first pixel electrode 607 and the second pixel electrode 624; however, the gate insulating film 606 is formed with a thickness of 50 to 200 nm, which is thin enough as compared with a liquid crystal layer with a thickness of 2 to 10 μm. Therefore, an electric field is generated in a direction which is substantially parallel to the substrate 600 (a horizontal direction). The alignment of liquid crystals is controlled by this electric field. Liquid crystal molecules are horizontally rotated with use of the electric field in the direction almost parallel to the substrate. In this case, since the liquid crystal molecules are horizontally aligned in any state, the angle has little influence on the contrast or the like; thus, the viewing angle is increased. In addition, the aperture ratio can be improved since both the first pixel electrode 607 and the second pixel electrode 624 are light-transmitting electrodes.

Next, another example of a liquid crystal display device in a horizontal electric field mode will be described.

Figure 23:
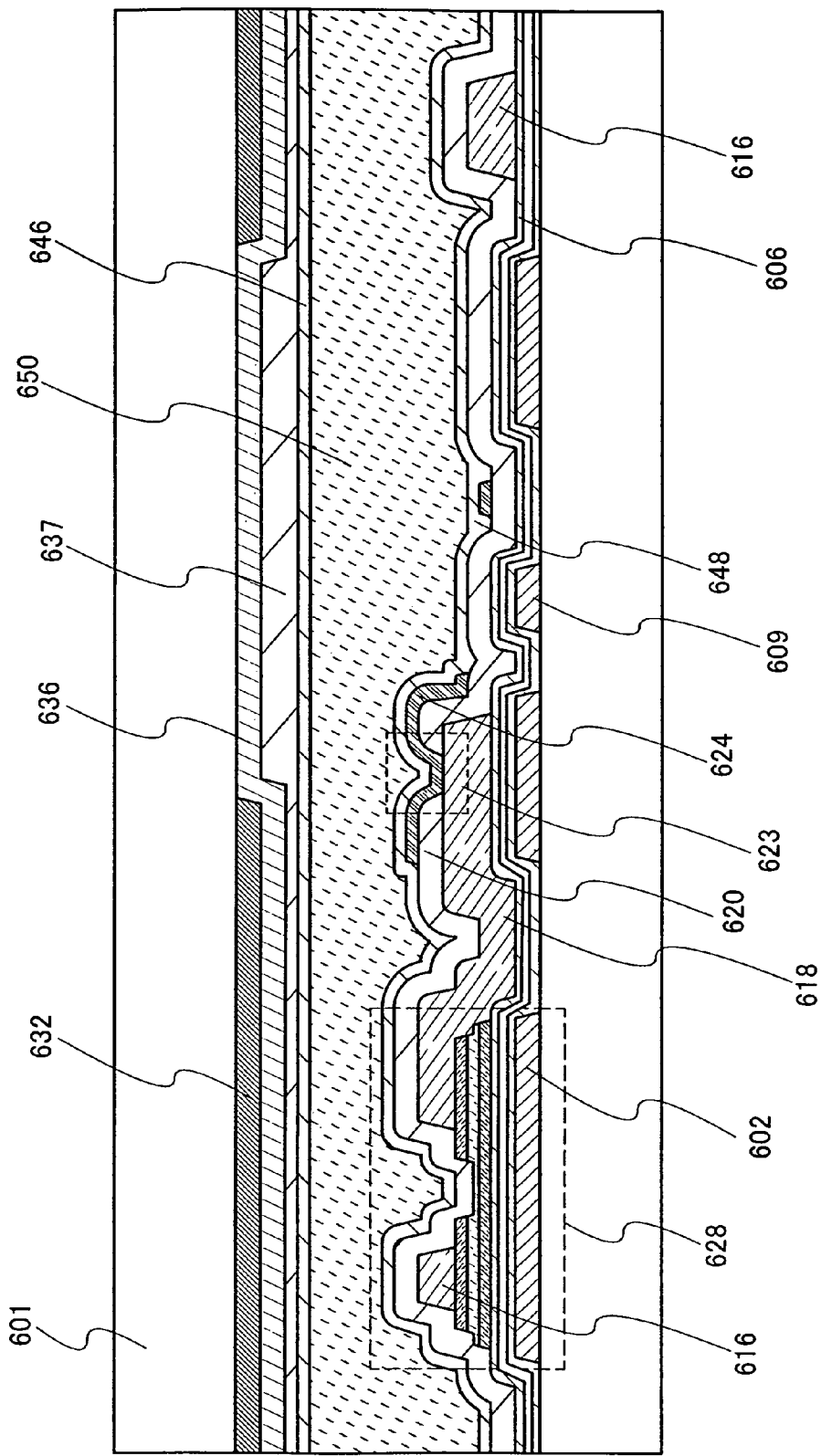
FIG. 23 is a view describing a liquid crystal display device of the present invention.
Figure 24:
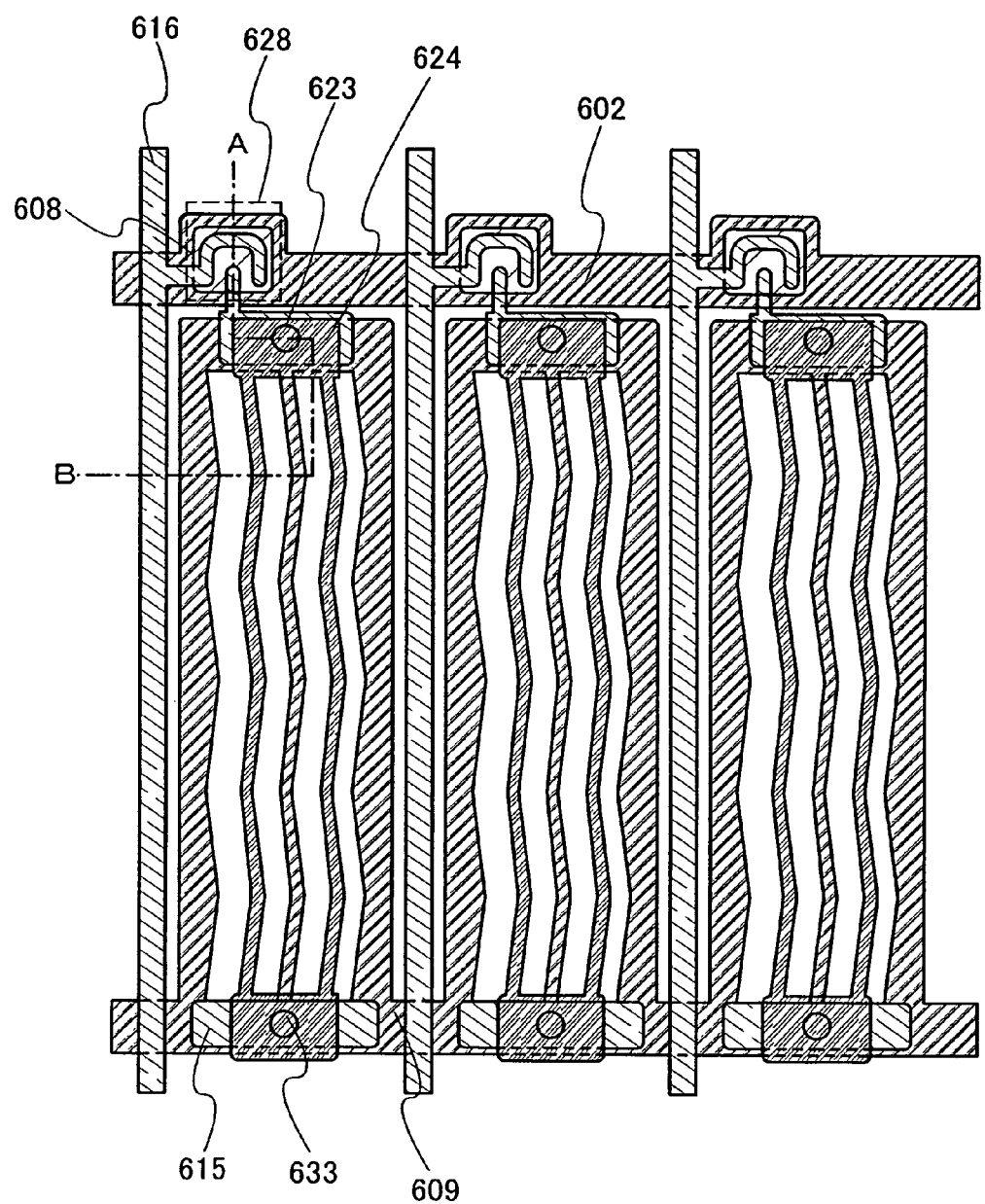
FIG. 24 is a view describing a liquid crystal display device of the present invention.

FIGS. 23 and 24 illustrate a pixel structure of a liquid crystal display device in an IPS mode. FIG. 24 is a plan view, and FIG. 23 shows a cross-sectional structure taken along a line A-B in FIG. 24. The following description will be made with reference to both the diagrams.

In FIG. 23, the substrate 600 over which the TFT 628 and the pixel electrode 624 connected to the TFT 628 are formed overlaps with the counter substrate 601, and liquid crystals are injected between the substrate 600 and the counter substrate 601. The counter substrate 601 is provided with the light-shielding film 632, the second coloring film 636, the planarizing film 637, and the like. The pixel electrode is provided for the substrate 600, and not for the counter substrate 601. The liquid crystal layer 650 is formed between the substrate 600 and the counter substrate 601.

A common potential line 609 and the TFT 628 described in Embodiment Mode 1 are formed over the substrate 600. The common potential line 609 can be formed at the same time as the gate wiring 602 of the TFT 628. The first pixel electrode 607 is divided almost in a pixel form.

The wirings 616 and 618 of the TFT 628 are formed over the gate insulating film 606. The wiring 616 is a data line through which a video signal is sent, extends in one direction in a liquid crystal panel, is connected to the source region 610, and functions as a source or drain electrode. The wiring 618 functions as the other of the source or drain electrode and is connected to the second pixel electrode 624.

The second insulating film 620 is formed over the wirings 616 and 618. Further, the second pixel electrode 624 that is connected to the wiring 618 in the contact hole 623 formed in the insulating film 620 is formed over the insulating film 620. The pixel electrode 624 is formed of a similar material to the pixel electrode 77 described in Embodiment Mode 1. Note that, as shown in FIG. 24, the pixel electrode 624 is formed such that the pixel electrode 624 and a comb-like electrode that is formed at the same time as the common potential line 609 can generate a horizontal electric field. Further, a comb-like portion of the pixel electrode 624 and the comb-like electrode that is formed at the same time as the common potential line 609 are staggered.

When an electric field is generated between the potential applied to the pixel electrode 624 and that of the common potential line 609, the alignment of liquid crystals is controlled by this electric field. Liquid crystal molecules are horizontally rotated with use of the electric field in the direction almost parallel to the substrate. In this case, since the liquid crystal molecules are horizontally aligned in any state, the angle has little influence on the contrast or the like; thus, the viewing angle is increased.

In this manner, the TFT 628 and the pixel electrode 624 connected to the TFT 628 are formed over the substrate 600. A holding capacitor is formed by provision of the gate insulating film 606 between the common potential line 609 and a capacitor electrode 615. The capacitor electrode 615 is connected to the pixel electrode 624 through a contact hole 633.

Next, a mode of a liquid crystal display device in a TN mode will be described.

Figure 25:
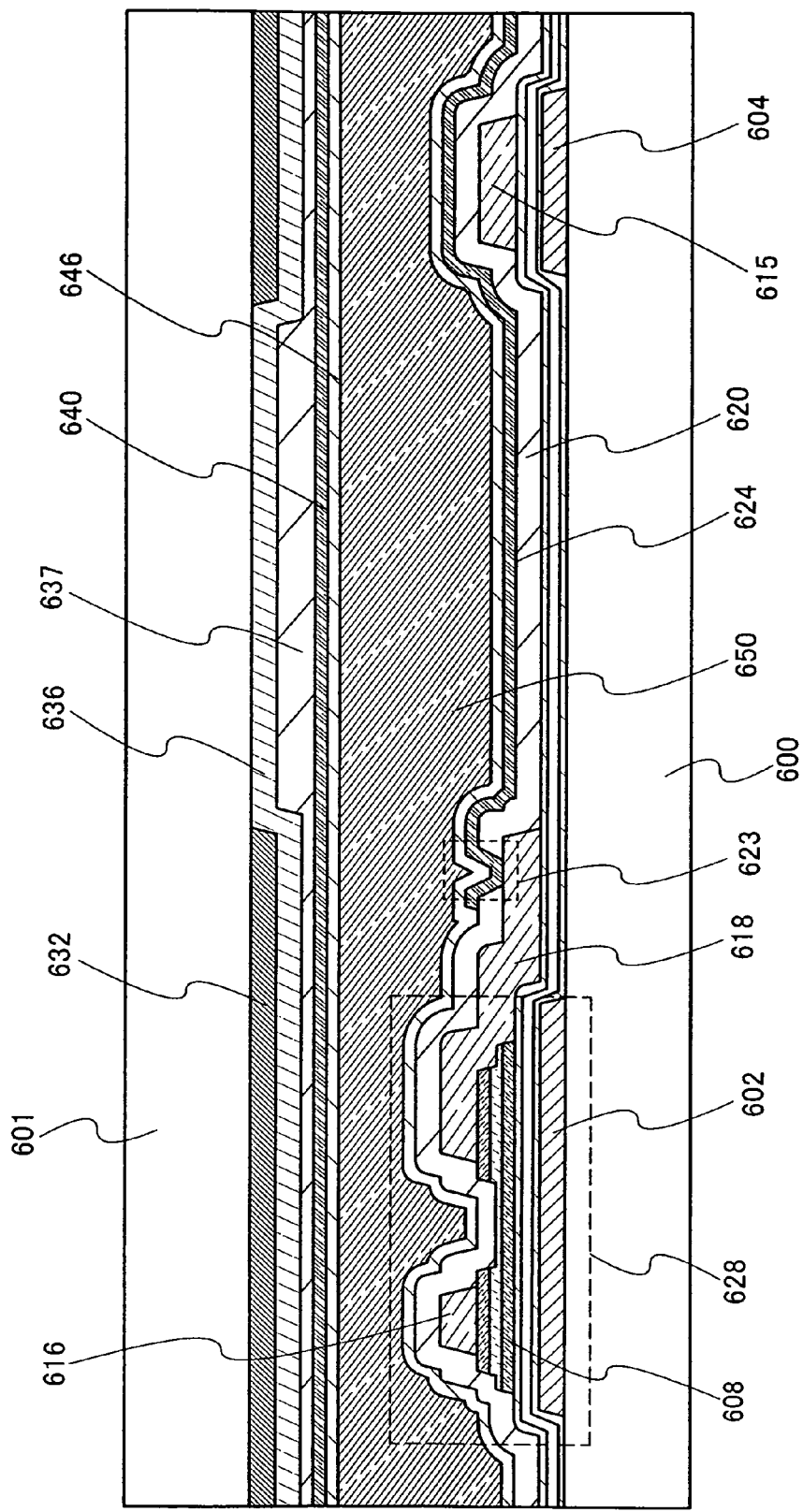
FIG. 25 is a view describing a liquid crystal display device of the present invention.
Figure 26:
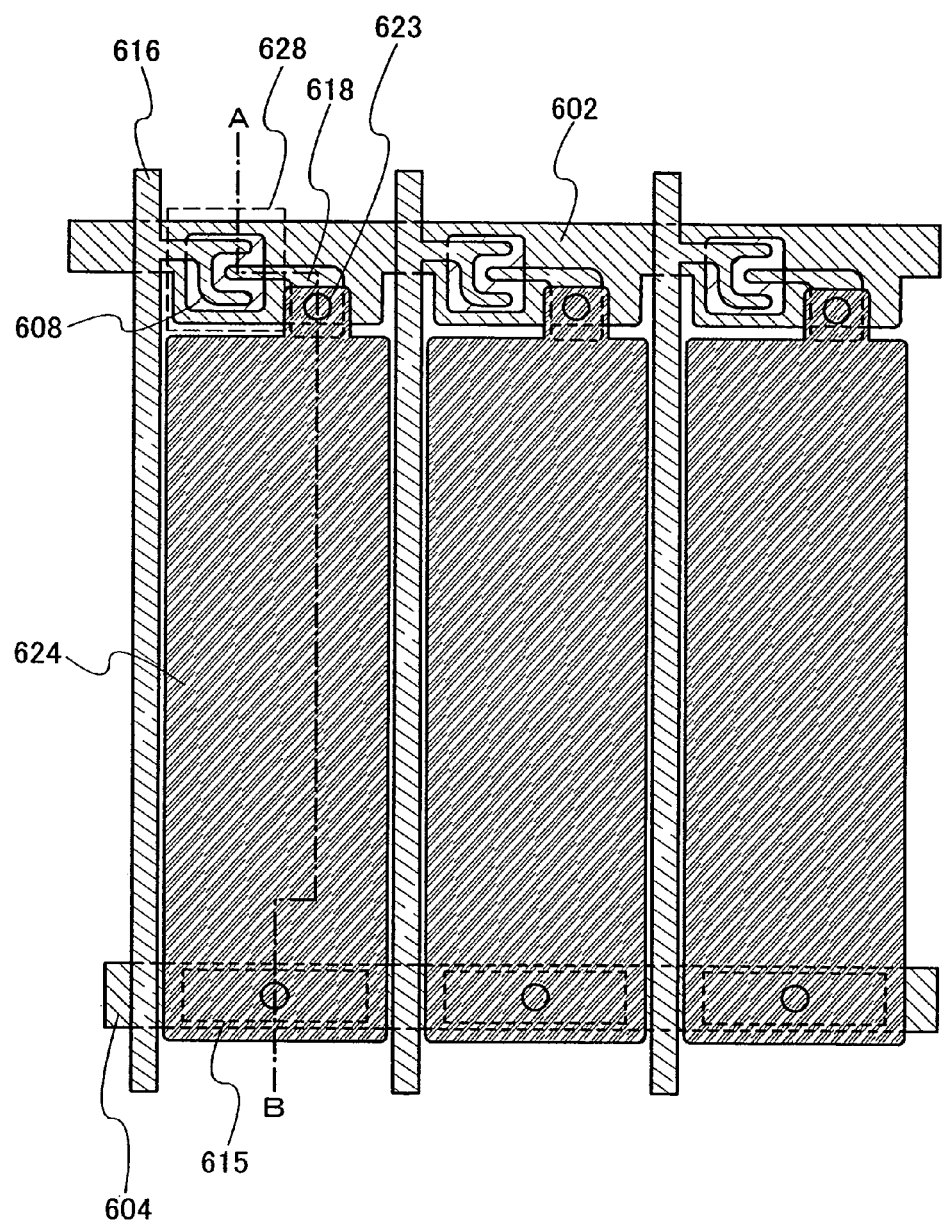
FIG. 26 is a view describing a liquid crystal display device of the present invention.

FIGS. 25 and 26 illustrate a pixel structure of a liquid crystal display device in a TN mode. FIG. 26 is a plan view, and FIG. 25 shows a cross-sectional structure taken along a line A-B in FIG. 26. The following description will be made with reference to both the diagrams.

The pixel electrode 624 is connected to the TFT 628 through the wiring 618 in the contact hole 623. The wiring 616 that functions as a data line is also connected to the TFT 628. Any TFT described in Embodiment Mode 1 can be used for the TFT 628.

The pixel electrode 624 is formed of the pixel electrode 77 described in Embodiment Mode 1.

The counter substrate 601 is provided with the light-shielding film 632, the second coloring film 636, and the counter electrode 640. In addition, the planarizing film 637 is formed between the second coloring film 636 and the counter electrode 640 to prevent alignment disorder of liquid crystals. The liquid crystal layer 650 is formed between the pixel electrode 624 and the counter electrode 640.

The pixel electrode 624, the liquid crystal layer 650, and the counter electrode 640 overlap with each other to form a liquid crystal element.

Further, a color filter, a blocking film for preventing disclination (a black matrix), or the like may also be provided for the substrate 600 or the counter substrate 601. Further, a polarizing plate is attached to a surface of the substrate 600 which is opposite to the surface provided with the thin film transistor, and a polarizing plate is attached to a surface of the counter substrate 601 which is opposite to the surface provided with the counter electrode 640.

The counter electrode 640 can be formed of a similar material to the pixel electrode 77 as appropriate. The pixel electrode 624, the liquid crystal layer 650, and the counter electrode 640 overlap with each other to form a liquid crystal element.

Through the above process, a liquid crystal display device can be manufactured. The liquid crystal display device in this embodiment mode has high contrast and high visibility because a thin film transistor with less off current, excellent electric characteristics, and high reliability is used in the liquid crystal display device. Further, because a thin film transistor in which a microcrystalline semiconductor film slightly including an impurity element which imparts one conductivity type is used to control the threshold value is used, a highly visible liquid crystal display device can be manufactured with high productivity.

Embodiment Mode 7

In this embodiment mode, a light-emitting device, which is one mode of a display device, will be described with reference to FIGS. 9A and 9B, FIGS. 10A to 10C, FIGS. 11A and 11B, FIGS. 27A and 27B, and FIGS. 28A to 28C. A light-emitting element utilizing electroluminescence is shown as a light-emitting device in this embodiment mode. Light-emitting elements utilizing electroluminescence are classified into two types according to whether the light-emitting material is an organic compound or an inorganic compound. In general, the former is referred to as an organic EL element and the latter is referred to as an inorganic EL element.

In an organic EL element, voltage is applied to the light-emitting element, so that electrons and holes are injected from a pair of electrodes into a layer including a light-emitting organic compound, respectively, so that current flows. Then, these carriers (electrons and holes) are recombined so that the light-emitting organic compound is placed in an excited state. The light-emitting organic compound emits light in returning to ground state from the excited state. Because of such mechanism, such a light-emitting element is called a light-emitting element of a current excitation type.

Inorganic EL elements are classified into dispersive inorganic EL elements and thin film inorganic EL elements depending on the element structure. A dispersive inorganic EL element includes a light-emitting element in which particles of a light-emitting material are dispersed in a binder, and light emission mechanism thereof is donor-acceptor recombination light emission in which a donor level and an acceptor level are utilized. In a thin film inorganic EL element, a light-emitting layer is sandwiched between dielectric layers, and the dielectric layers are sandwiched between electrodes. Light emission mechanism of the thin film inorganic EL element is local light emission in which inner-shell electron transition of a metal ion is utilized. Note that, in this embodiment mode, description will be made using an organic EL element as a light-emitting element, and a channel-etched thin film transistor is used as a thin film transistor for controlling the drive of the light-emitting element.

Through the steps shown in FIGS. 9A and 9B, FIGS. 10A to 10C, and FIGS. 11A and 11B, thin film transistors 85 and 86 are formed over the substrate 50, and the insulating film 76 that serves as a protective film is formed over the thin film transistors 85 and 86 as shown in FIG. 27A. Then, a planarizing film 111 is formed over the insulating film 76, and a pixel electrode 112 that is connected to a source or drain electrode of the thin film transistor 86 is formed over the planarizing film 111.

It is preferable that the planarizing film 111 be formed of an organic resin such as acrylic, polyimide, or polyamide, or siloxane.

In FIG. 27A, it is preferable to use a cathode as the pixel electrode 112 because the thin film transistor of a pixel is an n-channel TFT; if the thin film transistor of the pixel is a p-channel TFT, it is preferable to use an anode as the pixel electrode 112. Specifically, for the cathode, a known material with a low work function, such as calcium, aluminum, calcium fluoride, silver magnesium alloy, or aluminum-lithium alloy can be used.

Then, as shown in FIG. 27B, a partition wall 113 is formed over the planarizing film 111 and an end portion of the pixel electrode 112. The partition wall 113 has an opening portion, and the pixel electrode 112 is exposed in the opening portion. The partition wall 113 is formed of an organic resin film, an inorganic insulating film, or an organic polysiloxane film. In particular, it is preferable that the partition wall 113 be formed of a photosensitive material, and the opening portion be formed over the pixel electrode, and a side wall of the opening portion have an inclined surface with a continuous curvature.

Then, a light-emitting layer 114 is formed so as to be in contact with the pixel electrode 112 in the opening portion of the partition wall 113. The light-emitting layer 114 can be formed of either a single layer or a plurality of layers stacked.

Then, a common electrode 115 is formed using an anode material so as to cover the light-emitting layer 114. The common electrode 115 can be formed of a light-transmitting conductive film which is formed of a light-transmitting conductive material and is given as the pixel electrode 77 in Embodiment Mode 1. The common electrode 115 may also be formed of a titanium nitride film or a titanium film instead of the above light-transmitting conductive film. In FIG. 27B, the common electrode 115 is formed of indium tin oxide. In the opening portion of the partition wall 113, the pixel electrode 112, the light-emitting layer 114, and the common electrode 115 overlap with each other to form a light-emitting element 117. After that, a protective film 116 is preferably formed over the common electrode 115 and the partition wall 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Further, practically, it is preferable that a display device completed up to the state shown in FIG. 27B be packaged (sealed) with a protective film (such as a laminated film or an ultraviolet curable resin film) or a cover material with high air-tightness and little degasification so that the display device is not exposed to outside air.

Next, a structure of a light-emitting element will be described with reference to FIGS. 28A to 28C. A cross-sectional structure of a pixel will be described taking an n-channel driving TFT as an example.

In order to extract light emission of the light-emitting element, it is necessary that at least one of an anode and a cathode is transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of the emission structures.

A light-emitting element having a top emission structure will be described with reference to FIG. 28A.

Figure 28A:
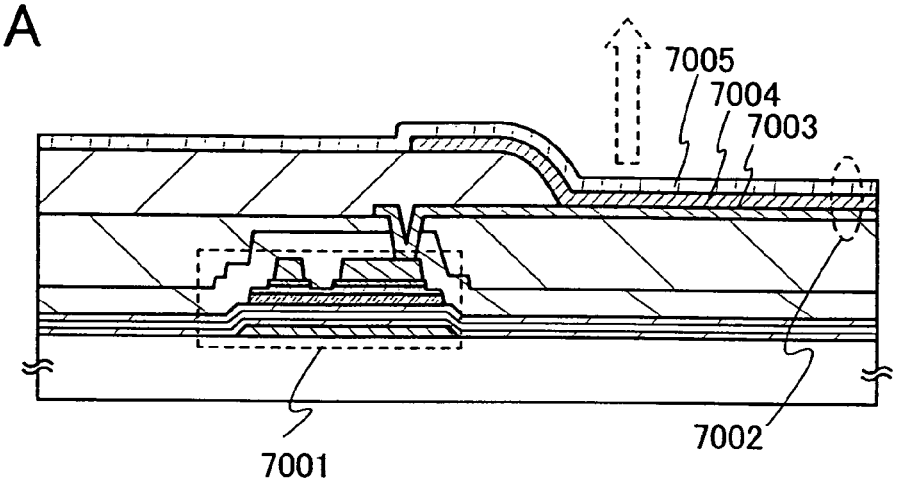
FIGS. 28A to 28C are cross-sectional views each describing a pixel applicable to a light-emitting device of the present invention.

FIG. 28A is a cross-sectional view of a pixel in which a driving TFT 7001 is an n-channel TFT, and light generated in a light-emitting element 7002 is emitted to pass through an anode 7005. In FIG. 28A, a cathode 7003 of the light-emitting element 7002 and the driving TFT 7001 are electrically connected to each other. A light-emitting layer 7004 and the anode 7005 are stacked in order over the cathode 7003. As the cathode 7003, a known conductive film can be used as long as it has a low work function and reflects light. For example, calcium, aluminum, calcium fluoride, silver magnesium alloy, or aluminum-lithium alloy is preferably used. The light-emitting layer 7004 can be formed of either a single layer or a plurality of layers stacked. If the light-emitting layer 7004 is formed of a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to provide all the layers. The anode 7005 is formed of a light-transmitting conductive material; for example, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added may be used.

The light-emitting element 7002 corresponds to a region where the cathode 7003 and the anode 7005 sandwich the light-emitting layer 7004. In the pixel shown in FIG. 28A, light generated in the light-emitting element 7002 is emitted to pass through the anode 7005 as shown by an outline arrow.

Next, a light-emitting element having a bottom emission structure will be described with reference to FIG. 28B. FIG. 28B is a cross-sectional view of a pixel in which a driving TFT 7011 is an n-channel TFT, and light generated in a light-emitting element 7012 is emitted to pass through a cathode 7013. In FIG. 28B, the cathode 7013 of the light-emitting element 7012 is formed over a light-transmitting conductive film 7017 that is electrically connected to the driving TFT 7011, and a light-emitting layer 7014 and an anode 7015 are stacked in order over the cathode 7013. Further, a blocking film 7016 for reflecting or blocking light may be formed so as to cover the anode 7015 when the anode 7015 has a light-transmitting property. As the cathode 7013, a known conductive film can be used as in the case of FIG. 28A as long as it has a low work function. The cathode 7013 has a thickness that can transmit light (preferably, about 5 to 30 nm). For example, an Al film having a thickness of 20 nm can be used as the cathode 7013. Further, the light-emitting layer 7014 can be formed of either a single layer or a plurality of layers stacked, as in the case of FIG. 28A. The anode 7015 is not required to transmit light, but can be formed of a light-transmitting conductive film as in the case of FIG. 28A. For the blocking film 7016, a metal or the like that reflects light can be used; however, the present invention is not limited to a metal film. For example, a resin or the like to which a black pigment is added can be used.

The light-emitting element 7012 corresponds to a region where the cathode 7013 and the anode 7015 sandwich the light-emitting layer 7014. In the pixel shown in FIG. 28B, light generated in the light-emitting element 7012 is emitted to pass through the cathode 7013 as shown by an outline arrow.

Next, a light-emitting element having a dual emission structure will be described with reference to FIG. 28C. In FIG. 28C, a cathode 7023 of a light-emitting element 7022 is formed over a light-transmitting conductive film 7027 that is electrically connected to a driving TFT 7021, and a light-emitting layer 7024 and an anode 7025 are stacked in order over the cathode 7023. As the cathode 7023, a known conductive film can be used as long as it has a low work function as in the case of FIG. 28A; however, the thickness thereof is a thickness at which light can pass through. For example, an Al film having a thickness of 20 nm can be used as the cathode 7023. Further, the light-emitting layer 7024 can be formed of either a single layer or a plurality of layers stacked, as in the case of FIG. 28A. The anode 7025 can be formed of a light-transmitting conductive film as in the case of FIG. 28A.

The light-emitting element 7022 corresponds to a region where the cathode 7023 and the anode 7025 sandwich the light-emitting layer 7024. In the pixel illustrated in FIG. 28C, light generated in the light-emitting element 7022 is emitted to pass through both the anode 7025 and the cathode 7023 as shown by outline arrows.

Note that, although an organic EL element is described as a light-emitting element in this embodiment mode, it is also possible to provide an inorganic EL element as a light-emitting element.

Note that, in this embodiment mode, an example in which a thin film transistor for controlling the drive of a light-emitting element (the driving TFT) is electrically connected to the light-emitting element is described; however, a TFT for controlling current may be connected between the driving TF and the light-emitting element.

Figure 28B:
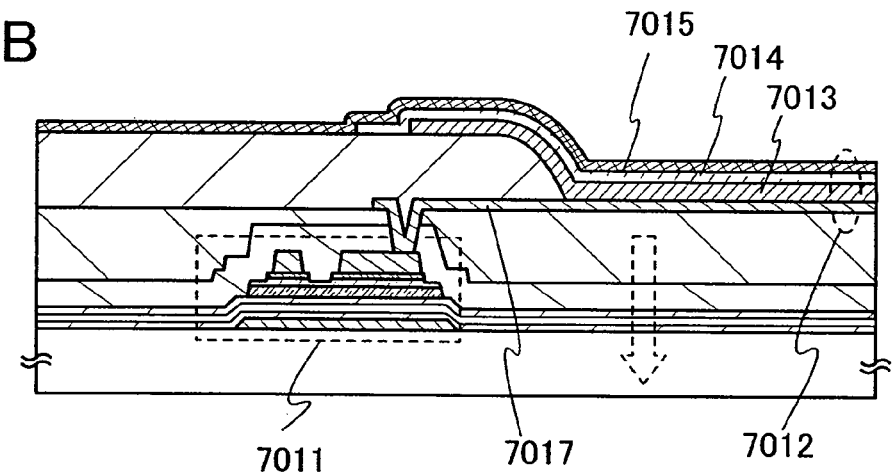
Figure 28C:
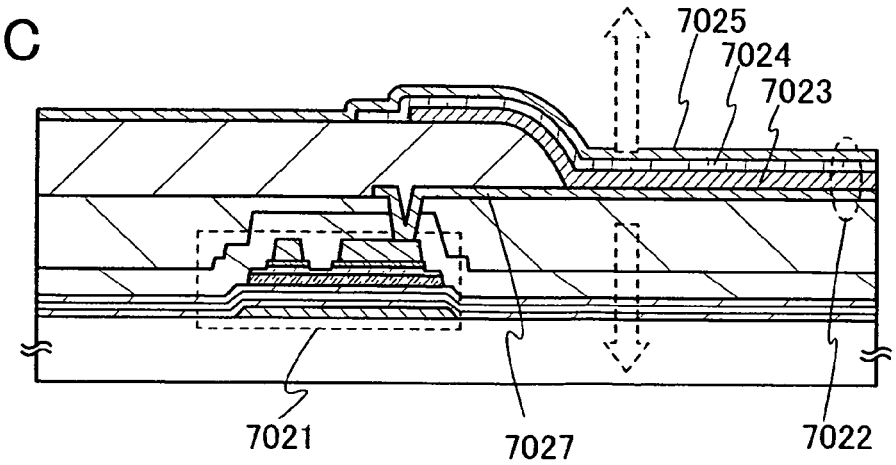

Note that the light-emitting device described in this embodiment mode is not limited to the structures shown in FIGS. 28A to 28C, and can be modified in various ways based on the spirit of techniques according to the present invention.

Through the above process, a light-emitting device can be manufactured. The light-emitting device in this embodiment mode has high contrast and high visibility because a thin film transistor with less off current, excellent electric characteristics, and high reliability is used in the light-emitting device. Further, because a thin film transistor in which a microcrystalline semiconductor film slightly including an impurity element which imparts one conductivity type is used to control the threshold value is used, a highly visible light-emitting device can be manufactured with high productivity.

Embodiment Mode 8

A structure of a display panel, which is one mode of the display device of the present invention will be described below.

Figure 29A:
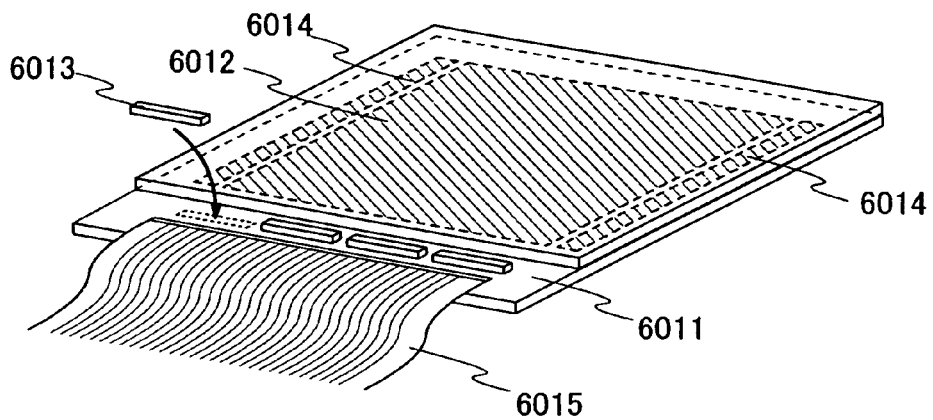
FIGS. 29A to 29C are perspective views each describing a display panel of the present invention.

FIG. 29A illustrates a mode of a display panel in which a pixel portion 6012 formed over a substrate 6011 is connected to a signal line driver circuit 6013 that is formed separately. The pixel portion 6012 and a scanning line driver circuit 6014 are formed of thin film transistors each using a microcrystalline semiconductor film. By forming the signal line driver circuit with a thin film transistor by which higher mobility can be obtained compared to the thin film transistor using a microcrystalline semiconductor film, operation of the signal line driver circuit, which demands a higher driving frequency than the scanning line driver circuit, can be stabilized. Note that the signal line driver circuit 6013 may be formed of a thin film transistor using a single-crystalline semiconductor, a thin film transistor using a polycrystalline semiconductor, or a thin film transistor using an SOI. The pixel portion 6012, the signal line driver circuit 6013, and the scanning line driver circuit 6014 are each supplied with potential of a power source, a variety of signals, and the like through an FPC 6015.

Note that both the signal driver circuit and the scanning line driver circuit may be formed over the same substrate as the pixel portion.

Figure 29B:
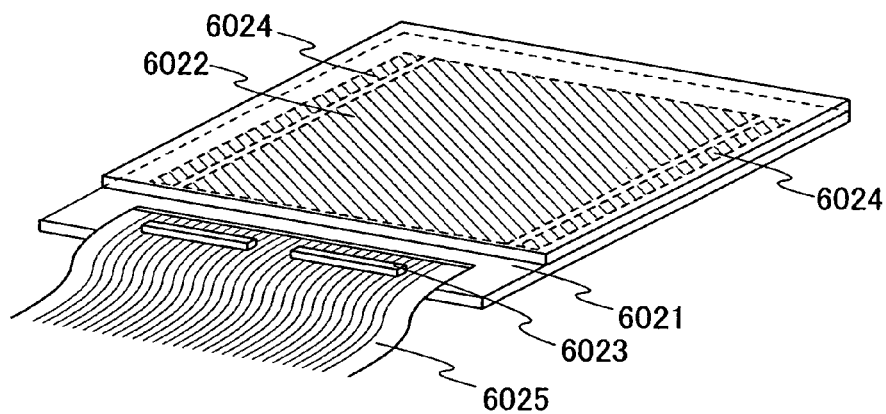

Further, when the driver circuit is formed separately, a substrate provided with the driver circuit is not necessarily attached to a substrate provided with the pixel portion, and may be attached to, for example, the FPC. FIG. 29B illustrates a mode of a panel of a liquid crystal display device in which a signal line driver circuit 6023 is formed separately and is connected to a pixel portion 6022 and a scanning line driver circuit 6024 that are formed over a substrate 6021. The pixel portion 6022 and the scanning line driver circuit 6024 are formed of thin film transistors each using a microcrystalline semiconductor film. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025.

Figure 29C:
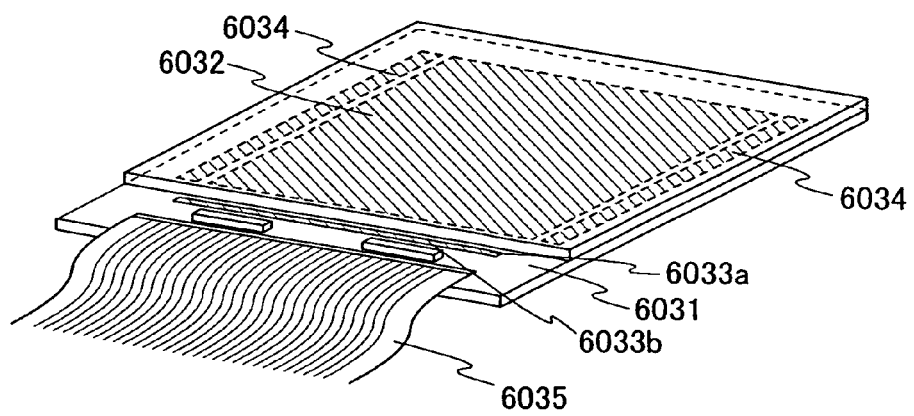

Furthermore, only a part of the signal line driver circuit or only a part of the scanning line driver circuit may be formed over the same substrate as the pixel portion with use of a thin film transistor using a microcrystalline semiconductor film, and the rest may be formed separately and electrically connected to the pixel portion. FIG. 29C illustrates a mode of a liquid crystal display device panel in which an analog switch 6033a included in the signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are formed of thin film transistors each using a microcrystalline semiconductor film. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035.

As shown in FIGS. 29A to 29C, in the liquid crystal display device of the present invention, an entire driver circuit or a part thereof can be formed over the same substrate as a pixel portion, using a thin film transistor using an LPSAS film.

Note that there are no particular limitations on a connection method of a substrate formed separately, and a known method such as a COG method, a wire bonding method, or a TAB method can be used. Further, a connection position is not limited to the position shown in each of FIGS. 29A to 29C as long as electrical connection is possible. Further, a controller, a CPU, a memory, or the like may be formed separately and connected.

Note that the signal line driver circuit used in the present invention is not limited to a mode having only a shift register and an analog switch. In addition to the shift register and the analog switch, another circuit such as a buffer, a level shifter, or a source follower may be included. Further, the shift register and the analog switch are not necessarily provided; for example, a different circuit such as a decoder circuit by which selection of signal lines is possible may be used instead of the shift register, and a latch or the like may be used instead of the analog switch.

Figure 32:
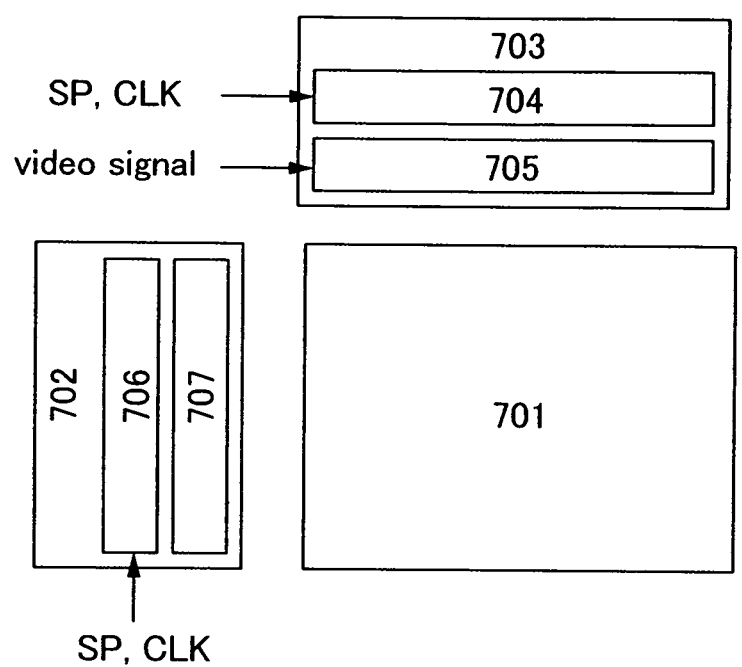
FIG. 32 is a block diagram describing a structure of a light-emitting device of the present invention.

FIG. 32 is a block diagram of the liquid crystal display device of the present invention. The display device shown in FIG. 32 includes a pixel portion 700 including a plurality of pixels each provided with a display element; a scanning line driver circuit 702 that selects each pixel; and a signal line driver circuit 703 that controls a video signal input to a selected pixel.

In FIG. 32, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704, and input to the analog switch 705.

Further, a video signal is input to the analog switch 705. The analog switch 705 samples the video signal according to the timing signal which is input and supplies to signal lines of subsequent stages.

Next, a structure of the scanning line driver circuit 702 will be described. The scanning line driver circuit 702 includes a shift register 706 and a buffer 707. Further, a level shifter may be included depending on the case. In the scanning line driver circuit 702, a selection signal is generated by inputting a clock signal (CLK) and a start pulse signal (SP) to the shift register 706. The generated selection signal is buffer-amplified in the buffer 707, and then supplied to a corresponding scanning line. Gates of transistors in pixels of one line are connected to the scanning line. Since it is necessary that the transistors in the pixels of one line are turned on at the same time, a buffer through which a large amount of current can flow is used as the buffer 707.

In a full color liquid crystal display device, in the case where video signals corresponding to R (red), G (green), and B (blue) are sampled in sequence and are supplied to corresponding signal lines, the number of terminals for connecting the shift register 704 and the analog switch 705 is about ⅓ as many as that of terminals for connecting the analog switch 705 to the signal lines of the pixel portion 700. Therefore, by forming the analog switch 705 and the pixel portion 700 over the same substrate, the number of terminals used for connecting a substrate over which a pixel portion is formed to a substrate which is formed separately can be suppressed compared to the case of forming the analog switch 705 and the pixel portion 700 over different substrates, and occurrence probability of poor connection can be suppressed, and the yield can be increased.

Note that, although the scanning line driver circuit 702 includes the shift register 706 and the buffer 707 in FIG. 32, the scanning line driver circuit 702 may include only the shift register 706.

Note that the structure shown in FIG. 32 is merely a mode of the display device of the present invention, and the structures of a signal line driver circuit and a scanning line driver circuit are not limited thereto.

Figure 33:
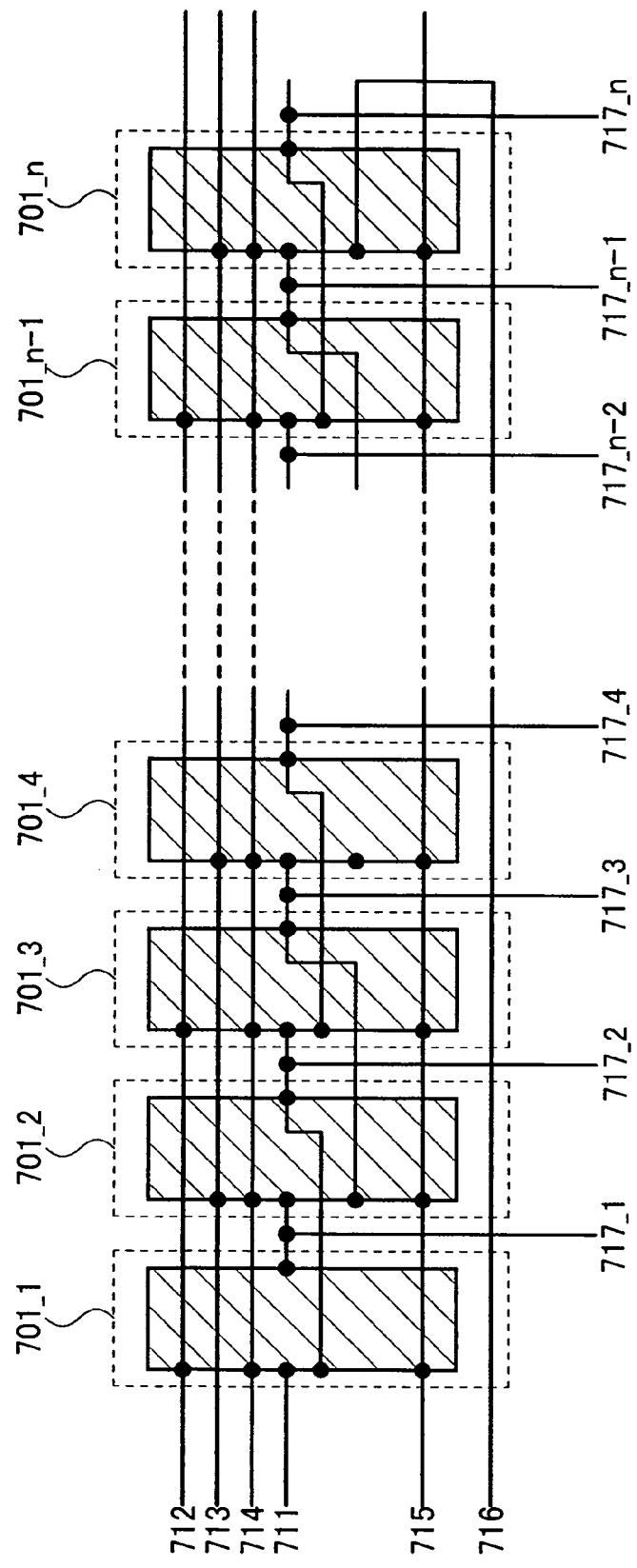
FIG. 33 is an equivalent circuit diagram describing a structure of a driver circuit of a light-emitting device of the present invention.

Next, a mode of a shift register including thin film transistors having the same conductivity type, each using an LPSAS film will be described with reference to FIGS. 33 and 34. FIG. 33 shows a structure of the shift register of this embodiment mode. The shift register shown in FIG. 33 includes a plurality of flip-flops 701.$i$ (any one of flip-flops 701.1 to 701.$n$). Further, the shift register is operated by inputting a first clock signal, a second clock signal, a start pulse signal, and a reset signal.

A connection relation of the shift register in FIG. 33 will be described. In the flip-flop 701.$i$ in an i-th stage (any one of the flip-flops 701.1 to 701.$n$) of the shift register in FIG. 33, a first wiring 501 shown in FIG. 34 is connected to a seventh wiring 717.$i-1$, a second wiring 502 shown in FIG. 34 is connected to a seventh wiring 717.$i+1$; a third wiring 503 shown in FIG. 34 is connected to a seventh wiring 717.$i$; and a sixth wiring 506 shown in FIG. 34 is connected to a fifth wiring 715.

Figure 34:
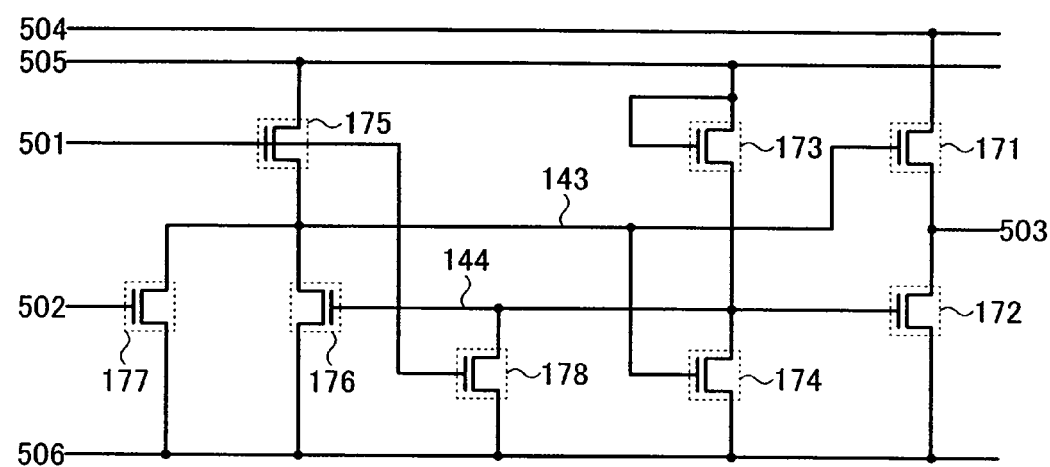
FIG. 34 is an equivalent circuit diagram describing a structure of a driver circuit of a light-emitting device of the present invention.

Further, a fourth wiring 504 shown in FIG. 34 is connected to a second wiring 712 in a flip-flop in an odd-numbered stage, and is connected to a third wiring 713 in a flip-flop in an even-numbered stage. A fifth wiring 505 shown in FIG. 34 is connected to a fourth wiring 714.

It is to be noted that the first wiring 501 shown in FIG. 34 of the flip-flop 701.1 in a first stage is connected to a first wiring 711, and the second wiring 502 shown in FIG. 34 of the flip-flop 701.$n$ in an n-th stage is connected to the sixth wiring 716.

Note that the first wiring 711, the second wiring 712, the third wiring 713, and the sixth wiring 716 can be called a first signal line, a second signal line, a third signal line, and a fourth signal line, respectively. Further, the fourth wiring 714 and the fifth wiring 715 can be called a first power supply line and a second power supply line, respectively.

FIG. 34 illustrates the flip-flop shown in FIG. 33 in detail. The flip-flop shown in FIG. 34 includes a first thin film transistor 171, a second thin film transistor 172, a third thin film transistor 173, a fourth thin film transistor 174, a fifth thin film transistor 175, a sixth thin film transistor 176, a seventh thin film transistor 177, and an eighth thin film transistor 178. In this embodiment mode, the first thin film transistor 171, the second thin film transistor 172, the third thin film transistor 173, the fourth thin film transistor 174, the fifth thin film transistor 175, the sixth thin film transistor 176, the seventh thin film transistor 177, and the eighth thin film transistor 178 are n-channel transistors, and each are turned on when a gate-source voltage ($V_{gs}$) exceeds a threshold voltage ($V_{th}$).

Next, a connection structure of the flip-flop shown in FIG. 33 will be described below.

A first electrode (one of a source electrode or a drain electrode) of the first thin film transistor 171 is connected to the fourth wiring 504, and a second electrode (the other of the source electrode or the drain electrode) of the first thin film transistor 171 is connected to the third wiring 503.

A first electrode of the second thin film transistor 172 is connected to the sixth wiring 506, and a second electrode of the second thin film transistor 172 is connected to the third wiring 503.

A first electrode of the third thin film transistor 173 is connected to the fifth wiring 505. A second electrode of the third thin film transistor 173 is connected to a gate electrode of the second thin film transistor 172. A gate electrode of the third thin film transistor 173 is connected to the fifth wiring 505.

A first electrode of the fourth thin film transistor 174 is connected to the sixth wiring 506. A second electrode of the fourth thin film transistor 174 is connected to the gate electrode of the second thin film transistor 172. A gate electrode of the fourth thin film transistor 174 is connected to a gate electrode of the first thin film transistor 171.

A first electrode of the fifth thin film transistor 175 is connected to the fifth wiring 505. A second electrode of the fifth thin film transistor 175 is connected to the gate electrode of the first thin film transistor 171. A gate electrode of the fifth thin film transistor 175 is connected to the first wiring 501.

A first electrode of the sixth thin film transistor 176 is connected to the sixth wiring 506. A second electrode of the sixth thin film transistor 176 is connected to the gate electrode of the first thin film transistor 171. A gate electrode of the sixth thin film transistor 176 is connected to the gate electrode of the second thin film transistor 172.

A first electrode of the seventh thin film transistor 177 is connected to the sixth wiring 506. A second electrode of the seventh thin film transistor 177 is connected to the gate electrode of the first thin film transistor 171. A gate electrode of the seventh thin film transistor 177 is connected to the second wiring 502. A first electrode of the eighth thin film transistor 178 is connected to the sixth wiring 506. A second electrode of the eighth thin film transistor 178 is connected to the gate electrode of the second thin film transistor 172. A gate electrode of the eighth thin film transistor 178 is connected to the first wiring 501.

Note that a part where the gate electrode of the first thin film transistor 171, the gate electrode of the fourth thin film transistor 174, the second electrode of the fifth thin film transistor 175, the second electrode of the sixth thin film transistor 176, and the second electrode of the seventh thin film transistor 177 are connected to each other is a node 143. Further, a part where the gate electrode of the second thin film transistor 172, the second electrode of the third thin film transistor 173, the second electrode of the fourth thin film transistor 174, the gate electrode of the sixth thin film transistor 176, and the second electrode of the eighth thin film transistor 178 are connected to each other is a node 144.

It is to be noted that the first wiring 501, the second wiring 502, the third wiring 503, and the fourth wiring 504 can be called the first signal line, the second signal line, the third signal line, and the fourth signal line, respectively. Further, the fifth wiring 505 and the sixth wiring 506 can be called the first power supply line and the second power supply line, respectively.

Figure 35:
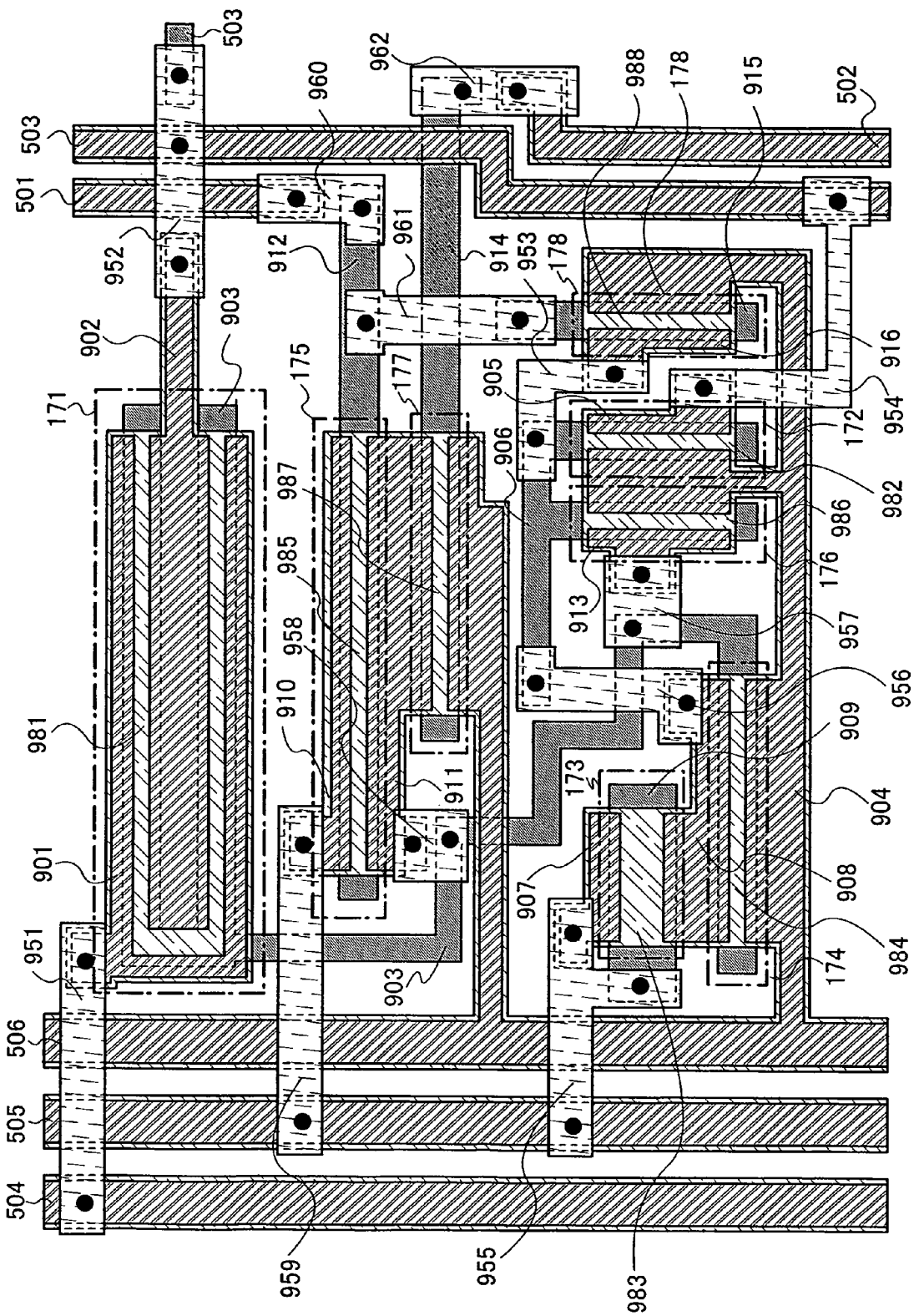
FIG. 35 is a top view describing a layout of a driver circuit of a light-emitting device of the present invention.

FIG. 35 illustrates an example of a top view of the flip-flop shown in FIG. 34.

A conductive film 901 includes a part which functions as the first electrode of the first thin film transistor 171. The conductive film 901 is connected to the fourth wiring 504 through a wiring 951 that is formed at the same time as a pixel electrode.

A conductive film 902 includes a part which functions as the second electrode of the first thin film transistor 171. The conductive film 902 is connected to the third wiring 503 through a wiring 952 that is formed at the same time as a pixel electrode.

A conductive film 903 includes a part which functions as the gate electrode of the first thin film transistor 171 and a part which functions as the gate electrode of the fourth thin film transistor 174.

A conductive film 904 includes a part which functions as the first electrode of the second thin film transistor 172, a part which functions as the first electrode of the sixth thin film transistor 176, a part which functions as the first electrode of the fourth thin film transistor 174, and a part which functions as the first electrode of the eighth thin film transistor 178. The conductive film 904 is connected to the sixth wiring 506.

A conductive film 905 includes a part which functions as the second electrode of the second thin film transistor 172. The conductive film 905 is connected to the third wiring 503 through a wiring 954 that is formed at the same time as a pixel electrode.

A conductive film 906 includes a part which functions as the gate electrode of the second thin film transistor 172 and a part which functions as the gate electrode of the sixth thin film transistor 176.

A conductive film 907 includes a part which functions as the first electrode of the third thin film transistor 173. The conductive film 907 is connected to the fifth wiring 505 through a wiring 955.

A conductive film 908 includes a part which functions as the second electrode of the third thin film transistor 173 and a part which functions as the second electrode of the fourth thin film transistor 174. The conductive film 908 is connected to the conductive film 906 through a wiring 956 that is formed at the same time as a pixel electrode.

A conductive film 909 includes a part which functions as the gate electrode of the third thin film transistor 173. The conductive film 909 is connected to the fifth wiring 505 through the wiring 955.

A conductive film 910 includes a part which functions as the first electrode of the fifth thin film transistor 175. The conductive film 910 is connected to the fifth wiring 505 through a wiring 959 that is formed at the same time as a pixel electrode.

A conductive film 911 includes a part which functions as the second electrode of the fifth thin film transistor 175 and a part which functions as the second electrode of the seventh thin film transistor 177. The conductive film 911 is connected to the conductive film 903 through a wiring 958 that is formed at the same time as a pixel electrode.

A conductive film 912 includes a part which functions as the gate electrode of the fifth thin film transistor 175. The conductive film 912 is connected to the first wiring 501 through a wiring 960 that is formed at the same time as a pixel electrode.

A conductive film 913 includes a part which functions as the second electrode of the sixth thin film transistor 176. The conductive film 913 is connected to the conductive film 903 through a wiring 957 that is formed at the same time as a pixel electrode.

A conductive film 914 includes a part which functions as the gate electrode of the seventh thin film transistor 177. The conductive film 914 is connected to the second wiring 502 through a wiring 962 that is formed at the same time as a pixel electrode.

A conductive film 915 includes a part which functions as the gate electrode of the eighth thin film transistor 178. The conductive film 915 is connected to the conductive film 912 through a wiring 961 that is formed at the same time as a pixel electrode.

A conductive film 916 includes a part which functions as the second electrode of the eighth thin film transistor 178. The conductive film 916 is connected to the conductive film 906 through a wiring 953 that is formed at the same time as a pixel electrode.

In a liquid crystal display device including a circuit as shown in FIGS. 32 to 34 including a thin film transistor using a microcrystalline semiconductor, the circuit can operate at high speed. For example, when a transistor using an LPSAS film and a transistor using an amorphous semiconductor film are compared to each other, the former has higher mobility, and thus can have a higher driving frequency in a driver circuit (e.g., the shift register 706 in the scanning line driver circuit 702). The scanning line driver circuit 702 can operate at high speed, and thus increase in the frame frequency, black frame insertion, or the like can be realized.

When the frame frequency is increased, data for a screen is preferably generated in accordance with a direction of movement of an image. That is, motion compensation is preferably performed to interpolate data. When the frame frequency is increased and image data is interpolated in such a manner, display characteristics of moving images are improved, and smooth display can be performed. For example, the frame frequency is increased to be twice or more as much (e.g., 120 Hz or 100 Hz), and preferably, to be four times or more (e.g., 480 Hz or 400 Hz), so that blurring and afterimages of moving images can be reduced. In this case, the scanning line driver circuit 702 is also operated with the driving frequency increased; thus, the frame frequency can be increased.

When black frame insertion is performed, such a structure is employed that image data or data for black display can be supplied to the pixel portion 700. Thus, display is performed in a method similar to impulse driving, and afterimages can be reduced. In this case, the scanning line driver circuit 702 is also operated with the driving frequency increased, and thus, black frame insertion can be performed.

Furthermore, the frame frequency can be further increased by, for example, increasing the channel width of the thin film transistor in the scanning line driver circuit 702 or providing a plurality of scanning line driver circuits. For example, the frame frequency can be increased to be eight times or more as much (e.g., 960 Hz or 800 Hz). When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized. As an example, the channel width of the second thin film transistor 172 is preferably 300 µm or more, and more preferably, 1000 µm or more.

Note that, by forming the circuit as shown in FIGS. 32 to 34 with use of a transistor using a microcrystalline semiconductor, the layout area can be reduced. Accordingly, the frame size of a liquid crystal display device, which is an example of the display device, can be reduced. For example, since a transistor using an LPSAS film has higher field effect mobility than a transistor using an amorphous semiconductor film, the channel width of a transistor can be reduced. As a result, the frame size of the liquid crystal display device can be reduced. As an example, the channel width of the second thin film transistor 172 is preferably 3000 µm or less, and more preferably, 2000 µm or less.

In the second thin film transistor 172 in FIG. 34, a period during which a low-level signal is output to the third wiring 503 is long. In this period, the second thin film transistor 172 is kept in an on state. Therefore, high stress is applied to the second thin film transistor 172, and characteristics of the transistor are likely to deteriorate. As the characteristics of the transistor deteriorate, the threshold voltage is gradually increased. Thus, a current value is decreased. In view of this, in order to supply enough current even when the transistor deteriorates, the channel width of the second thin film transistor 172 is preferably large. Alternatively, compensation is preferably performed so that a circuit operation is not affected even when the transistor deteriorates. For example, it is preferable that a transistor be provided in parallel with the second thin film transistor 172, and the transistor and the second thin film transistor 172 be alternately turned on, so that the deterioration is less likely to affect the circuit operation.

Note that a transistor using an LPSAS film is less likely to deteriorate compared with a transistor using an amorphous semiconductor film. Therefore, when an LPSAS film is used, the channel width of the transistor can be reduced. Further, normal operation can be performed without any circuit for compensation for deterioration. Accordingly, the planar area of a transistor per pixel can be reduced.

Embodiment Mode 9

Figure 36A:
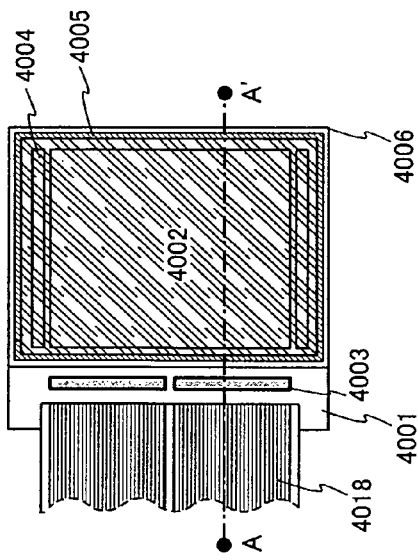
FIGS. 36A and 36B are a top view and a cross-sectional view describing a display panel of the present invention.
Figure 36B:
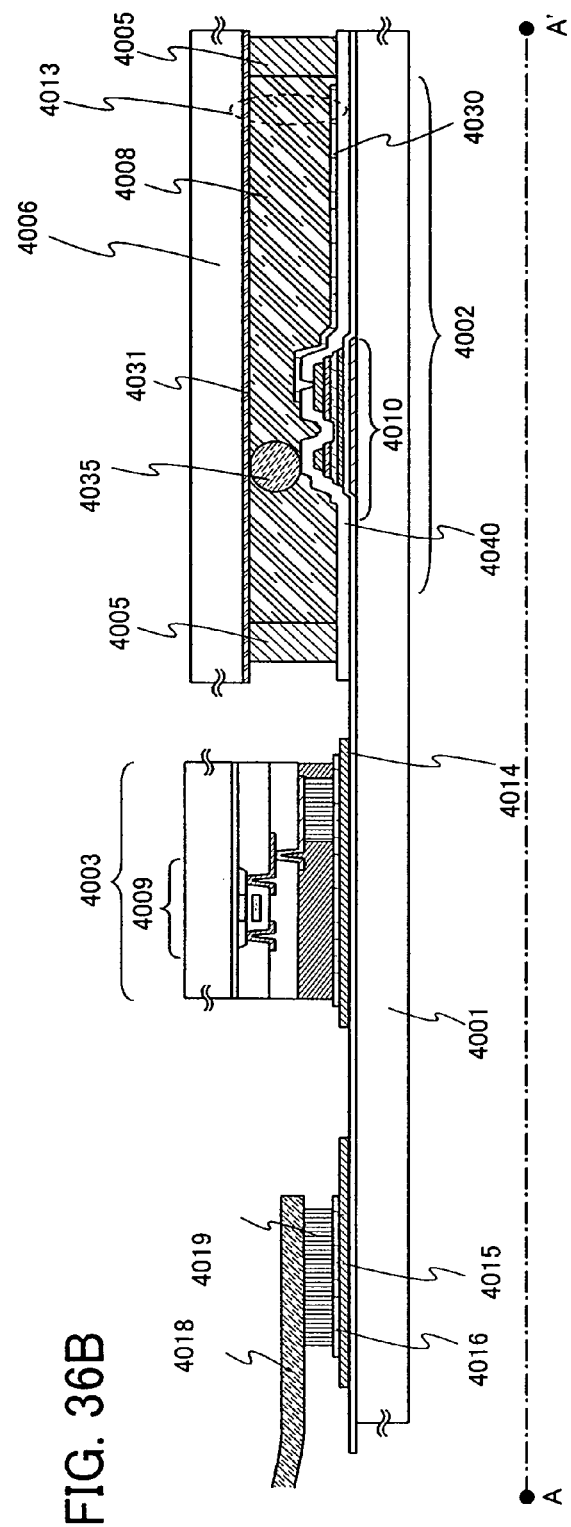

In this embodiment mode, an external view and a cross section of a liquid crystal display panel, which is one mode of a display device of the present invention, will be described with reference to FIGS. 36A and 36B. FIG. 36A is a top view of a panel in which a thin film transistor 4010 including an LPSAS film and a liquid crystal element 4013 that are formed over a first substrate 4001 are sealed with a sealant 4005 between the first substrate 4001 and a second substrate 4006. FIG. 36B is a cross-sectional view taken along a line A-A' of FIG. 36A.

The sealant 4005 is provided so as to surround a pixel portion 4002 and a scanning line driver circuit 4004 that are provided over the first substrate 4001. The second substrate 4006 is provided over the pixel portion 4002 and the scanning line driver circuit 4004. Thus, the pixel portion 4002 and the scanning line driver circuit 4004 are sealed with the sealant 4005 together with liquid crystals 4008 between the first substrate 4001 and the second substrate 4006. A signal line driver circuit 4003 that is formed using a polycrystalline semiconductor film over a substrate which is prepared separately is mounted in a region that is different from the region surrounded by the sealant 4005 over the first substrate 4001. Note that, an example in which the signal line driver circuit including a thin film transistor using a polycrystalline semiconductor film is attached to the first substrate 4001 will be described in this embodiment mode, a signal line driver circuit may be formed of a thin film transistor using a single-crystalline semiconductor and attached to the first substrate 4001, as well. A thin film transistor 4009 that is formed using a polycrystalline semiconductor film and included in the signal line driver circuit 4003 is shown as an example in FIG. 36B.

Further, the pixel portion 4002 and the scanning line driver circuit 4004 that are formed over the first substrate 4001 each include a plurality of thin film transistors, and the thin film transistor 4010 included in the pixel portion 4002 is shown as an example in FIG. 36B. The thin film transistor 4010 corresponds to a thin film transistor using an LPSAS film.

Further, reference symbol 4011 denotes a liquid crystal element. A pixel electrode 4030 of the liquid crystal element 4013 is electrically connected to the thin film transistor 4010. A counter electrode 4031 of the liquid crystal element 4013 is formed over the second substrate 4006. The liquid crystal element 4013 corresponds to a region where the pixel electrode 4030 and the counter electrode 4031 sandwich the liquid crystals 4008.

Note that the first substrate 4001 and the second substrate 4006 can be each formed of glass, metal (typically, stainless steel), ceramics, or plastics. As plastics, a fiberglass-reinforced plastics (FRP) plate, a polyvinyl fluoride (PVF) film, a polyester film, or an acrylic resin film can be used. Further, a sheet in which aluminum foil is sandwiched by PVF films or polyester films can be used as well.

Further, reference symbol 4035 denotes a spherical spacer, and is provided to control a distance (a cell gap) between the pixel electrode 4030 and the counter electrode 4031. Note that a spacer which is obtained by selectively etching an insulating film may also be used.

Further, a variety of signals and potential are supplied to the signal line driver circuit 4003 that is formed separately, the scanning line driver circuit 4004, and the pixel portion 4002 through lead wirings 4014 and 4015 from an FPC 4018.

In this embodiment mode, a connecting terminal 4016 is formed of the same conductive film as the pixel electrode 4030 included in the liquid crystal element 4013. In addition, the lead wirings 4014 and 4015 are formed of the same conductive film as a source or drain electrode of the thin film transistor 4010.

The connecting terminal 4016 is electrically connected to a terminal included in the FPC 4018 through an anisotropic conductive film 4019.

Although not shown, the liquid crystal display device described in this embodiment mode includes an alignment film and a polarizing plate, and further, may include a color filter or a blocking film.

Further, although an example in which the signal line driver circuit 4003 is formed separately and mounted on the first substrate 4001 is shown in FIGS. 36A and 36B, this embodiment mode is not limited to this structure. The scanning line driver circuit may be formed separately and then mounted, or only a part of the signal line driver circuit or a part of the scanning line driver circuit may be formed separately and then mounted.

This embodiment mode can be carried out in combination with any structure of another embodiment mode.

Embodiment Mode 6

Figure 37A:
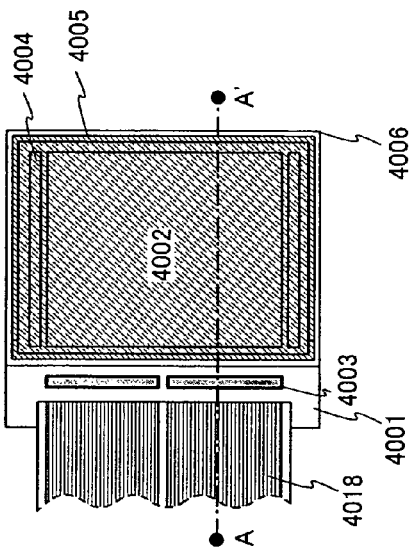
FIGS. 37A and 37B are a top view and a cross-sectional view describing a display panel of the present invention.
Figure 37B:
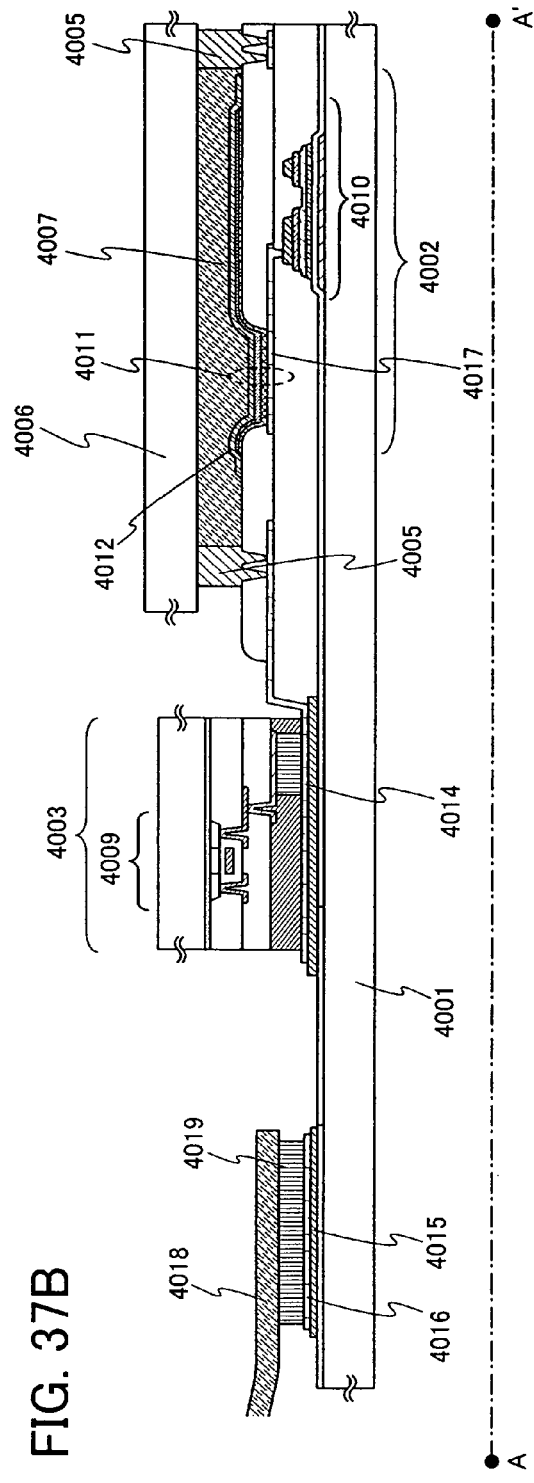

Next, an external view and a cross section of a light-emitting display panel, which is one mode of the display device of the present invention, will be described with reference to FIGS. 37A and 37B. FIG. 37A is a top view of a panel in which a thin film transistor using an LPSAS film and a light-emitting element that are formed over a first substrate are sealed with a sealant between the first substrate and a second substrate. FIG. 37B is a cross-sectional view taken along a line A-A' of FIG. 37A.

A sealant 4005 is provided so as to surround a pixel portion 4002 and a scanning line driver circuit 4004 that are provided over a first substrate 4001. A second substrate 4006 is provided over the pixel portion 4002 and the scanning line driver circuit 4004. Thus, the pixel portion 4002 and the scanning line driver circuit 4004 are sealed with the sealant 4005 together with a filler 4007 between the first substrate 4001 and the second substrate 4006. A signal line driver circuit 4003 that is formed using a polycrystalline semiconductor film over a substrate which is prepared separately is mounted in a region that is different from the region surrounded by the sealant 4005 over the first substrate 4001. Note that an example in which the signal line driver circuit 4003 including a thin film transistor using a polycrystalline semiconductor film is attached to the first substrate 4001 will be described in this embodiment mode, the signal line driver circuit may be formed using a thin film transistor using a single-crystalline semiconductor and may be attached to the first substrate 4001. A thin film transistor 4009 that is formed using a polycrystalline semiconductor film and included in the signal line driver circuit 4003 is shown as an example in FIG. 37B.

The pixel portion 4002 and the scanning line driver circuit 4004 that are provided over the first substrate 4001 each include a plurality of thin film transistors. A thin film transistor 4010 included in the pixel portion 4002 is shown as an example in FIG. 37B. Note that, although the thin film transistor 4010 is a driving TFT in this embodiment mode, the thin film transistor 4010 may be a TFT for controlling current or an erasing TFT as well. The thin film transistor 4010 corresponds to a thin film transistor using an LPSAS film.

Further, reference symbol 4011 denotes a light-emitting element. A pixel electrode of the light-emitting element 4011 is electrically connected to a source or drain electrode of the thin film transistor 4010 through a wiring 4017. Further, in this embodiment mode, a light-transmitting conductive film 4012 is electrically connected to a pixel electrode of the light-emitting element 4011. Note that the structure of the light-emitting element 4011 is not limited to the structure described in this embodiment mode. The structure of the light-emitting element 4011 can be changed as appropriate in accordance with a direction of light taken from the light-emitting element 4011, conductivity type of the thin film transistor 4010, or the like.

A variety of signals and potential which are applied to the signal line driver circuit 4003 that is formed separately, the scanning line driver circuit 4004, and the pixel portion 4002 are supplied from the FPC 4018 through the lead wirings 4014 and 4015, though not shown in the cross-sectional view of FIG. 37B.

In this embodiment mode, the connecting terminal 4016 is formed of the same conductive film as the pixel electrode included in the light-emitting element 4011. Further, the lead wirings 4014 and 4015 are formed of the same conductive film as the source or drain electrode of the thin film transistor 4010.

The connecting terminal 4016 is electrically connected to a terminal included in the FPC 4018 through the anisotropic conductive film 4019.

A substrate located in a direction of extracting light from the light-emitting element 4011 needs to be transparent. In that case, a light-transmitting material such as a glass plate, a plastic plate, a polyester film, or an acrylic film is used.

Further, as the filler 4007, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used as the filler.

Further, if necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, antiglare treatment may be carried out, by which reflected light can be diffused by roughness of a surface, thereby reducing reflection.

Note that, although an example in which the signal line driver circuit 4003 is formed separately and mounted on the first substrate 4001 is shown in FIGS. 37A and 37B, this embodiment mode is not limited to this structure. The scanning line driver circuit may be formed separately and then mounted, or only a part of the signal line driver circuit or a part of the scanning line driver circuit may be formed separately and then mounted, as well.

This embodiment mode can be carried out in combination with any structure of another embodiment mode.

Embodiment Mode 11

Display devices or the like that are obtained according to the present invention can be used for active matrix display device modules. That is, the present invention can be carried out in all electronic devices in which the modules are incorporated into display portions.

As such electronic devices, cameras such as video cameras and digital cameras; displays that can be mounted on a head (goggle-type displays); car navigation systems; projectors; car stereos; personal computers; portable information terminals (e.g., mobile computers, mobile phones, and electronic books); and the like can be given. Examples of these devices are illustrated in FIGS. 30A to 30D.

Figure 30A:
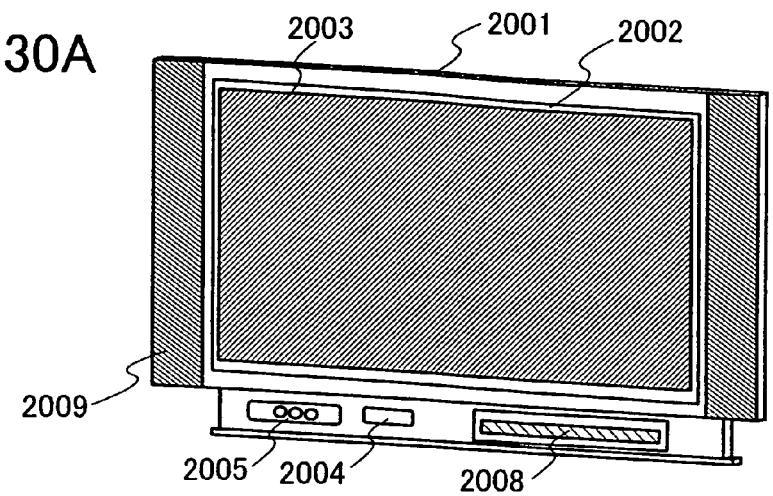
FIGS. 30A to 30D are perspective views describing electronic devices each using a light-emitting device of the present invention.

FIG. 30A illustrates a television device. A television device can be completed by incorporating a display module into a chassis as shown in FIG. 30A. A display panel including components up to an FPC is also referred to as a display module. A main screen 2003 is formed with a display module. In addition, a speaker unit 2009, operation switches, and the like are provided as accessory equipment. In this manner, a television device can be completed.

As shown in FIG. 30A, a display panel 2002 including a display element is incorporated into a chassis 2001. In addition to reception of general television broadcast by a receiver 2005, communication of information in one direction (from transmitter to receiver) or in two directions (between transmitter and receiver or between receivers) can be performed by connection to a wired or wireless communication network through a modem 2004. The television device can be operated using switches that are incorporated into the chassis or with a remote control device 2006 that is provided separately, and a display portion 2007 that displays output information may be provided for the remote control device.

Further, in the television device, a sub-screen 2008 may be formed using a second display panel and may be used to display channel number, volume, and the like, in addition to the main screen 2003. In this structure, the main screen 2003 may be formed with a light-emitting display panel which has an excellent viewing angle, and the sub-screen 2008 may be formed with a liquid crystal display panel by which display is possible with low power consumption. Furthermore, in order to give priority to a shift toward lower power consumption, the main screen 2003 may be formed with a liquid crystal display panel, the sub-screen 2008 may be formed with a light-emitting display panel, and the sub-screen 2008 may be flashed on and off.

Figure 31:
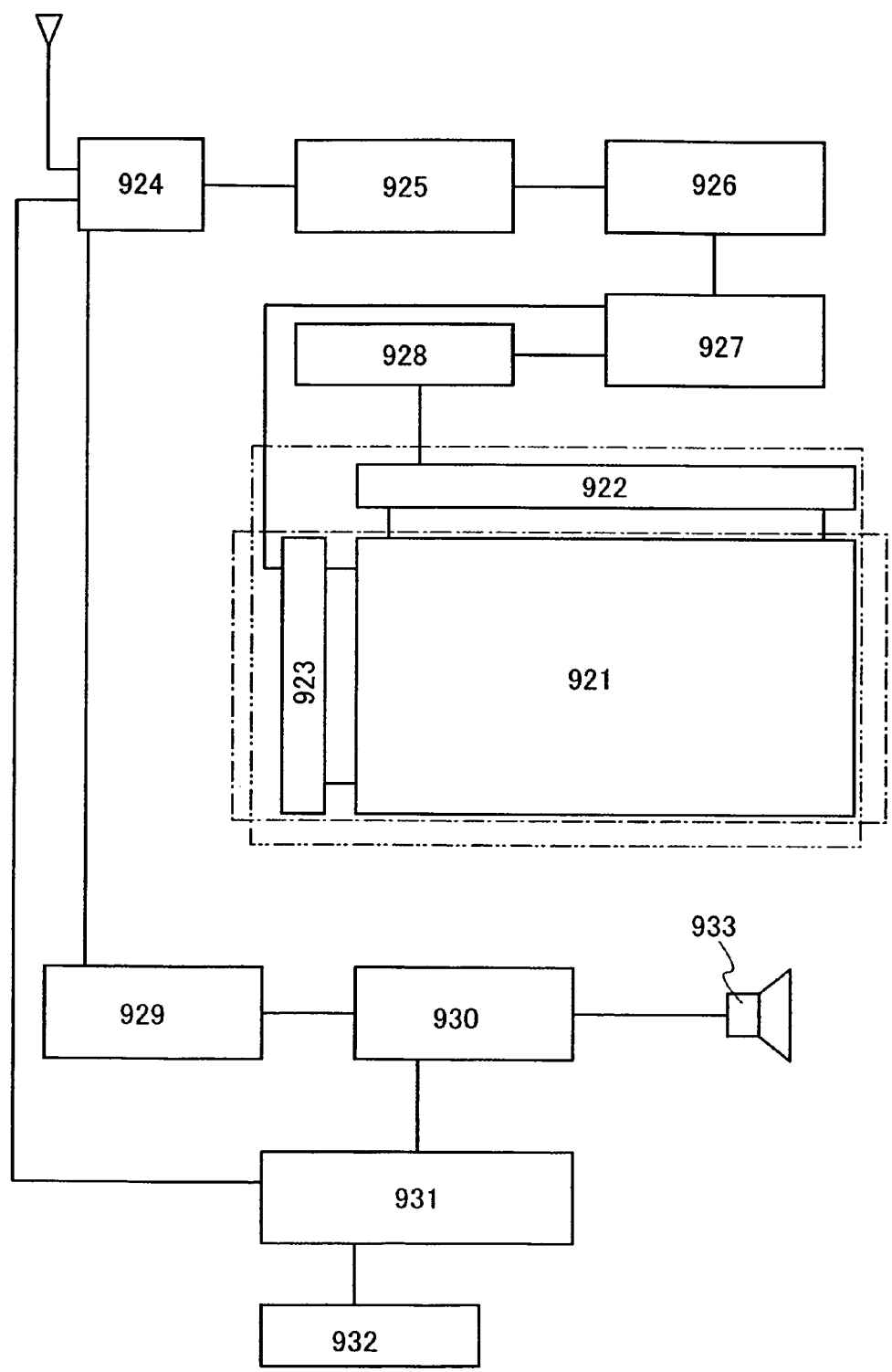
FIG. 31 is a diagram describing an electronic device using a light-emitting device of the present invention.

FIG. 31 is a block diagram showing a main structure of a television device. A pixel portion 921 is formed in a display panel 900. A signal line driver circuit 922 and a scanning line driver circuit 923 may be mounted on the display panel 900 by a COG method.

As other external circuits, a video signal amplifier circuit 925 that amplifies a video signal among signals received by a tuner 924, a video signal process circuit 926 that converts the signals output from the video signal amplifier circuit 925 into color signals corresponding to their respective colors of red, green, and blue, a control circuit 927 that converts the video signal so that the video signal can match input specification of the driver IC, and the like are provided on an input side of the video signal. The control circuit 927 outputs signals to both a scanning line side and a signal line side. In the case of digital driving, a signal divide circuit 928 may be provided on the signal line side and an input digital signal may be divided into m and supplied.

An audio signal among signals received by the tuner 924 is sent to an audio signal amplifier circuit 929 and is supplied to a speaker 933 through an audio signal process circuit 930. A control circuit 931 receives control information of a receiving station (reception frequency) or sound volume from an input portion 932 and transmits signals to the tuner 924 and the audio signal process circuit 930.

Needless to say, the present invention is not limited to television devices, and can be applied to a variety of applications such as monitors of personal computers, or display media that have a large area, such as information display boards in railway stations, airports, and the like, or street-side advertisement display boards.

Figure 30B:
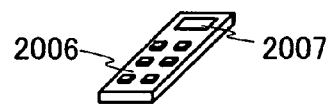

FIG. 30B illustrates one mode of a mobile phone 2301. The mobile phone 2301 includes a display portion 2302, an operation portion 2303, and the like. The display device described in any of the above embodiment modes is applied to the display portion 2302, so that mass productivity can be improved.

Figure 30C:
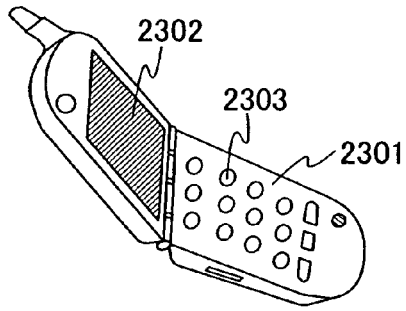

A portable computer illustrated in FIG. 30C includes a main body 2401, a display portion 2402, and the like. The display device described in any of the above embodiment modes is applied to the display portion 2402, so that mass productivity can be improved.

Figure 30D:
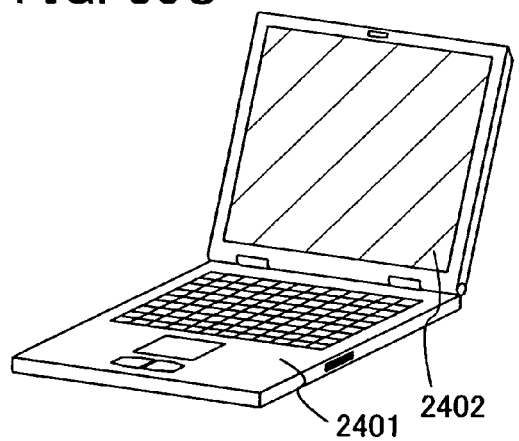

FIG. 30D illustrates a desk lamp including a lighting portion 2501, a lampshade 2502, an adjustable arm 2503, a support 2504, a base 2505, and a power supply 2506. The desk lamp is manufactured with use of the light-emitting device of the present invention for the lighting portion 2501. The lighting equipment includes a ceiling light, a wall light, and the like in its category. Use of the display device described in any of the above embodiment modes can increase mass productivity and provide inexpensive desk lamps.

This application is based on Japanese Patent Application serial No. 2007-196407 filed with Japan Patent Office on Jul. 27, 2007, the entire contents of which are hereby incorporated by reference.

What is claimed is:

1. A method for manufacturing a display device, comprising the steps of:
    forming a gate electrode over a substrate;
    forming a first insulating film over the gate electrode;
    forming a first semiconductor film over the first insulating film;
    adding a first impurity into the first semiconductor film, the first impurity imparting a first conductivity type or a second conductivity type;
    irradiating the first semiconductor film with laser light at a region in which the first semiconductor film and the gate electrode are overlapped, after adding the first impurity into the first semiconductor film;
    forming a buffer layer over the first semiconductor film after irradiating the first semiconductor film with laser light;
    forming a second semiconductor film over the buffer layer, the second semiconductor film including a second impurity which imparts the first conductivity type;
    etching the first semiconductor film, the buffer layer, and the second semiconductor film;
    forming a conductive film over the second semiconductor film so that the conductive film is in contact with the first insulating film and side surfaces of the first semiconductor film, the buffer layer, and the second semiconductor film; and
    etching the conductive film to form a source electrode and a drain electrode over the second semiconductor film,
    wherein the first semiconductor film is a microcrystalline semiconductor film, and
    wherein the buffer layer is an amorphous semiconductor film.

2. The method for manufacturing a display device, according to claim 1, after forming the first semiconductor film and before adding the first impurity, further comprising a step of irradiating the first semiconductor film with laser light.

3. The method for manufacturing a display device, according to claim 1, wherein the first conductivity type is an n-type, and the second conductivity type is a p-type.

4. The method for manufacturing a display device according to claim 1, further comprising the steps of:
    etching the conductive film to form the source electrode over a first portion of the second semiconductor film and the drain electrode over a second portion of the second semiconductor film;
    etching a first portion of the buffer layer between the first portion of the second semiconductor film and the second portion of the second semiconductor film; and
    forming a second insulating film over the source electrode and the drain electrode so that the second insulating film is in contact with the first portion of the buffer layer.

5. The method for manufacturing a display device according to claim 1, further comprising the steps of:
    wet etching the conductive film to form the source electrode over a first portion of the second semiconductor film and the drain electrode over a second portion of the second semiconductor film;
    etching a first portion of the buffer layer between the first portion of the second semiconductor film and the second portion of the second semiconductor film; and
    forming a second insulating film over the source electrode and the drain electrode so that the second insulating film is in contact with the first portion of the buffer layer.

6. The method for manufacturing a display device, according to claim 1, wherein the buffer layer includes nitrogen or hydrogen.

7. The method for manufacturing a display device, according to claim 1, wherein the buffer layer includes fluorine, chlorine, bromine, or iodine.

8. A method for manufacturing a display device, comprising the steps of:
    forming a gate electrode over a substrate;
    forming a first insulating film over the gate electrode;
    forming a first semiconductor film over the first insulating film;
    adding a first impurity into the first semiconductor film;
    irradiating the first semiconductor film with laser light after adding the first impurity into the first semiconductor film;
    forming a buffer layer over the first semiconductor film after irradiating the first semiconductor film with laser light;
    forming a second semiconductor film over the buffer layer;
    etching the first semiconductor film, the buffer layer, and the second semiconductor film;
    forming a conductive film over the second semiconductor film;

etching the conductive film to form a source electrode over a first portion of the second semiconductor film and a drain electrode over a second portion of the second semiconductor film;

etching a first portion of the buffer layer between the first portion of the second semiconductor film and the second portion of the second semiconductor film; and forming a second insulating film over the source electrode and the drain electrode so that the second insulating film is in contact with the first portion of the buffer layer, wherein the first semiconductor film is a microcrystalline semiconductor film, and wherein the buffer layer is an amorphous semiconductor film.

9. The method for manufacturing a display device, according to claim 8, wherein a conductivity type of the first impurity is an n-type or a p-type.

10. The method for manufacturing a display device, according to claim 8, wherein the buffer layer includes nitrogen or hydrogen.

11. The method for manufacturing a display device, according to claim 8, wherein the buffer layer includes fluorine, chlorine, bromine, or iodine.

12. A method for manufacturing a display device, comprising the steps of:

forming a gate electrode over a substrate;

forming a first insulating film over the gate electrode;

forming a first semiconductor film over the first insulating film;

adding a first impurity into the first semiconductor film;

cleaning a surface of the first semiconductor film;

irradiating the first semiconductor film with laser light after cleaning the surface of the first semiconductor film;

forming a buffer layer over the first semiconductor film after irradiating the first semiconductor film with laser light;

forming a second semiconductor film comprising a second impurity over the buffer layer;

forming a conductive film over the second semiconductor film;

wet etching the conductive film to form a source electrode over a first portion of the second semiconductor film and a drain electrode over a second portion of the second semiconductor film;

etching a first portion of the buffer layer between the first portion of the second semiconductor film and the second portion of the second semiconductor film; and forming a second insulating film over the source electrode and the drain electrode so that the second insulating film is in contact with the first portion of the buffer layer, wherein the first semiconductor film is a microcrystalline semiconductor film, and wherein the buffer layer is an amorphous semiconductor film.

13. The method for manufacturing a display device according to claim 12, further comprising the step of removing an oxide film formed on the first semiconductor film before forming the buffer layer over the first semiconductor film.

14. The method for manufacturing a display device according to claim 13, further comprising the step of processing a surface of the buffer layer with at least one of hydrogen plasma, nitrogen plasma, and halogen plasma before forming the second semiconductor film.

15. The method for manufacturing a display device according to claim 12, further comprising the step of irradiating the first semiconductor film with laser light before adding the first impurity into the first semiconductor film.

16. The method for manufacturing a display device according to claim 15, further comprising the step of removing an oxide film formed on the first semiconductor film after adding the first impurity into the first semiconductor film.

* * * * *